(12) United States Patent
Lin et al.

(10) Patent No.: US 12,051,733 B2
(45) Date of Patent: Jul. 30, 2024

(54) NON-PLANAR TRANSISTOR DEVICES AND METHODS OF MANUFACTURING THEREOF

(71) Applicant: Taiwan Semiconductor Manufacturing Company, Ltd., Hsinchu (TW)

(72) Inventors: Shih-Yao Lin, New Taipei (TW); Hsiao Wen Lee, Hsinchu (TW); Chih-Han Lin, Hsinchu (TW)

(73) Assignee: TAIWAN SEMICONDUCTOR MANUFACTURING COMPANY, LTD.

( * ) Notice: Subject to any disclaimer, the term of this patent is extended or adjusted under 35 U.S.C. 154(b) by 403 days.

(21) Appl. No.: 17/461,039

(22) Filed: Aug. 30, 2021

(65) Prior Publication Data

US 2023/0065476 A1 Mar. 2, 2023

(51) Int. Cl.
*H01L 29/423* (2006.01)
*H01L 21/8234* (2006.01)
*H01L 29/66* (2006.01)
*H01L 29/786* (2006.01)

(52) U.S. Cl.
CPC ............ *H01L 29/42392* (2013.01); *H01L 21/823418* (2013.01); *H01L 29/66545* (2013.01); *H01L 29/66553* (2013.01); *H01L 29/66742* (2013.01); *H01L 29/78696* (2013.01)

(58) Field of Classification Search
CPC ......... H01L 29/42392; H01L 29/66545; H01L 21/823418; H01L 29/66553
USPC .......................................................... 257/288
See application file for complete search history.

(56) References Cited

U.S. PATENT DOCUMENTS

2020/0044087 A1* 2/2020 Guha ................. H01L 29/66439
2020/0105868 A1* 4/2020 Loubet ............... H01L 29/6681

* cited by examiner

*Primary Examiner* — Nduka E Ojeh
(74) *Attorney, Agent, or Firm* — FOLEY & LARDNER LLP

(57) ABSTRACT

A method for making a semiconductor device includes forming a fin structure that extends along a first direction and comprises a plurality of sacrificial layers and a plurality of channel layers alternately stacked on top of one another. The method includes forming a dummy gate structure, over the fin structure, that extends along a second direction perpendicular to the first direction. The method includes forming a gate spacer extending along respective upper sidewall portions of the dummy gate structure, thereby defining a first distance between a bottom surface of the gate spacer and a top surface of a topmost one of the plurality of channel layers. The first distance is either zero or similar to a second distance that separates neighboring ones of the plurality of channel layers.

20 Claims, 45 Drawing Sheets

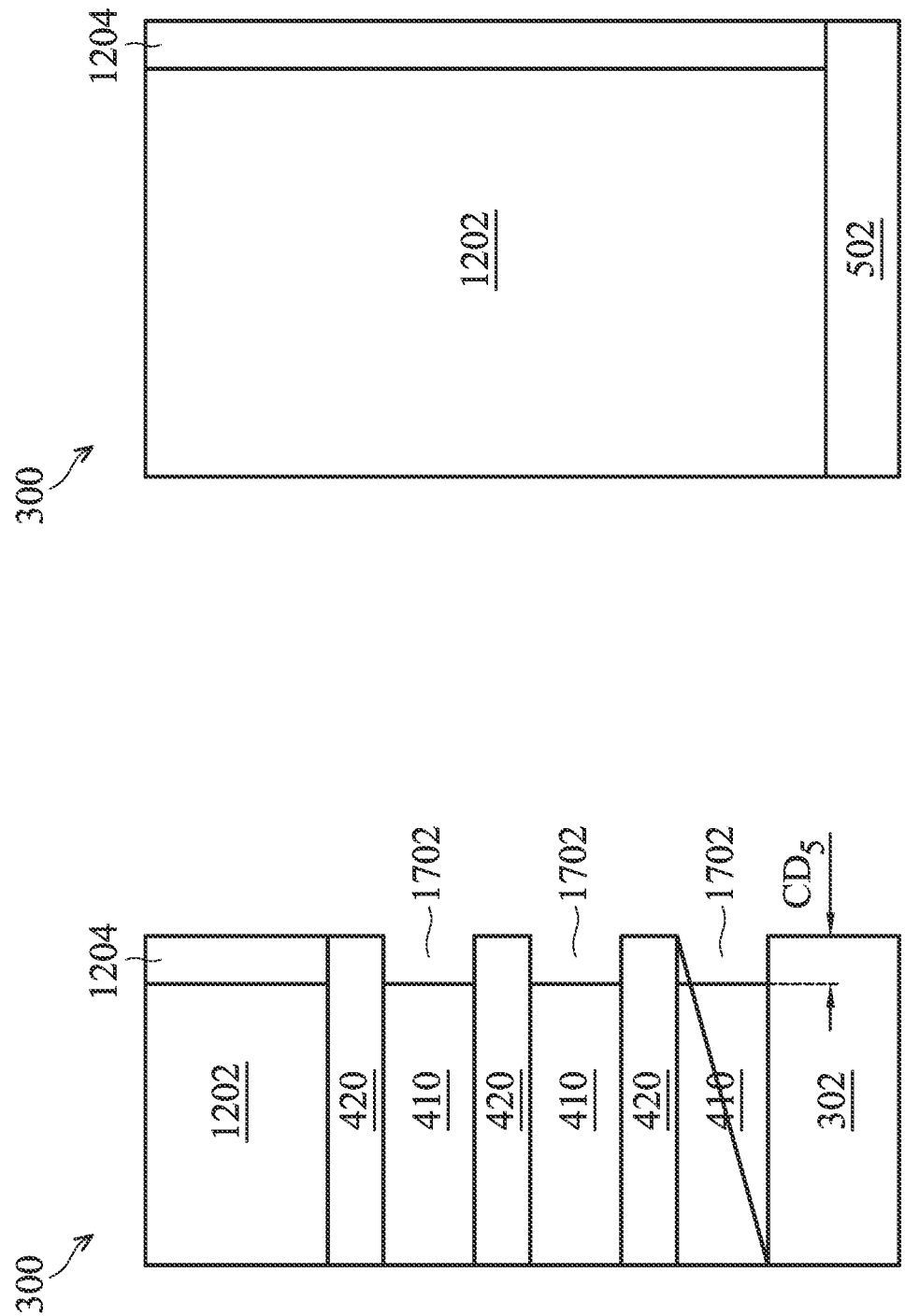

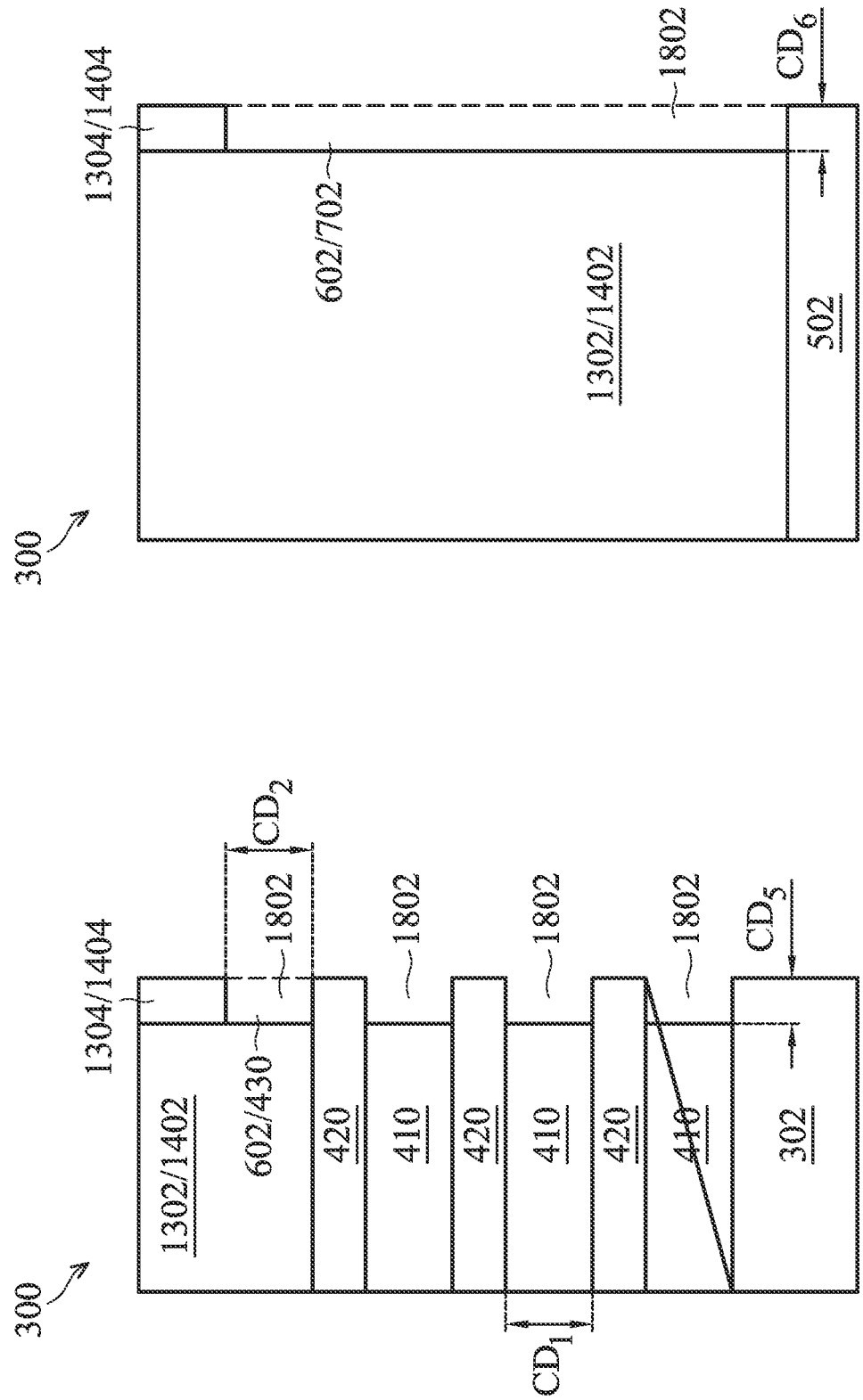

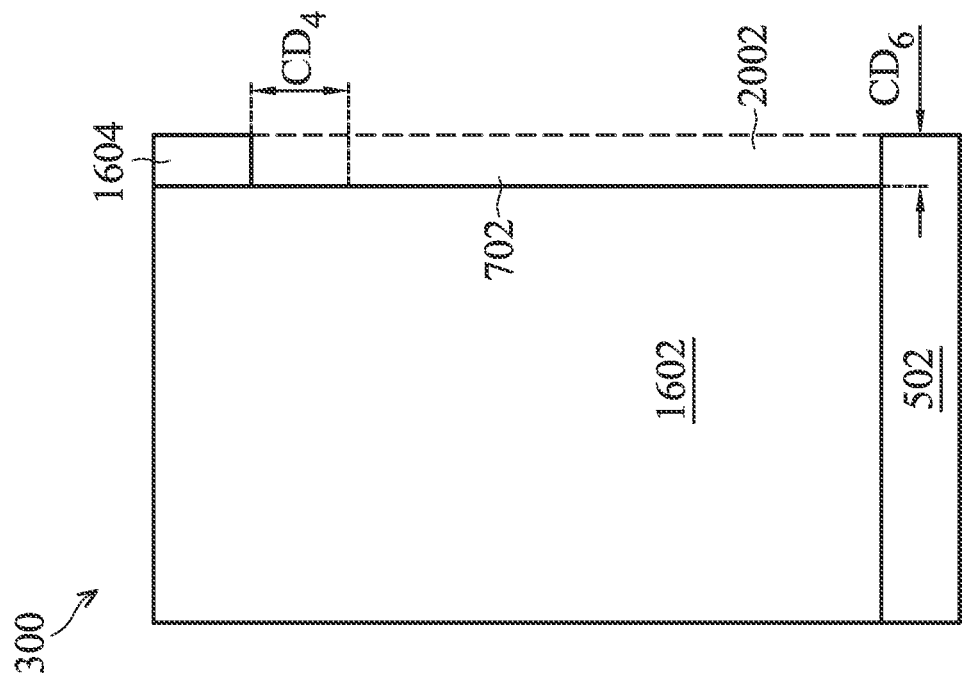
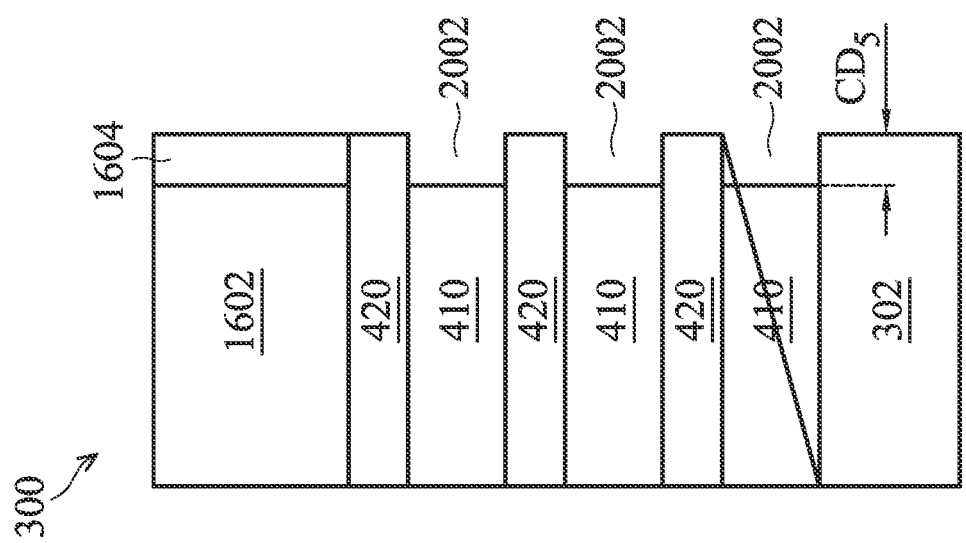
FIG. 20B
FIG. 20A

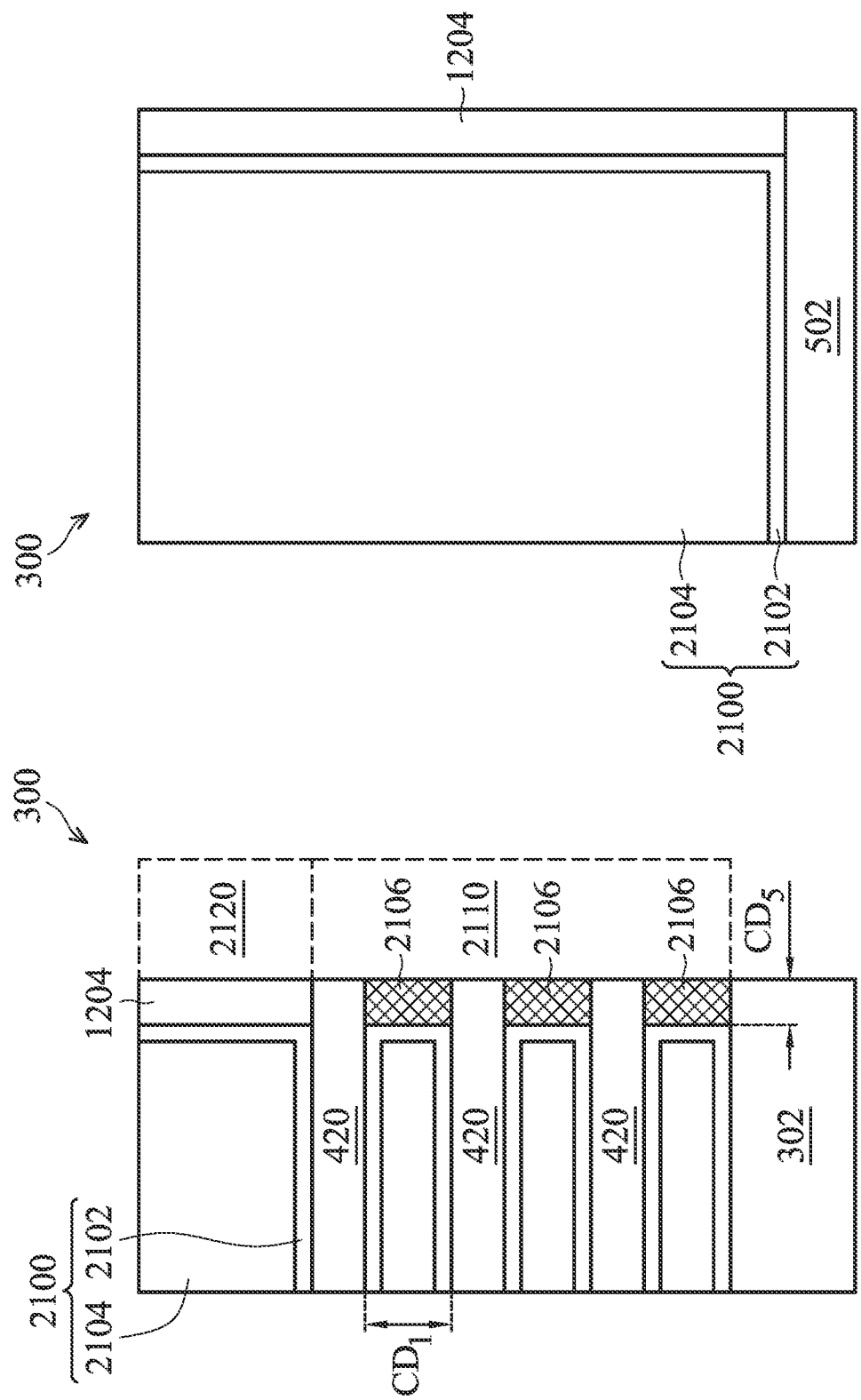

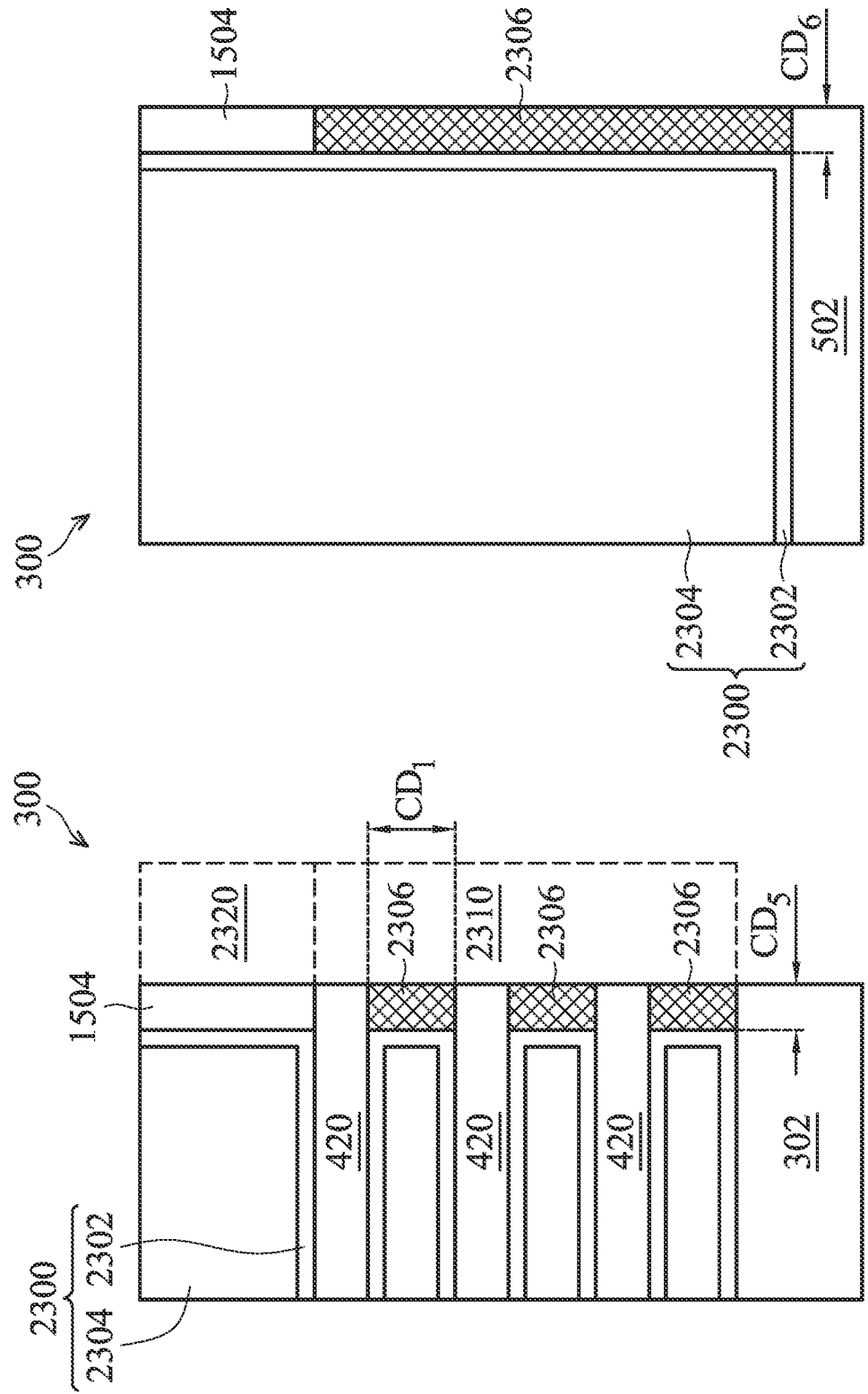

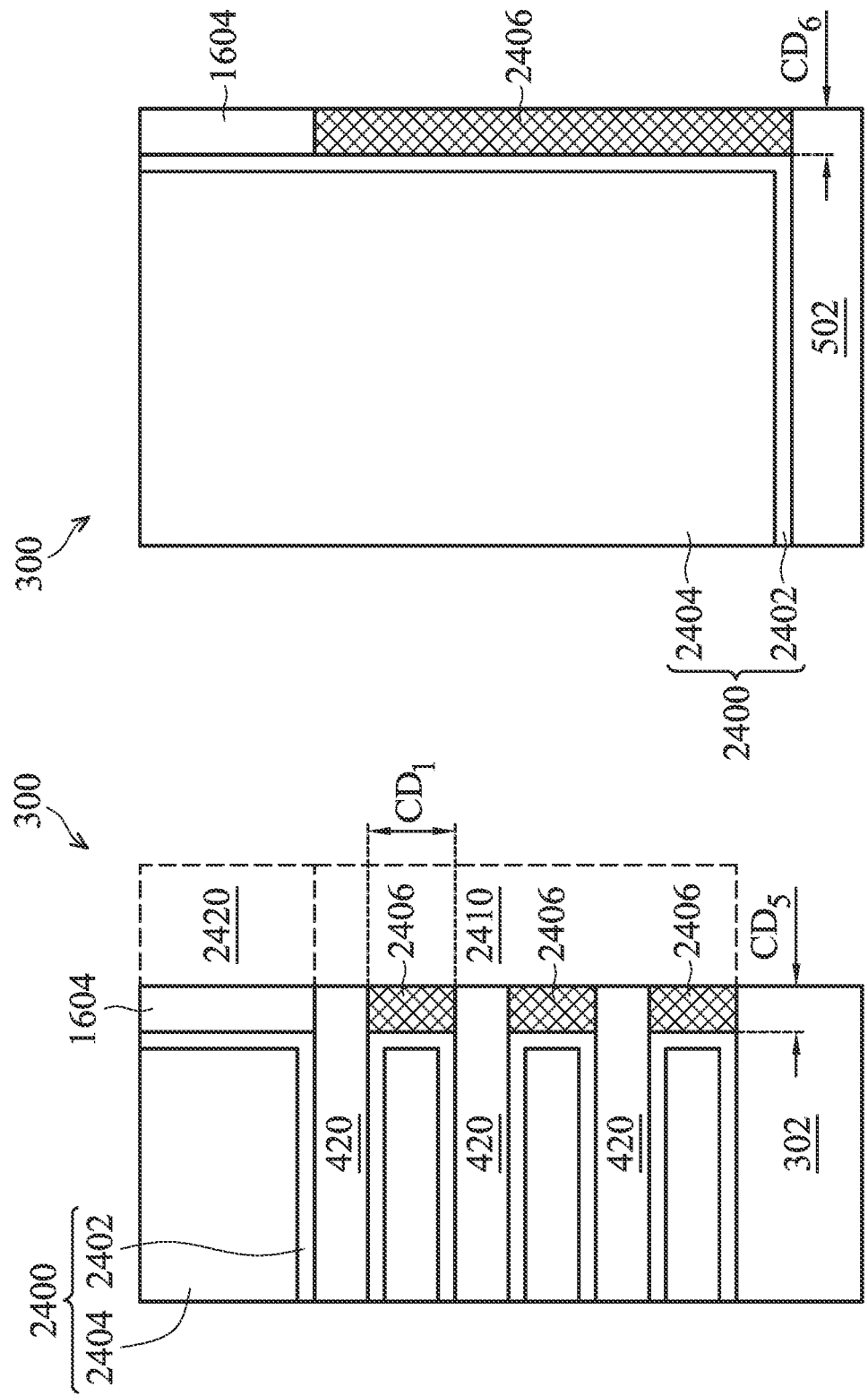

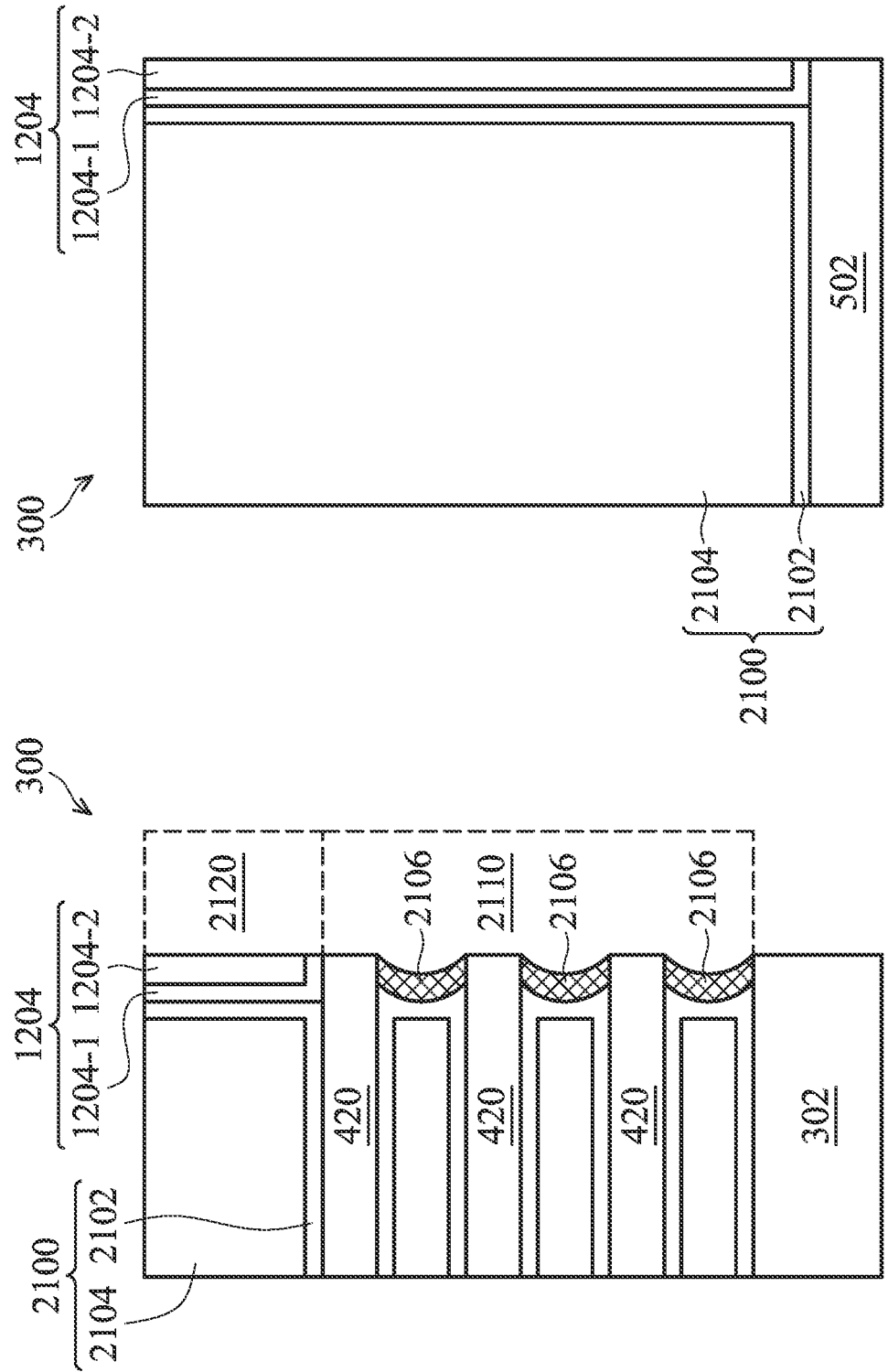

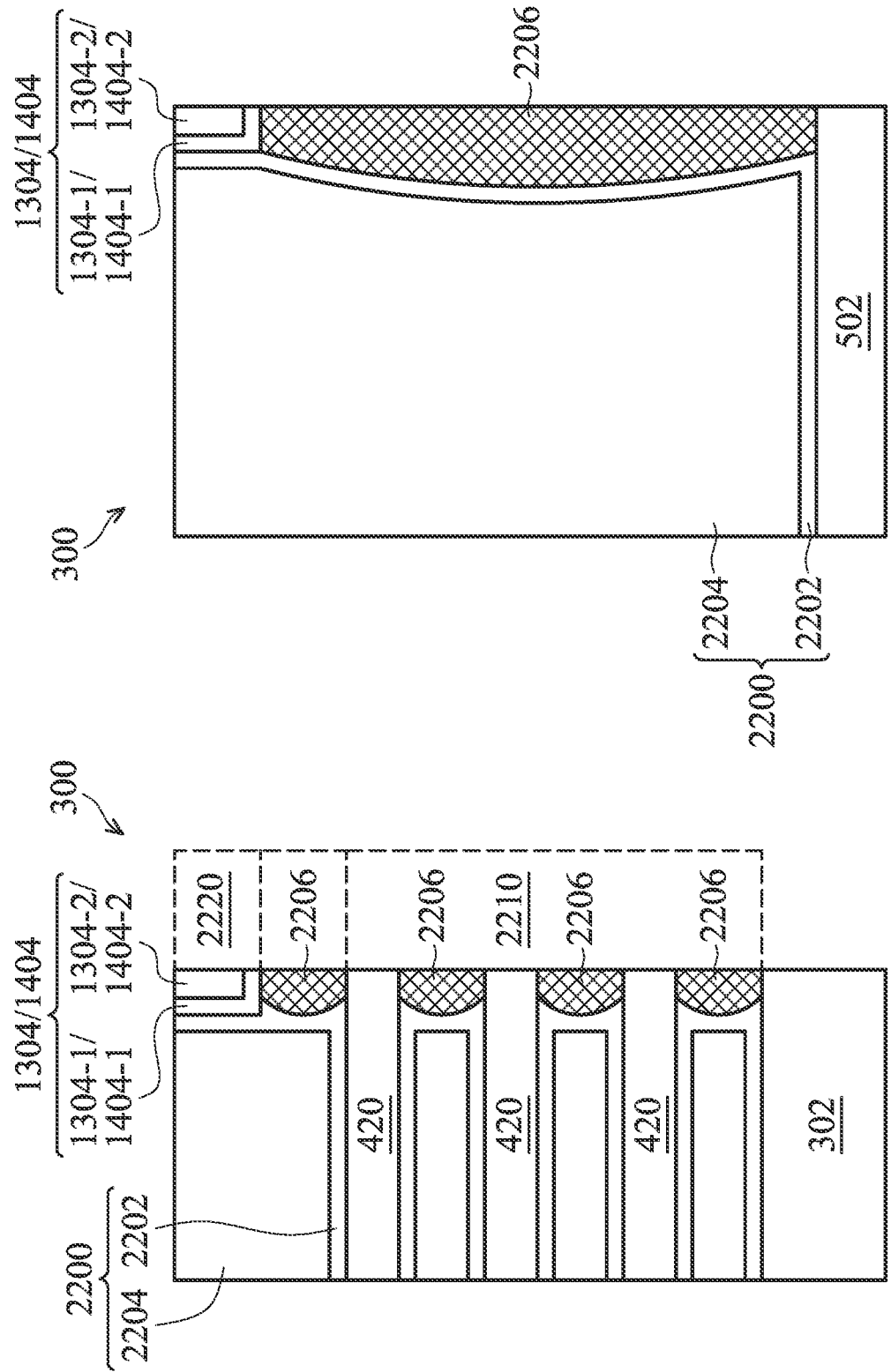

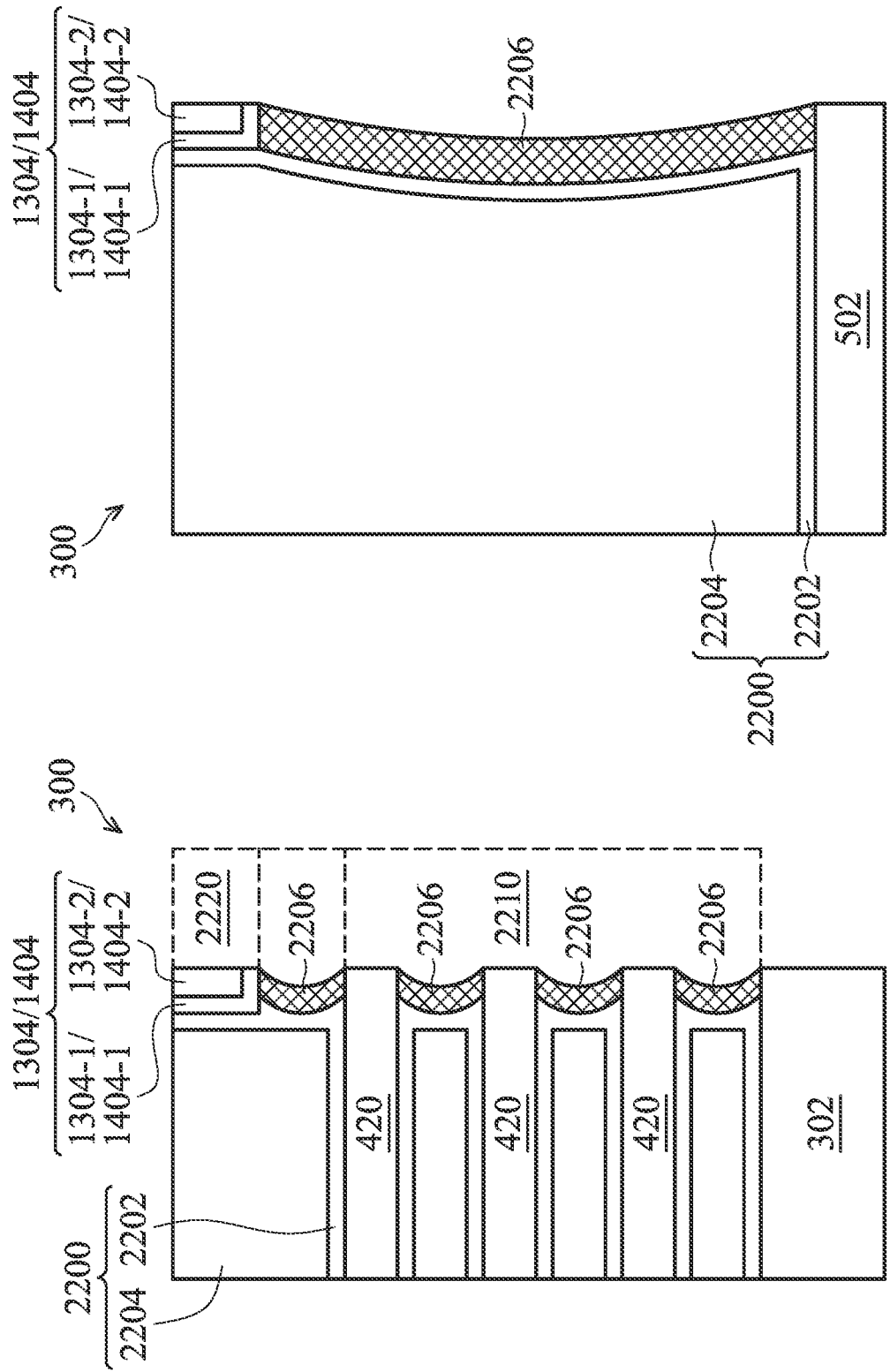

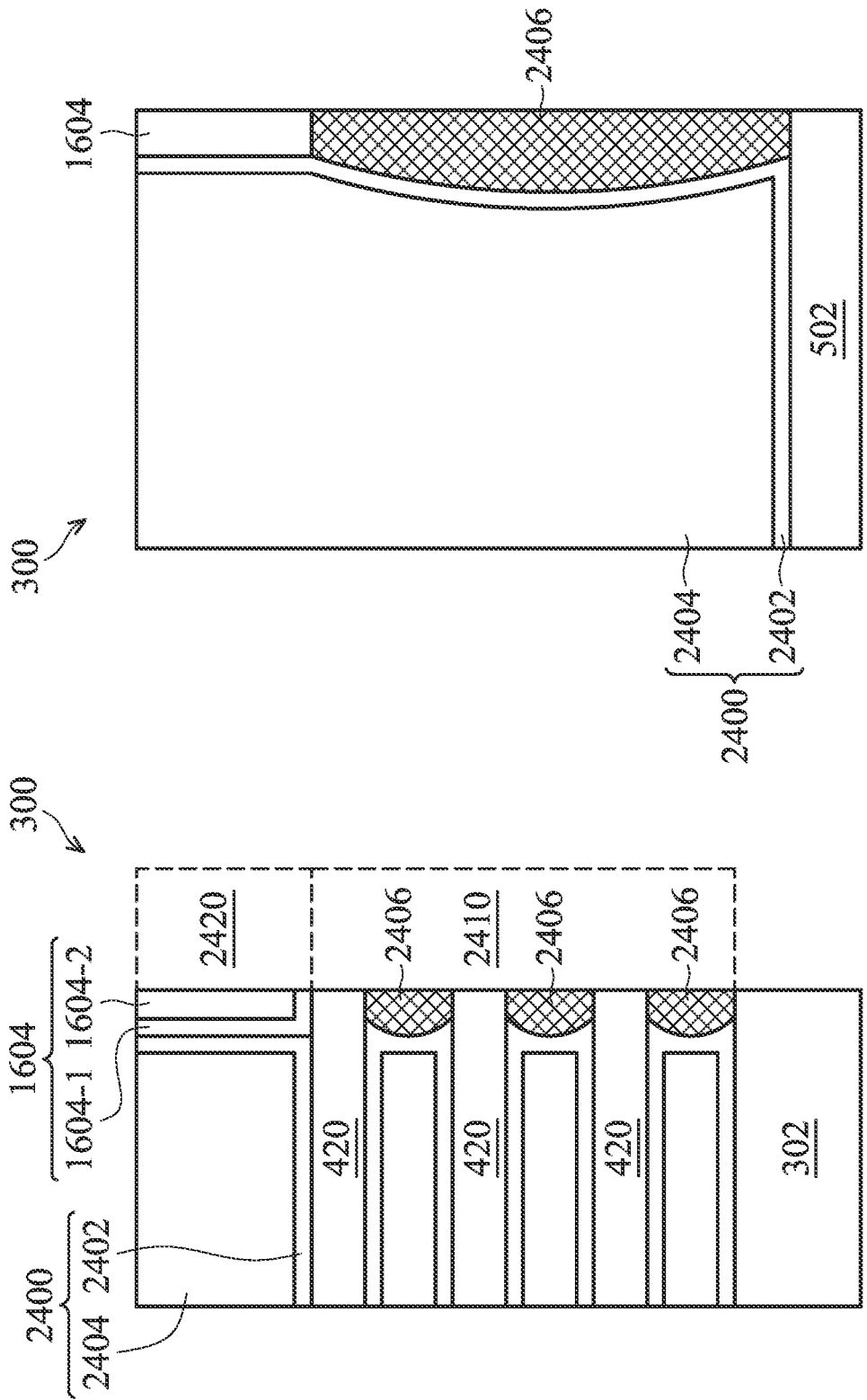

NON-PLANAR TRANSISTOR DEVICES AND METHODS OF MANUFACTURING THEREOF

BACKGROUND

The present disclosure generally relates to semiconductor devices, and particularly to methods of making a non-planar transistor device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4, 5, 6, 7, 8, 9, 10, 11, 12A, 12B, 13A, 13B, 14A, 14B, 15A, 15B, 16A, 16B, 17A, 17B, 18A, 18B, 19A, 19B, 20A, 20B, 21A, 21B, 21C, 21D, 22A, 22B, 22C, 22D, 23A, 23B, 23C, 23D, 24A, 24B, 24C, and 24D illustrate cross-sectional views of an example GAA FET device (or a portion of the example GAA FET device) during various fabrication stages, made by the method of FIG. 2, in accordance with some embodiments.

FIGS. 25A, 25B, 26A, 26B, 27A, 27B, 28A, 28B, 29A, 29B, 30A, 30B, 31A, 31B, 32A, and 32B illustrate cross-sectional views of the example GAA FET device, made by the method of FIG. 2, that includes alternative embodiments of a gate spacer and an inner spacer, in accordance with some embodiments.

DETAILED DESCRIPTION

Figure 1:
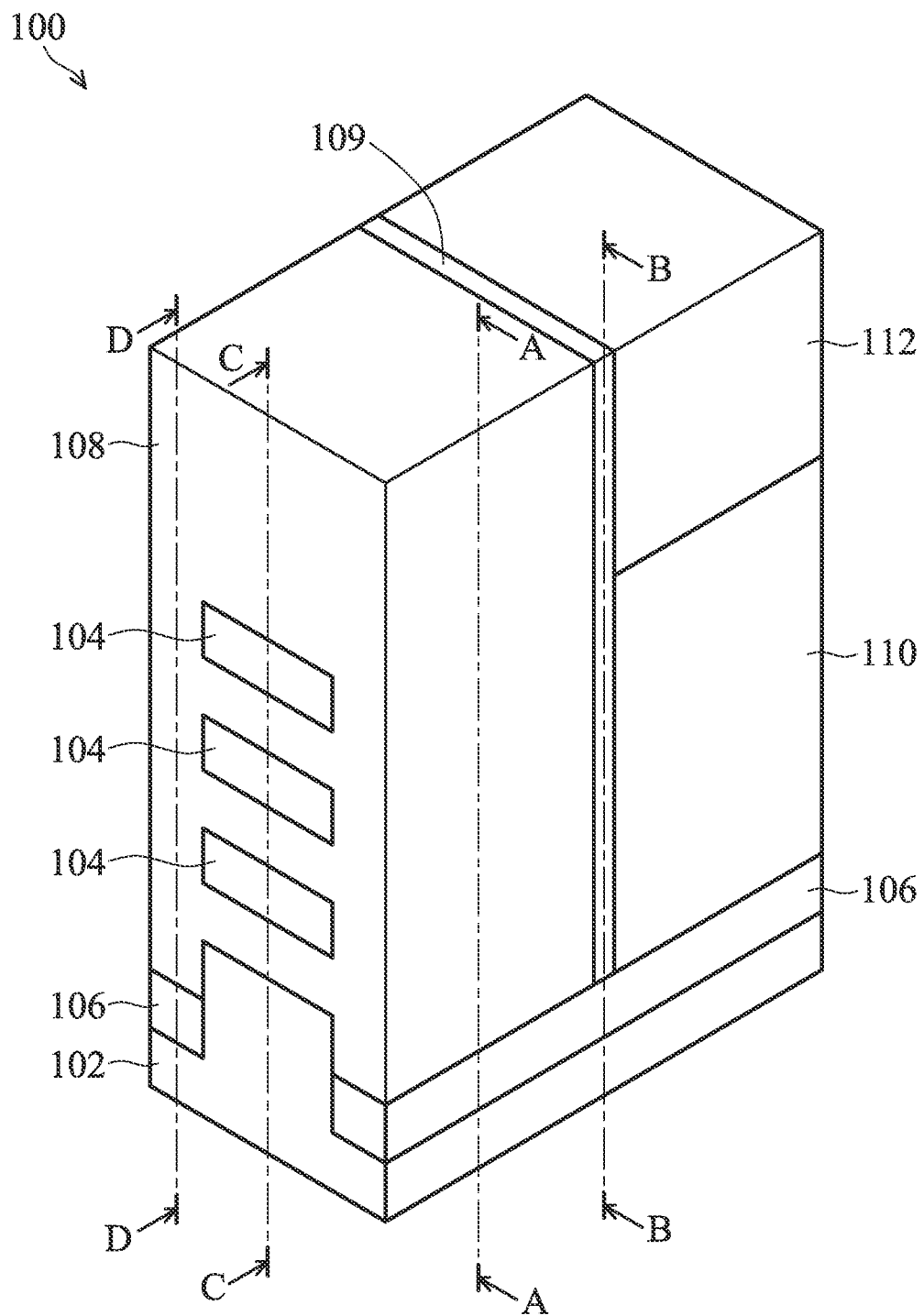
FIG. 1 illustrates a perspective view of a gate-all-around (GAA) field-effect-transistor (FET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, a dummy gate structure is replaced with a replacement (e.g., metal or otherwise active) gate structure, and thus, the active gate structure may inherit the dimensions and profiles of the dummy gate structure (as formed). The existing technologies, however, face various issues, when forming the active gate structure. For example, a relatively thick portion of the dummy gate structure is typically disposed over a topmost one of a number of semiconductor/channel layers, when compared to a thickness of each sacrificial layer disposed between the neighboring semiconductor layers. This portion of the dummy gate structure and respective end portions of each sacrificial layer are typically etched at the same time to form an inner spacer. Due to such a discrepancy of the dimensions, these two portions are commonly etched at different etching rates. As a result, the dummy gate structure is laterally etched more, which shortens a dimension (e.g., the length of a portion of the active gate structure that is disposed above the topmost channel layer and extends between the source/drain structures) of the later formed active gate structure. A gate controllability of the active gate structure may be disadvantageously impacted.

Embodiments of the present disclosure are discussed in the context of forming a gate-all-around (GAA) field-effect-transistor (FET) device, and in particular, in the context of forming a replacement gate of a GAA FET device. For example, the present disclosure provides various embodiments of methods to accurately control the dimension (e.g., thickness) of an intermediate structure disposed above the topmost channel layer, prior to replacing it with an inner spacer and/or an active gate structure. The intermediate structure can include a portion of the dummy gate structure, a hardmask layer, or otherwise structures that have a similar etching characteristic (e.g., an etching rate) to sacrificial layers that are alternately disposed between the channel layers. The dimension is controlled to be about zero or equal to a thickness of each of the sacrificial layers, in accordance with various embodiments. As such, prior to forming the inner spacer, the respective lateral etching amounts of the intermediate structure and the sacrificial layers can be accurately controlled to be approximately the same, which avoids the issues identified in the existing technologies.

FIG. 1 illustrates a perspective view of an example GAA FET device 100, in accordance with various embodiments. The GAA FET device 100 includes a substrate 102 and a number of semiconductor layers (e.g., nanosheets, nanowires, or otherwise nanostructures) 104 above the substrate 102. The semiconductor layers 104 are vertically separated from one another, which can collectively function as a (conduction) channel of the GAA FET device 100. Isolation regions 106 are formed on opposing sides of a protruded portion of the substrate 102, with the semiconductor layers 104 disposed above the protruded portion. A gate structure 108 wraps around each of the semiconductor layers 104 (e.g., a full perimeter of each of the semiconductor layers 104). A spacer 109 extends along each sidewall of the gate structure 108. Source/drain structures are disposed on opposing sides of the gate structure 108 with the spacer 109 disposed therebetween, e.g., source/drain structure 110 shown in FIG. 1. An interlayer dielectric (ILD) 112 is disposed over the source/drain structure 110.

The GAA FET device shown in FIG. 1 is simplified, and thus, it should be understood that one or more features of a completed GAA FET device may not be shown in FIG. 1. For example, the other source/drain structure opposite the gate structure 108 from the source/drain structure 110 and the ILD disposed over such a source/drain structure are not shown in FIG. 1. Further, FIG. 1 is provided as a reference to illustrate a number of cross-sections in subsequent figures. As indicated, cross-section A-A is cut along a longitudinal axis of the gate structure 108; cross-section B-B, parallel to cross-section A-A, is cut along a longitudinal axis of the spacer 109; cross-section C-C is cut along a longitudinal axis of the semiconductor layers 104 and in a direction of a current flow between the source/drain structures; and cross-section D-D, parallel to cross-section C-C, is cut in a direction shifted away from the semiconductor layers 104. Subsequent figures refer to these reference cross-sections for clarity.

Figure 2:
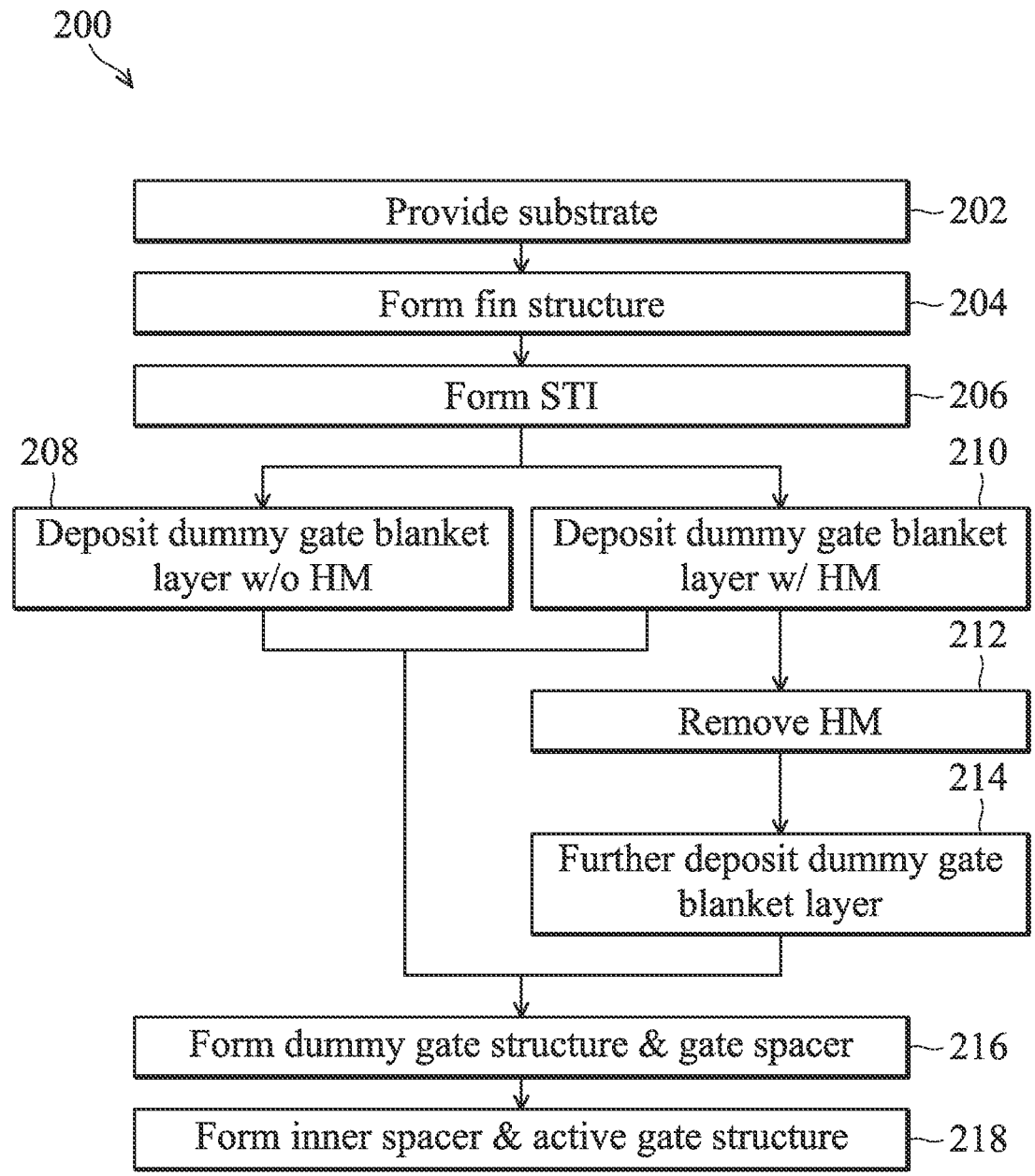
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device, a GAA FET device (e.g., GAA FET device 100), a nanosheet transistor device, a nanowire transistor device, a vertical transistor device, a gate-all-around (GAA) transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example GAA FET device at various fabrication stages as shown in FIGS. 3, 4, 5, 6, 7, 8, 9, 10, 11, 12A, 12B, 13A, 13B, 14A, 14B, 15A, 15B, 16A, 16B, 17A, 17B, 18A, 18B, 19A, 19B, 20A, 20B, 21A, 21B, 21C, 21D, 22A, 22B, 22C, 22D, 23A, 23B, 23C, 23D, 24A, 24B, 24C, and, 24D, respectively, which will be discussed in further detail below.

In brief overview, the method 200 starts with operation 202 of providing a substrate. The method 200 continues to operation 204 of forming a fin structure including a number of first semiconductor layers and a number of second semiconductor layers. The method 200 continues to operation 206 of forming an isolation structure. The method 200 continues to operation 208 of depositing a dummy gate blanket layer without a hardmask layer overlaying the fin structure, or operation 210 of depositing a dummy gate blanket layer with a hardmask layer overlaying the fin structure. Following operation 210, the method 200 continues to operation 212 of removing the hardmask layer, and then to operation 214 of further depositing a dummy gate blanket layer. Following operation 208, 210, or 214, the method 200 proceeds to operation 216 of forming a dummy gate structure and a gate spacer. Next, the method 200 continues to operation 218 of forming inner spacers and an active gate structure.

As mentioned above, FIGS. 3-24D each illustrate, in a cross-sectional view, a portion of a GAA FET device 300 at various fabrication stages of the method 200 of FIG. 2. The GAA FET device 300 is similar to the GAA FET device 100 shown in FIG. 1, but with certain features/structures/regions not shown, for the purposes of brevity. For example, the following figures of the GAA FET device 300 do not include source/drain structures (e.g., 110 of FIG. 1). It should be understood the GAA FET device 300 may further include a number of other devices (not shown in the following figures) such as inductors, fuses, capacitors, coils, etc., while remaining within the scope of the present disclosure.

Figure 3:
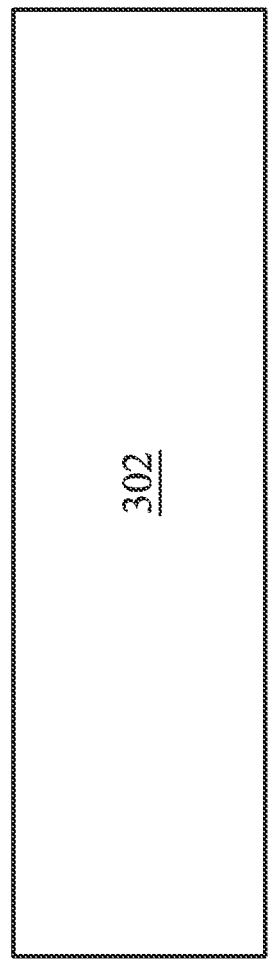

Corresponding to operation 202 of FIG. 2, FIG. 3 is a cross-sectional view of the GAA FET device 300 including a semiconductor substrate 302 at one of the various stages of fabrication. The cross-sectional view of FIG. 3 is cut in a direction along the lengthwise direction of an active/dummy gate structure of the GAA FET device 300 (e.g., cross-section A-A indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
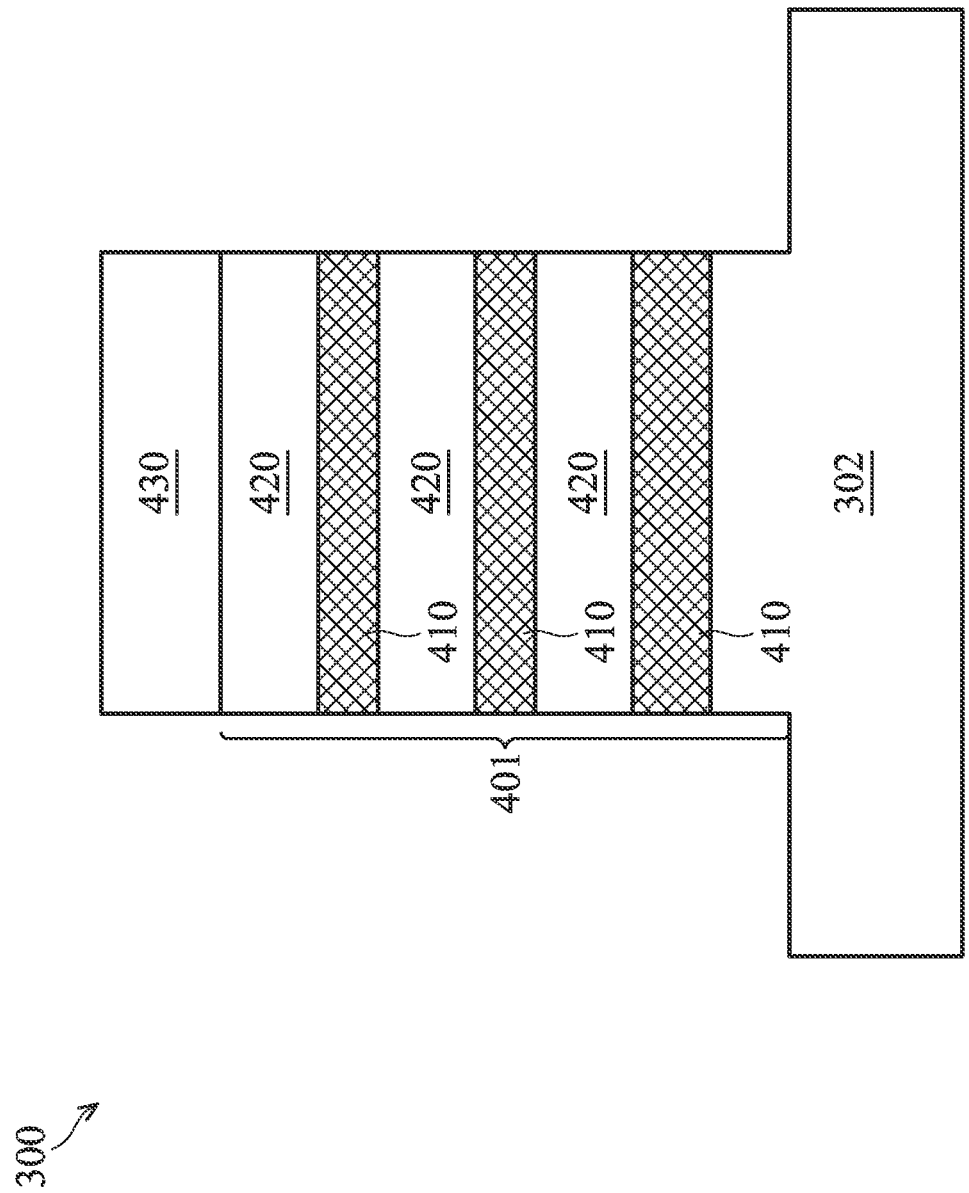

Corresponding to operation 204 of FIG. 2, FIG. 4 is a cross-sectional view of the GAA FET device 300 including a number of first semiconductor layers 410 and a number of second semiconductor layers 420 formed on the substrate 302 at one of the various stages of fabrication. The cross-sectional view of FIG. 4 is cut in a direction along the lengthwise direction of an active/dummy gate structure of the GAA FET device 300 (e.g., cross-section A-A indicated in FIG. 1).

As shown, the first semiconductor layers 410 and the second semiconductor layers 420 are alternatingly disposed on top of one another to form a stack. For example, one of the second semiconductor layers 420 is disposed over one of the first semiconductor layers 410 then another one of the first semiconductor layers 420 is disposed over the second semiconductor layer 410, so on and so forth. The first and second stacks may include any number of alternately disposed first and second semiconductor layers 410 and 420, respectively. For example in FIG. 4, the stack includes 3 first semiconductor layers 410, with 3 second semiconductor layers 420 alternatingly disposed therebetween and with one of the second semiconductor layers 420 being the topmost semiconductor layer. It should be understood that the GAA FET device 300 can include any number of first semiconductor layers and any number of second semiconductor layers, with either one of the first or second semiconductor layers being the topmost semiconductor layer, while remaining within the scope of the present disclosure.

The semiconductor layers 410 and 420 may have respective different thicknesses. Further, the first semiconductor layers 410 may have different thicknesses from one layer to another layer. The second semiconductor layers 420 may have different thicknesses from one layer to another layer. The thickness of each of the semiconductor layers 410 and 420 may range from few nanometers to few tens of nanometers. The first layer of the stack may be thicker than other semiconductor layers 410 and 420. In an embodiment, each of the first semiconductor layers 410 has a thickness ranging from about 5 nanometers (nm) to about 20 nm, and each of the second semiconductor layers 420 has a thickness ranging from about 5 nm to about 20 nm.

The two semiconductor layers 410 and 420 have different compositions. In various embodiments, the two semiconductor layers 410 and 420 have compositions that provide for different oxidation rates and/or different etch selectivity between the layers. In an embodiment, the first semiconductor layers 410 include silicon germanium ($Si_{1-x}Ge_x$), and the second semiconductor layers include silicon (Si). In an embodiment, each of the semiconductor layers 420 is silicon that may be undoped or substantially dopant-free (i.e., having an extrinsic dopant concentration from about 0 $cm^{-3}$ to about $1\times10^{17}$ $cm^{-3}$), where for example, no intentional doping is performed when forming the layers 420 (e.g., of silicon).

In various embodiments, the semiconductor layers 420 may be intentionally doped. For example, when the GAA FET device 300 is configured as an n-type transistor (and operates in an enhancement mode), each of the semiconductor layers 420 may be silicon that is doped with a p-type dopant such as boron (B), aluminum (Al), indium (In), and gallium (Ga); and when the GAA FET device 300 is configured as a p-type transistor (and operates in an enhancement mode), each of the semiconductor layers 420 may be silicon that is doped with an n-type dopant such as phosphorus (P), arsenic (As), antimony (Sb). In another example, when the GAA FET device 300 is configured as an n-type transistor (and operates in a depletion mode), each of the semiconductor layers 420 may be silicon that is doped with an n-type dopant instead; and when the GAA FET device 300 is configured as a p-type transistor (and operates in a depletion mode), each of the semiconductor layers 420 may be silicon that is doped with a p-type dopant instead. In some embodiments, each of the semiconductor layers 410 is $Si_{1-x}Ge_x$ that includes less than 50% (x<0.5) Ge in molar ratio. For example, Ge may comprise about 15% to 35% of the semiconductor layers 410 of $Si_{1-x}Ge_x$ in molar ratio. Furthermore, the first semiconductor layers 410 may include different compositions among them, and the second semiconductor layers 420 may include different compositions among them.

Either of the semiconductor layers 410 and 420 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 410 and 420 may be chosen based on providing differing oxidation rates and/or etch selectivity.

The semiconductor layers 410 and 420 can be epitaxially grown from the semiconductor substrate 302. For example, each of the semiconductor layers 410 and 420 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 302 extends upwardly, resulting in the semiconductor layers 410 and 420 having the same crystal orientation with the semiconductor substrate 302.

Upon growing the semiconductor layers 410 and 420 on the semiconductor substrate 302 (as a stack), the stack may be patterned to form one or more fin structures (e.g., fin structure 401 shown in FIG. 4). Each of the fin structures is elongated along a lateral direction, and includes a stack of patterned semiconductor layers 410-420 interleaved with each other. The fin structure 401 is formed by patterning the stack of semiconductor layers 410-420 and the semiconductor substrate 302 using, for example, photolithography and etching techniques.

For example, a mask layer (which can include multiple layers such as, for example, a pad oxide layer and an overlying hardmask layer 430) is formed over the topmost semiconductor layer (e.g., 420 in FIG. 4). The pad oxide layer may be a thin film comprising silicon oxide formed, for example, using a thermal oxidation process. The pad oxide layer may act as an adhesion layer between the topmost semiconductor layer 420 and the hardmask layer 430. In some embodiments, the hardmask layer 430 may include silicon nitride, silicon oxynitride, silicon carbonitride, the like, or combinations thereof. In some other embodiments, the hardmask layer 430 may include a material similar as a material of the semiconductor layers 410/420 such as, for example, $Si_{1-y}Ge_y$, Si, etc., in which the molar ratio (y) may be different from or similar to the molar ratio (x) of the semiconductor layers 410. The hardmask layer 430 may be formed over the stack (i.e., before patterning the stack) using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask can be subsequently used to pattern exposed portions of the semiconductor layers 410-420 and the substrate 302 to form one or more of the fin structures 410, thereby defining trenches (or openings) between adjacent fin structures. When multiple fin structures are formed, such a trench may be disposed between any adjacent ones of the fin structures. In some embodiments, the fin structure 401 is formed by etching trenches in the semiconductor layers 410-420 and substrate 302 using, for example, reactive ion etch (RIE), neutral beam etch (NBE), the like, or combinations thereof. The etch may be anisotropic. In some embodiments, the trenches may be strips (when viewed from the top) parallel to each other, and closely spaced with respect to each other. In some embodiments, the trenches may be continuous and surround the fin structure 401.

Figure 5:
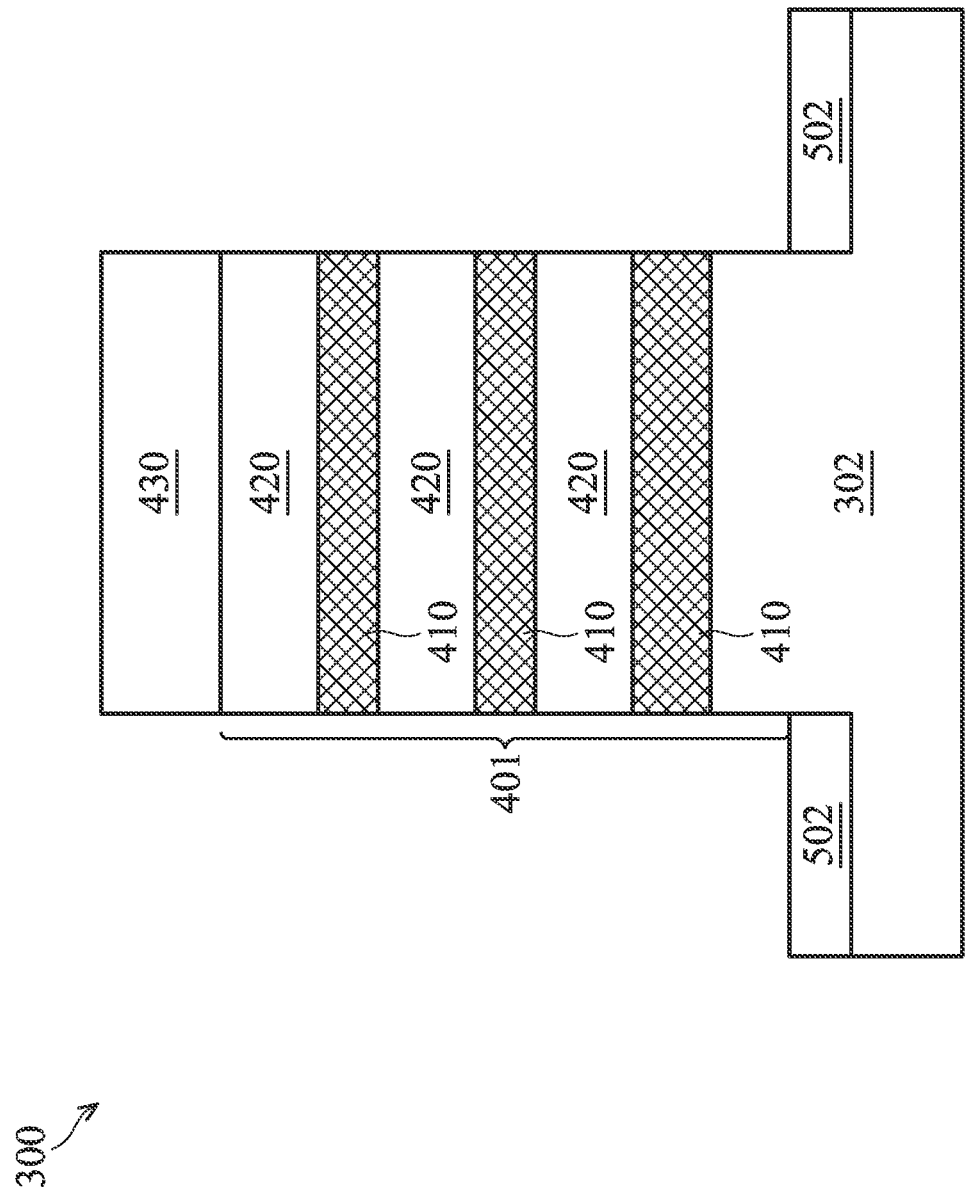

Corresponding to operation 206 of FIG. 2, FIG. 5 is a cross-sectional view of the GAA FET device 300 including one or more isolation structures 502, at one of the various stages of fabrication. The cross-sectional view of FIG. 5 is cut in a direction along the lengthwise direction of an active/dummy gate structure of the GAA FET device 300 (e.g., cross-section A-A indicated in FIG. 1).

The isolation structure 502, which can includes multiple portions, may be formed between adjacent fin structures, or next to a single fin structure. The isolation structure 502, which are formed of an insulation material, can electrically isolate neighboring fin structures from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP) process, may remove any excess insulation material and form a top surface of the insulation material and a top surface of a patterned mask (not shown) defining the fin structure 401. The patterned mask (e.g., the hardmask layer 430 or a portion of it) may also be removed by the planarization process, in various embodiments.

Next, the insulation material is recessed to form the isolation structure 502, as shown in FIG. 5, which is sometimes referred to as a shallow trench isolation (STI). The isolation structure 502 is recessed such that the fin structure 401 protrudes from between neighboring portions of the isolation structure 502. The top surface of the isolation structures (STIs) 502 may have a flat surface (as illustrated), a convex surface, a concave surface (such as dishing), or combinations thereof. The top surface of the isolation structure 502 may be formed flat, convex, and/or concave by an appropriate etch. The isolation structure 502 may be recessed using an acceptable etching process, such as one that is selective to the material of the isolation structure 502. For example, a dry etch or a wet etch using dilute hydrofluoric (DHF) acid may be performed to recess the isolation structure 502.

Figure 6:
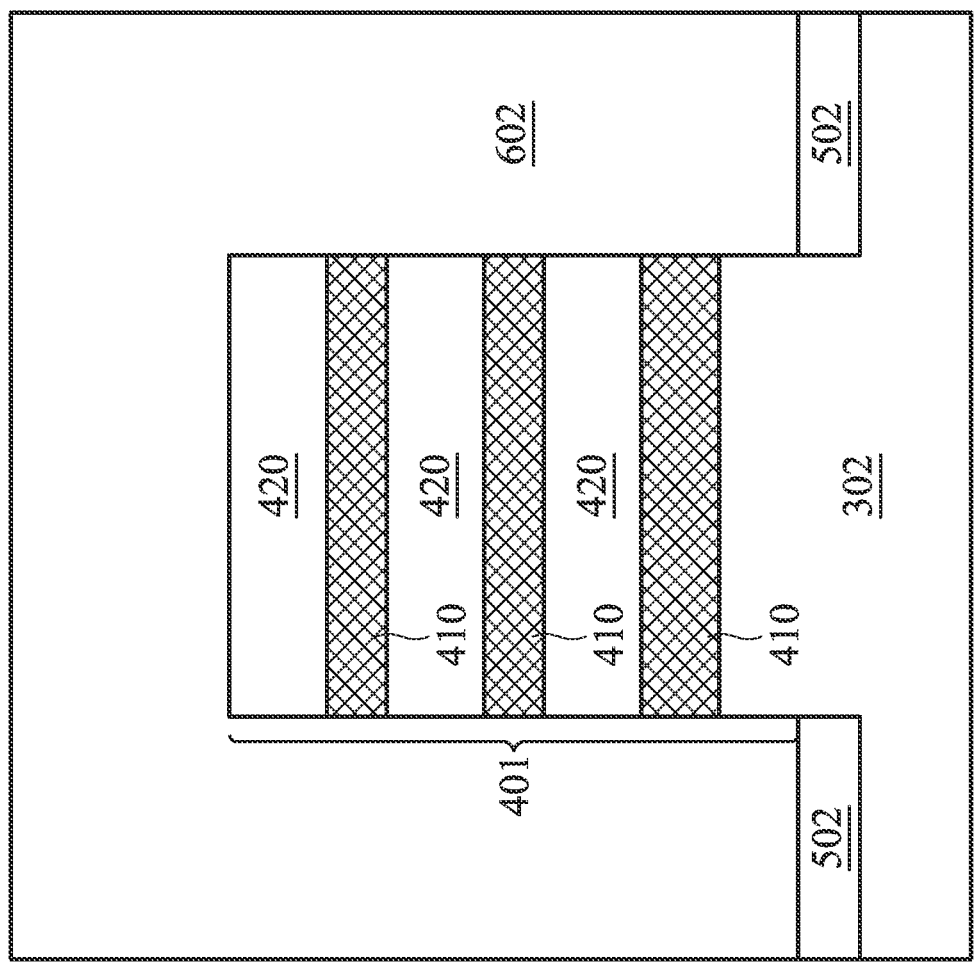
Figure 7:
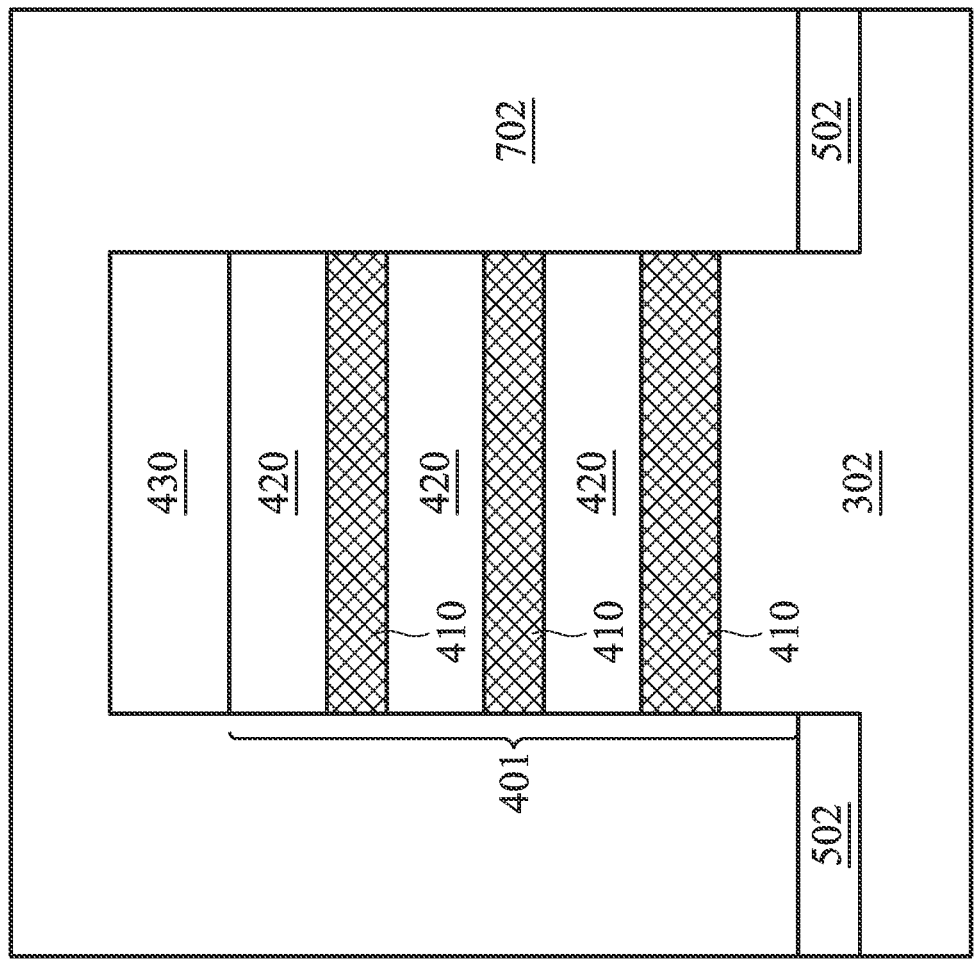

Corresponding to operation 208 that follows operation 206 in FIG. 2, FIG. 6 is a cross-sectional view of the GAA FET device 300 including a blanket layer of a dummy gate 602, at one of the various stages of fabrication. Alternatively or additionally, corresponding to operation 210 that also follows operation 206 in FIG. 2, FIG. 7 is a cross-sectional view of the GAA FET device 300 including a blanket layer of a dummy gate 702, at one of the various stages of fabrication. The cross-sectional views of FIGS. 6 and 7 are each cut in a direction along the lengthwise direction of an active/dummy gate structure of the GAA FET device 300 (e.g., cross-section A-A indicated in FIG. 1).

As shown in FIG. 6, the blanket layer 602 is formed over the fin structure 401 and the isolation structure 502, without the hardmask layer 430 (FIG. 5) disposed between the fin structure 401 and the blanket layer 602; and as shown in FIG. 7, the blanket layer 702 is formed over the fin structure 401 and the isolation structure 502, with the hardmask layer 430 disposed between the fin structure 401 and the blanket layer 702. Although the blanket layers 602 and 702 are each shown as a single layer in the illustrated embodiments of FIGS. 6-7, it should be understood that the blanket layers 602 and 702 can each include a number of layers stacked on top of one another while remaining within the scope of the present disclosure. In some embodiments, the blanket layer 602 and 702 can each include one or more Si-based or SiGe-based materials that are similar (or having similar etching rates) as the first semiconductor layers 410 such as, for example, SiGe. The blanket layer 602 and 702 may be deposited by CVD, PECVD, ALD, FCVD, or combinations thereof.

Each of the blanket layers 602 and 702 can later be patterned to form a dummy gate structure extending along a lateral direction perpendicular to the lateral direction along which the fin structure 401 extends. As such, the dummy gate structure can straddle a portion of the fin structure 401 (e.g., overlaying a top surface of the fin structure and extending along sidewalls of the fin structure). Concurrently with or subsequently to the removal of the first semiconductor layers 410, the dummy gate structure can be replaced where an active (e.g., metal) gate structure, which allows the active gate structure to wrap around each of the semiconductor layers 420, which will be discussed in further detail below. Accordingly, the semiconductor layer 410 and semiconductor layer 420 may sometimes be referred to as a sacrificial layer and a channel layer, respectively.

Figure 8:
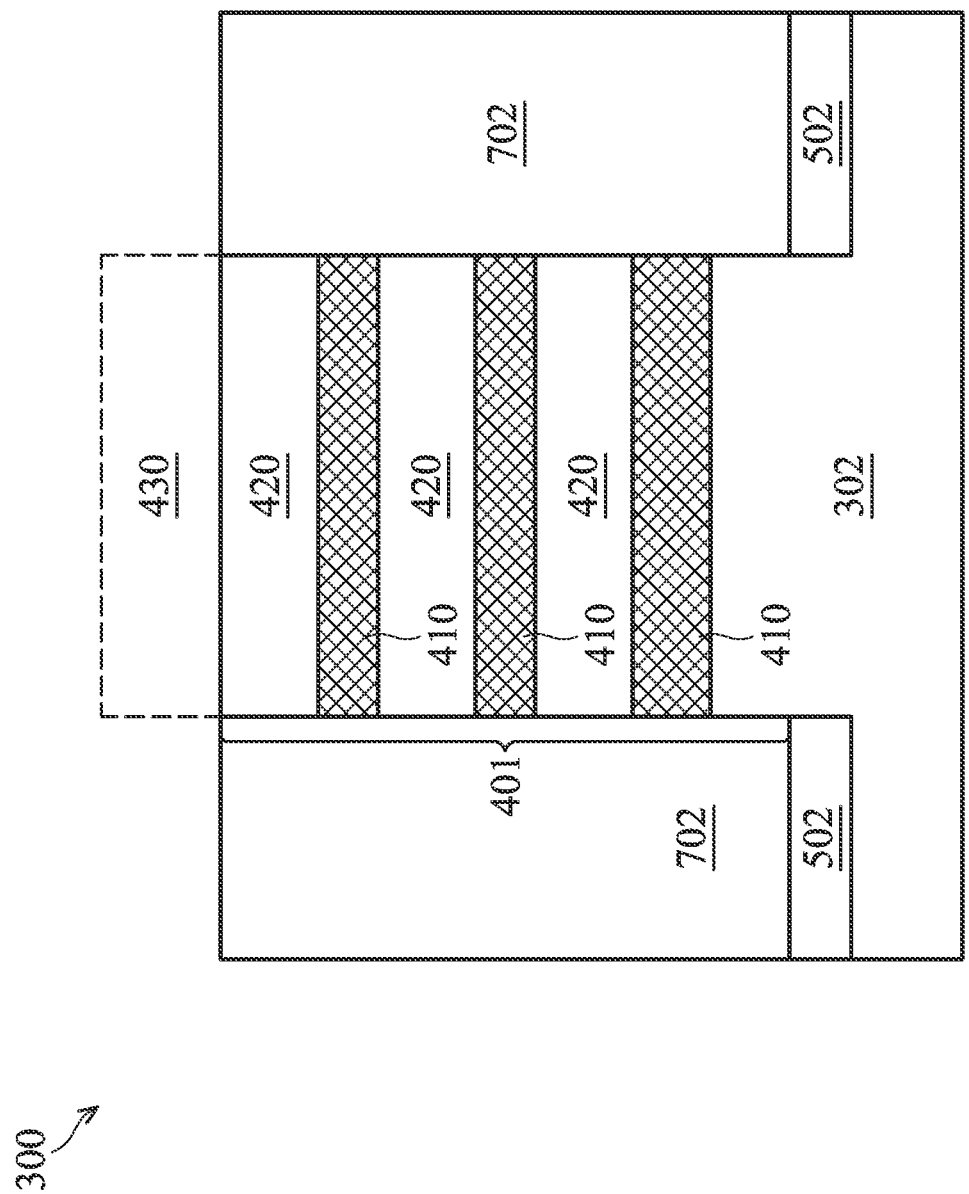
Figure 9:
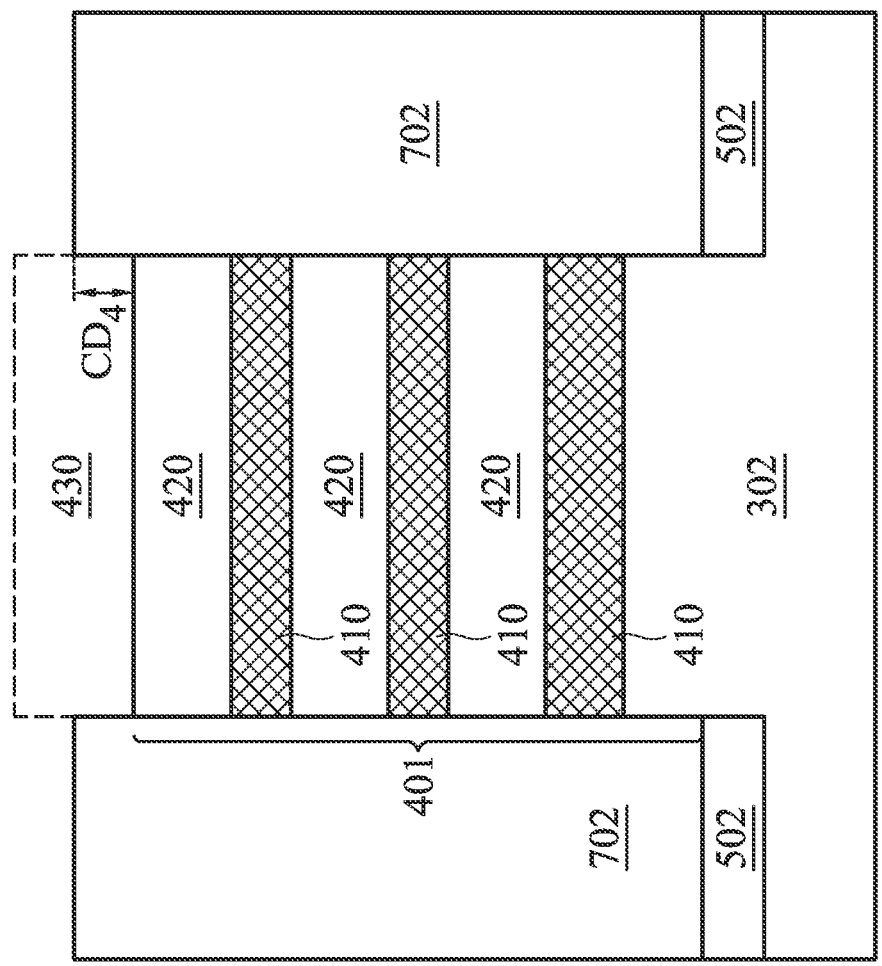

In some embodiments that follow operation 210, the method 200 may proceed to operation 212 in which the hardmask layer 430 is removed after the blanket layer 702 is formed. Corresponding to such operation 212, FIGS. 8 and 9 are each a cross-sectional view of the GAA FET device 300, at one of the various stages of fabrication. The cross-sectional views of FIGS. 8 and 9 are each cut in a direction along the lengthwise direction of an active/dummy gate structure of the GAA FET device 300 (e.g., cross-section A-A indicated in FIG. 1).

Following the deposition of the blanket layer 702, referring first to FIG. 8, the hardmask layer 430 (shown in dotted line) may be exposed by planarizing (e.g., through CMP) the blanket layer 702. Upon the hardmask layer 430 being exposed, the hardmask layer 430 and the blanket layer 702 may be recessed at similar etching rates, thereby removing the hardmask layer 430 while remaining a portion of the blanket layer 702. This may be achieved by controlling the compositions (e.g., the Ge molar ratios, the crystalline forms, etc.) of the hardmask layer 430 and the blanket layer 702 to be close to each other, when respectively forming the hardmask layer 430 and the blanket layer 702, in accordance with various embodiments. As such, after the recessing step to remove the hardmask layer 430, a coplanar surface may be shared by a top surface of the topmost semiconductor layer 420 and a top surface of a remaining portion of the blanket layer 702, as shown in FIG. 8.

Also following the deposition of the blanket layer 702, referring then to FIG. 9, the hardmask layer 430 (shown in dotted line) may be exposed by planarizing (e.g., through CMP) the blanket layer 702. Upon the hardmask layer 430 being exposed, the hardmask layer 430 and the blanket layer 702 may be recessed at different etching rates, thereby removing the hardmask layer 430 while remaining a portion of the blanket layer 702. This may be achieved by controlling the material compositions (e.g., the Ge molar ratios, the crystalline forms, etc.) of the hardmask layer 430 and the blanket layer 702 to be different from each other, when respectively forming the hardmask layer 430 and the blanket layer 702, in accordance with various embodiments. For example, the material composition of the hardmask layer 430 may be formed as having a higher etching rate than the material composition of the blanket layer 702. As such, after the recessing step to remove the hardmask layer 430, the top surface of the topmost semiconductor layer 420 may be recessed from the top surface of the remaining portion of the blanket layer 702, as shown in FIG. 9. This recessed top surface may be characterized by a critical dimension, $CD_4$, which may be between about 5 angstroms (Å) and about 200 Å.

The recessing step may be configured to have at least some anisotropic etching characteristic. For example, the recessing step can include a plasma etching process, which can have a certain amount of anisotropic characteristic. In such a plasma etching process (including radical plasma etching, remote plasma etching, and other suitable plasma etching processes), gas sources such as chlorine (Cl$_2$), hydrogen bromide (HBr), carbon tetrafluoride (CF$_4$), fluoroform (CHF$_3$), difluoromethane (CH$_2$F$_2$), fluoromethane (CH$_3$F), hexafluoro-1,3-butadiene (C$_4$F$_6$), boron trichloride (BCl$_3$), sulfur hexafluoride (SF$_6$), hydrogen (H$_2$), nitrogen trifluoride (NF$_3$), and other suitable gas sources and combinations thereof can be used with passivation gases such as nitrogen (N$_2$), oxygen (O$_2$), carbon dioxide (CO$_2$), sulfur dioxide (SO$_2$), carbon monoxide (CO), methane (CH$_4$), silicon tetrachloride (SiCl$_4$), and other suitable passivation gases and combinations thereof. Moreover, for the recessing step, the gas sources and/or the passivation gases can be diluted with gases such as argon (Ar), helium (He), neon (Ne), and other suitable dilutive gases and combinations thereof to control the above-described etching rates. As a non-limiting example, a source power of 10 watts to 3000 watts, a bias power of 0 watts to 3000 watts, a pressure of 1 millitorr to 5 torr, and an etch gas flow of 0 standard cubic centimeters per minute to 5000 standard cubic centimeters per minute may be used in the recessing step. However, it is noted that source powers, bias powers, pressures, and flow rates outside of these ranges are also contemplated.

In another example, the recessing step can include a wet etching process, which can have a certain amount of isotropic characteristic, in combination with the plasma etching process. In such a wet etching process, a main etch chemical such as hydrofluoric acid (HF), fluorine (F$_2$), and other suitable main etch chemicals and combinations thereof can be used with assistive etch chemicals such as sulfuric acid (H$_2$SO$_4$), hydrogen chloride (HCl), hydrogen bromide (HBr), ammonia (NH$_3$), phosphoric acid (H$_3$PO$_4$), and other suitable assistive etch chemicals and combinations thereof as well as solvents such as deionized water, alcohol, acetone, and other suitable solvents and combinations thereof.

Figure 10:
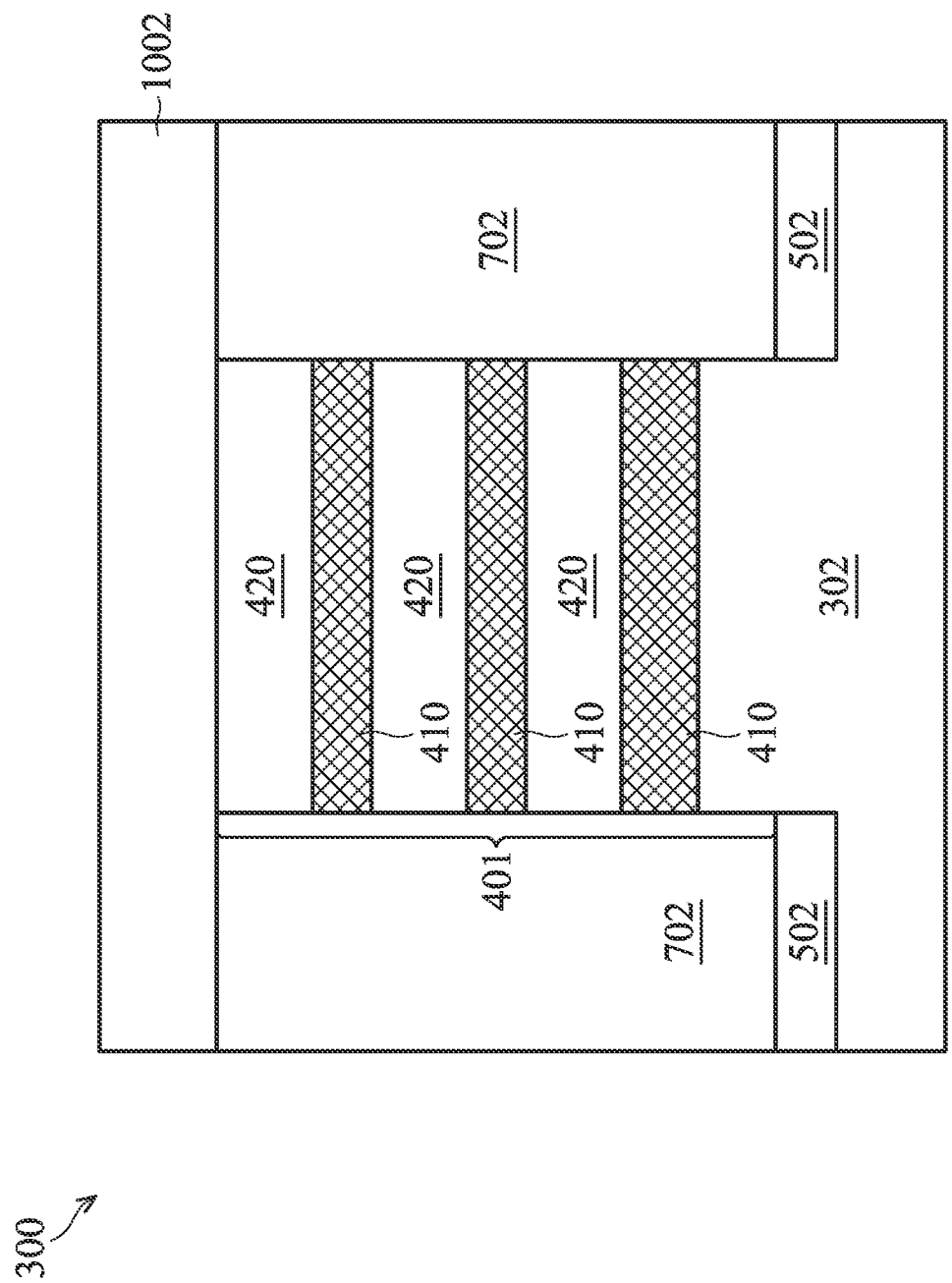
Figure 11:
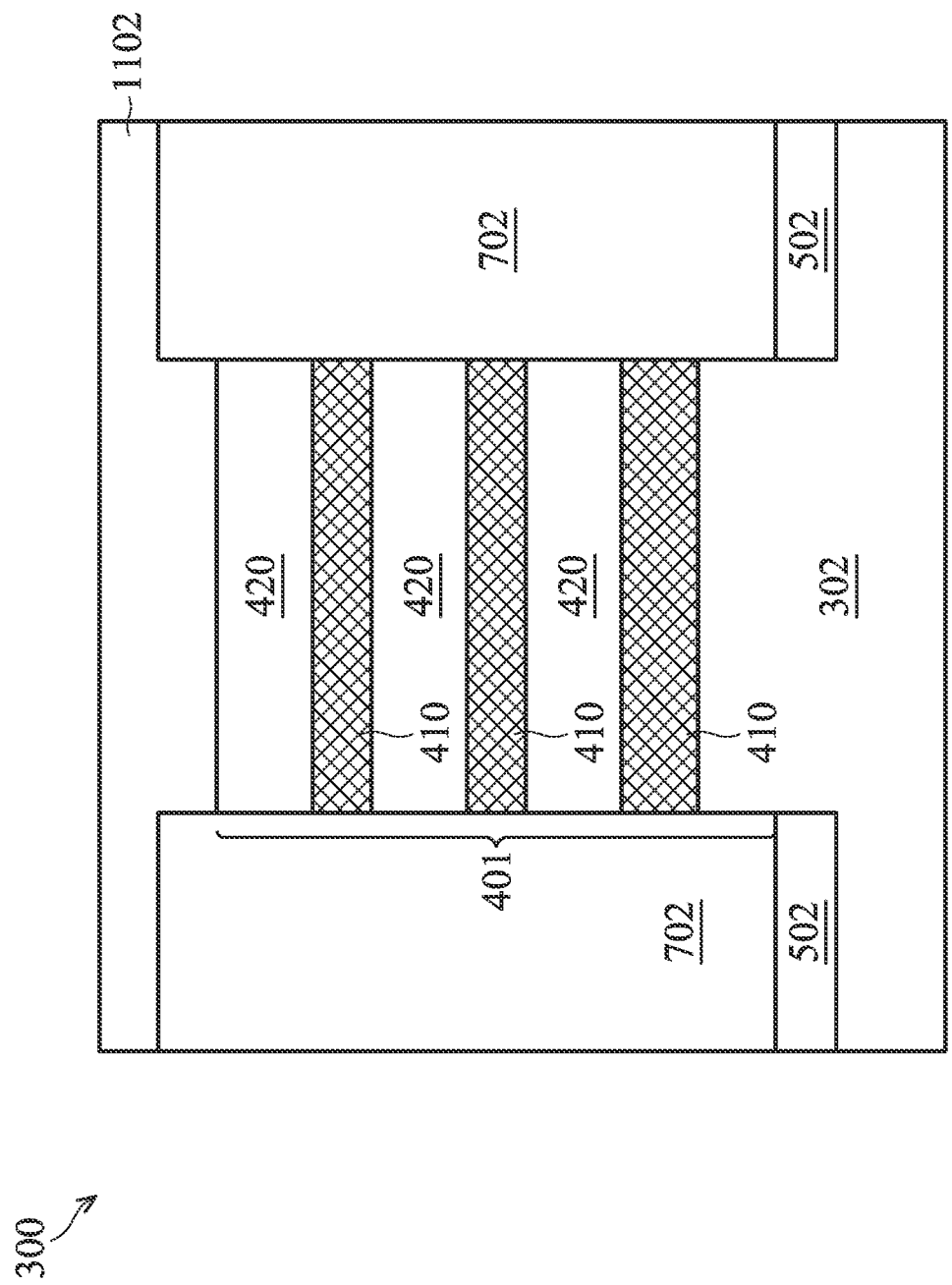

In some embodiments that follow operation 212, the method 200 may proceed to operation 214 in which a further dummy gate blanket layer is deposited. Corresponding to such operation 214, FIGS. 10 and 11 are each a cross-sectional view of the GAA FET device 300, at one of the various stages of fabrication. The cross-sectional views of FIGS. 10 and 11 are each cut in a direction along the lengthwise direction of an active/dummy gate structure of the GAA FET device 300 (e.g., cross-section A-A indicated in FIG. 1).

In FIG. 10, the GAA FET device 300 includes a further blanket layer 1002 formed over the hardmask layer 420 and remaining blanket layer 702 shown in FIG. 8. Accordingly, the blanket layer 1002 can inherit the dimensions and profiles shown in FIG. 8, e.g., the blanket layer 1002 contacting the topmost semiconductor layer 420 that shares a coplanar surface with the remaining blanket layer 702. In FIG. 11, the GAA FET device 300 includes a further blanket layer 1102 formed over the hardmask layer 420 and remaining blanket layer 702 shown in FIG. 9. Accordingly, the blanket layer 1102 can inherit the dimensions and profiles shown in FIG. 9, e.g., the blanket layer 1102 having a protruding portion that contacts the topmost semiconductor layer 420 and a recessing portion that contacts the remaining blanket layer 702. In some embodiments, the blanket layer 1002 and 1102 can each include one or more Si-based or SiGe-based materials such as, for example, SiGe. The blanket layer 1002 and 1102 may be deposited by CVD, PECVD, ALD, FCVD, or combinations thereof. Hereinafter, the remaining blanket layer 702 may be referred to as a blanket lower layer, and the blanket layer 1002/1102 may be referred to as a blanket upper layer.

In some embodiments, following operation 208, operation 210, or operation 214, the method 200 may proceed to operation 216 in which the dummy gate blanket layer is patterned and a gate spacer is formed. Such different embodiments will be discussed with a number of the cross-sectional views of the GAA FET device 300, respectively.

Figure 12A:
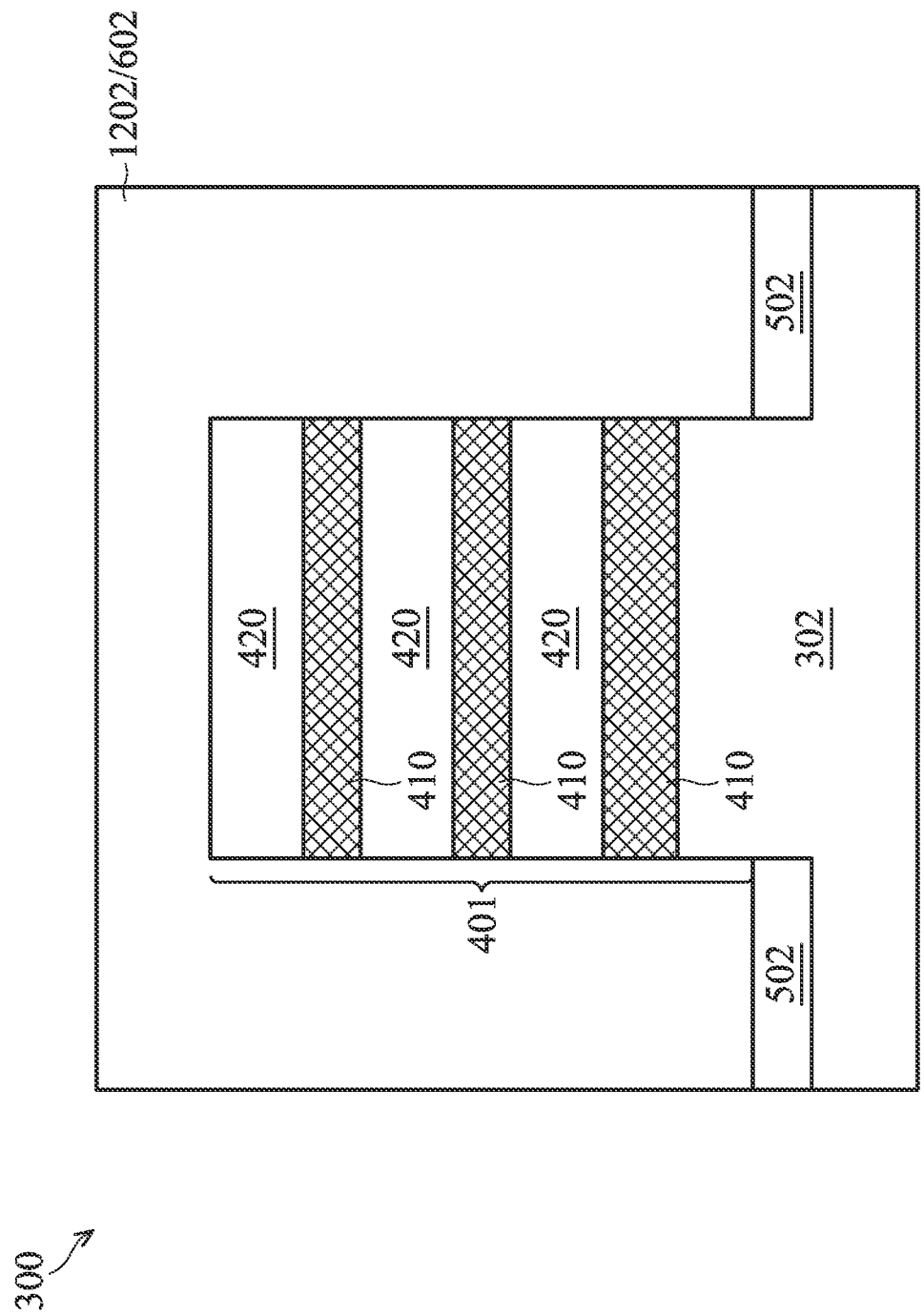
Figure 12B:
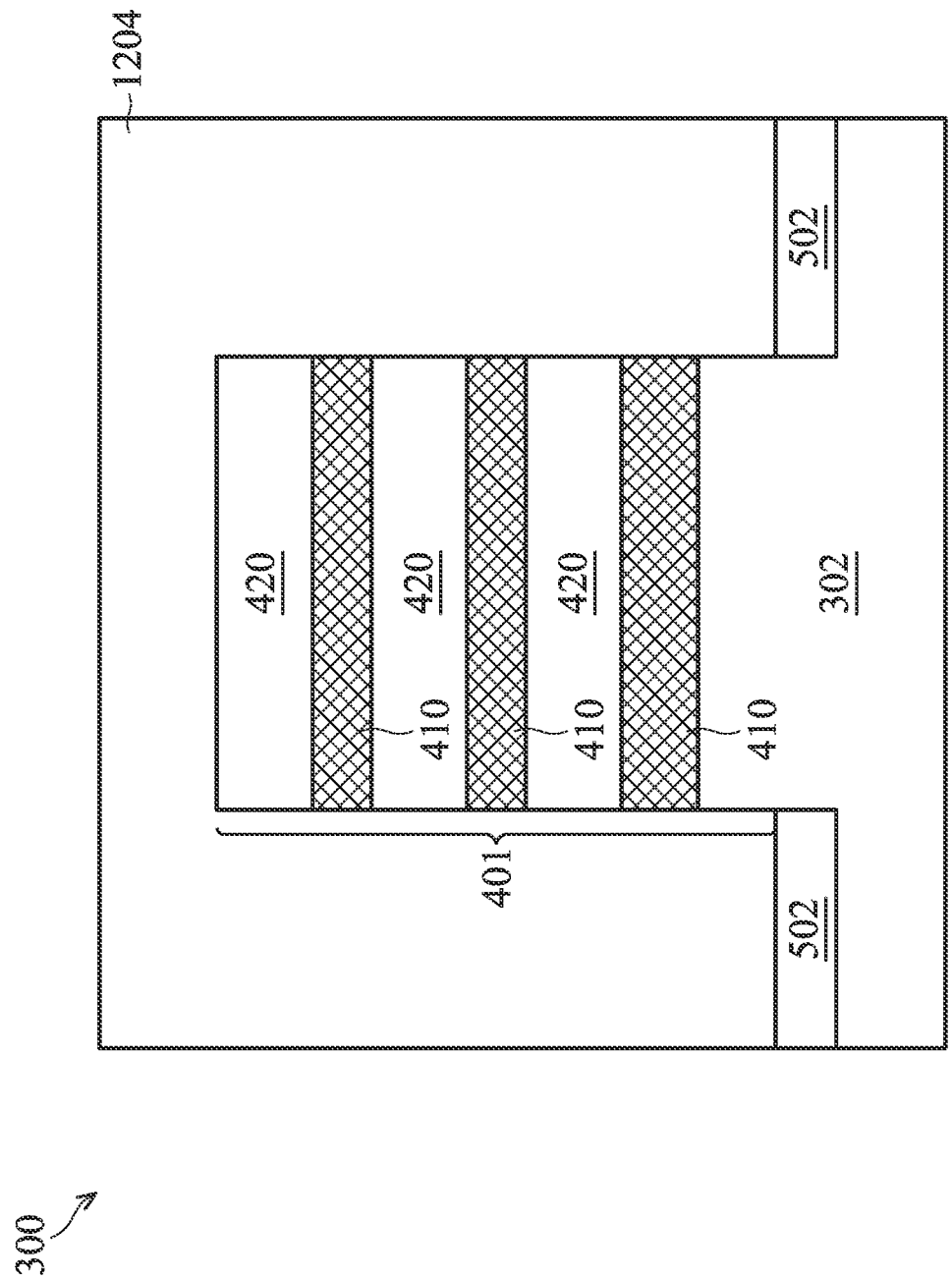

Corresponding to operation 216 that follows operation 208 in FIG. 2, FIG. 12A is a cross-sectional views of the GAA FET device 300 in which the blanket layer 602 (FIG. 6) is patterned to form a dummy gate structure 1202, at one of the various stages of fabrication; and FIG. 12B is a cross-sectional views of the GAA FET device 300 in which a gate spacer 1204 is formed, at a next one of the various stages of fabrication. The cross-sectional view of FIG. 12A is cut in a direction along the lengthwise direction of an active/dummy gate structure of the GAA FET device 300 (e.g., cross-section A-A indicated in FIG. 1); and the cross-sectional view of FIG. 12B is cut in a direction that is parallel to the lengthwise direction of an active/dummy gate structure of the GAA FET device 300 and across a gate/inner spacer (e.g., cross-section B-B indicated in FIG. 1).

As shown in FIGS. 12A-B, sidewalls of the blanket layer 602 (facing the direction in and out of the plane) may be first patterned (e.g., etched) to form the dummy gate structure 1202, and the gate spacer 1204 is formed on opposite sides of the dummy gate structure 1202 where the sidewalls are etched. More specifically in FIG. 12B, the whole sidewalls of the blanket layer 602 are etched such that the gate spacer 1204 may contact the top surface of the topmost semiconductor layer 420, extend along sidewalls of the fin structure 401, and contact the top surface of the STI 502.

Although the gate spacer 1204 is shown as a single layer in the example of FIG. 12B, it should be understood that the gate spacer can be formed to have any number of layers while remaining within the scope of the present disclosure, which will be discussed in further detail below with respect to FIGS. 25A-B and 26A-B. The gate spacer may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer. The shapes and formation methods of the gate spacer 1204 as illustrated in FIG. 12B is merely non-limiting examples, and other shapes and formation methods are possible. These and other variations are fully intended to be included within the scope of the present disclosure.

Figure 13A:
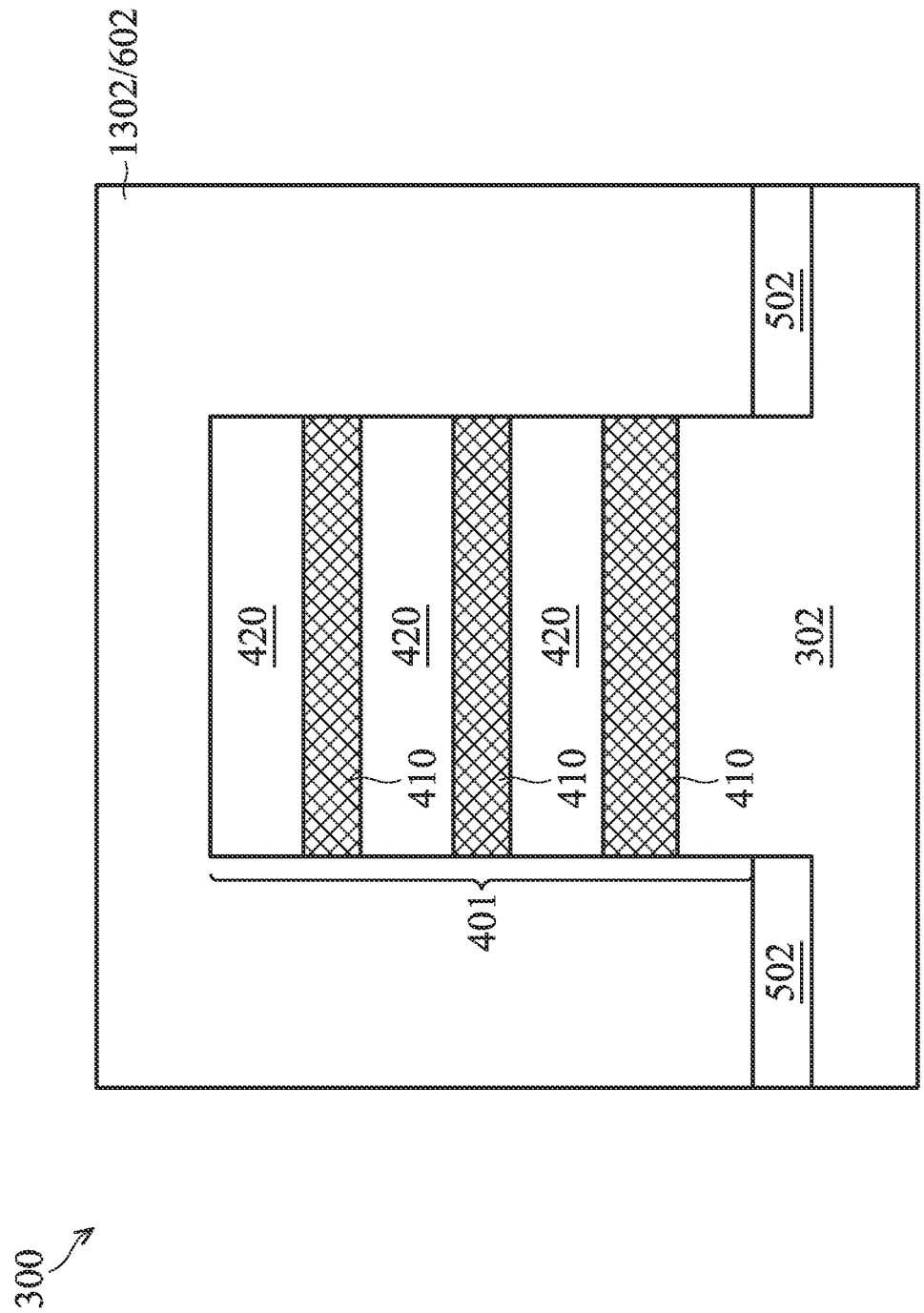
Figure 13B:
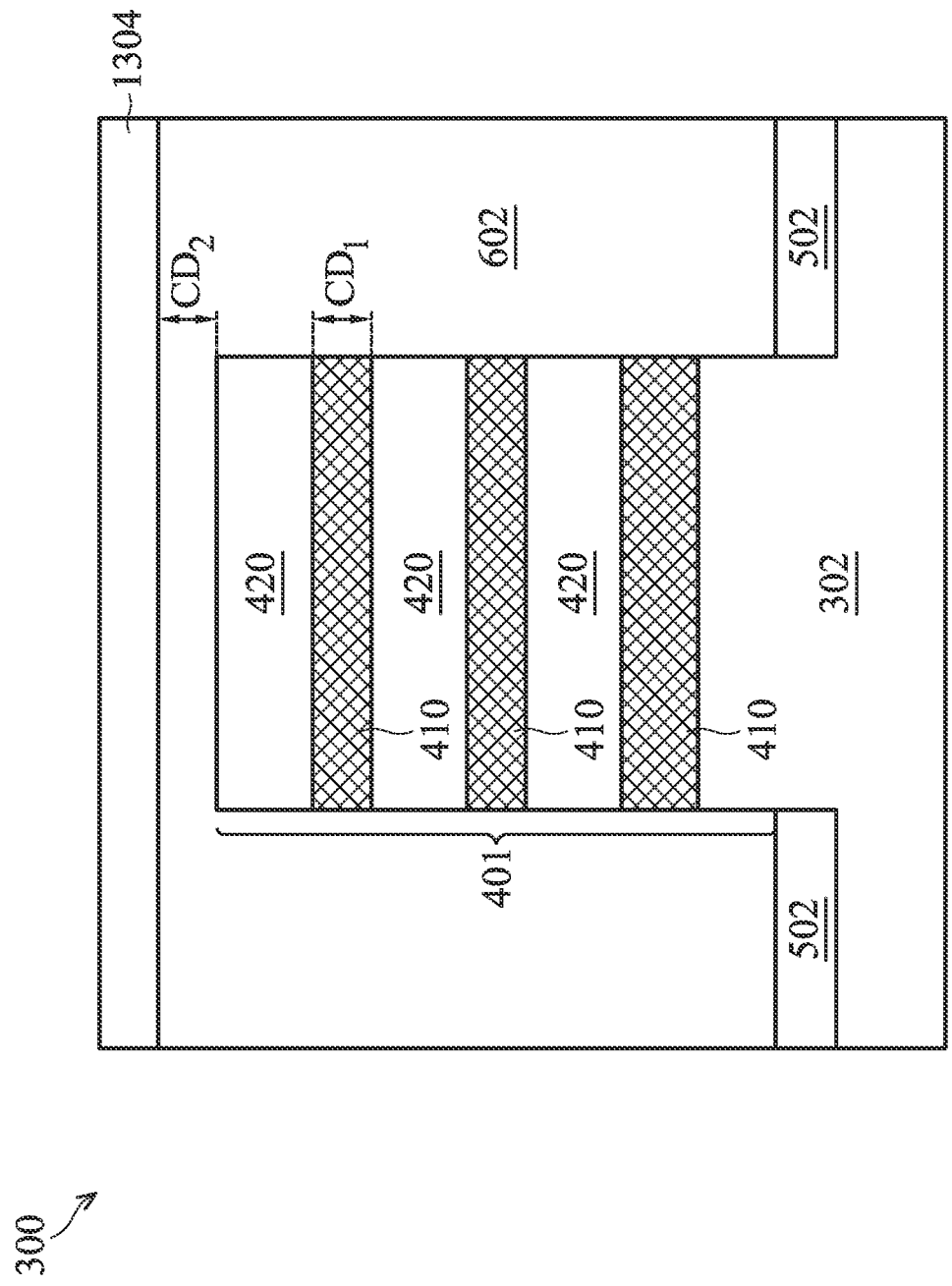

Corresponding to operation 216 that also follows operation 208 in FIG. 2, FIG. 13A is a cross-sectional views of the GAA FET device 300 in which the blanket layer 602 (FIG. 6) is patterned to form a dummy gate structure 1302, at one of the various stages of fabrication; and FIG. 13B is a cross-sectional views of the GAA FET device 300 in which a gate spacer 1304 is formed, at a next one of the various stages of fabrication. The cross-sectional view of FIG. 13A is cut in a direction along the lengthwise direction of an active/dummy gate structure of the GAA FET device 300 (e.g., cross-section A-A indicated in FIG. 1); and the cross-sectional view of FIG. 13B is cut in a direction that is parallel to the lengthwise direction of an active/dummy gate structure of the GAA FET device 300 and across a gate/inner spacer (e.g., cross-section B-B indicated in FIG. 1).

As shown in FIGS. 13A-B, sidewalls of the blanket layer 602 (facing the direction in and out of the plane) may be first patterned (e.g., etched) to form the dummy gate structure 1302, and the gate spacer 1304 is formed on opposite sides of the dummy gate structure 1302 where the sidewalls are etched. More specifically in FIG. 13B, respective upper portions of the sidewalls of the blanket layer 602 are etched such that the gate spacer 1304 may not contact the top surface of the topmost semiconductor layer 420, extend along sidewalls of the fin structure 401, or contact the top surface of the STI 502. For example, a bottom surface of the gate spacer 1304 may be separated from (e.g., on top of) the top surface of the topmost semiconductor layer 420 with a non-etched portion of the dummy gate blanket layer 602. Such a non-etched portion of the blanket layer 602 (one example of the above-described intermediate structure) has a thickness that can be characterized by a critical dimension, $CD_2$. In some embodiments, this critical dimension $CD_2$ is controlled to be about the same as a distance separating the neighboring semiconductor layers 420, i.e., a thickness of the semiconductor layer 410, which can be characterized by a critical dimension, $CD_1$ (e.g., between about 20 angstroms (Å) and about 300 Å). In some other embodiments, a ratio of $CD_2$ to $CD_1$ may range between about 0.7 and about 1.3. The dimension $CD_2$ may be controlled through an etching process to pattern the blanket layer 602 (FIG. 13A), for example, through etching time of the etching process or otherwise etching amount of the etching process.

Although the gate spacer 1304 is shown as a single layer in the example of FIG. 13B, it should be understood that the gate spacer can be formed to have any number of layers while remaining within the scope of the present disclosure, which will be discussed in further detail below with respect to FIGS. 27A-B and 28A-B. The gate spacer may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer. The shapes and formation methods of the gate spacer 1304 as illustrated in FIG. 13B is merely non-limiting examples, and other shapes and formation methods are possible. These and other variations are fully intended to be included within the scope of the present disclosure.

Figure 14A:
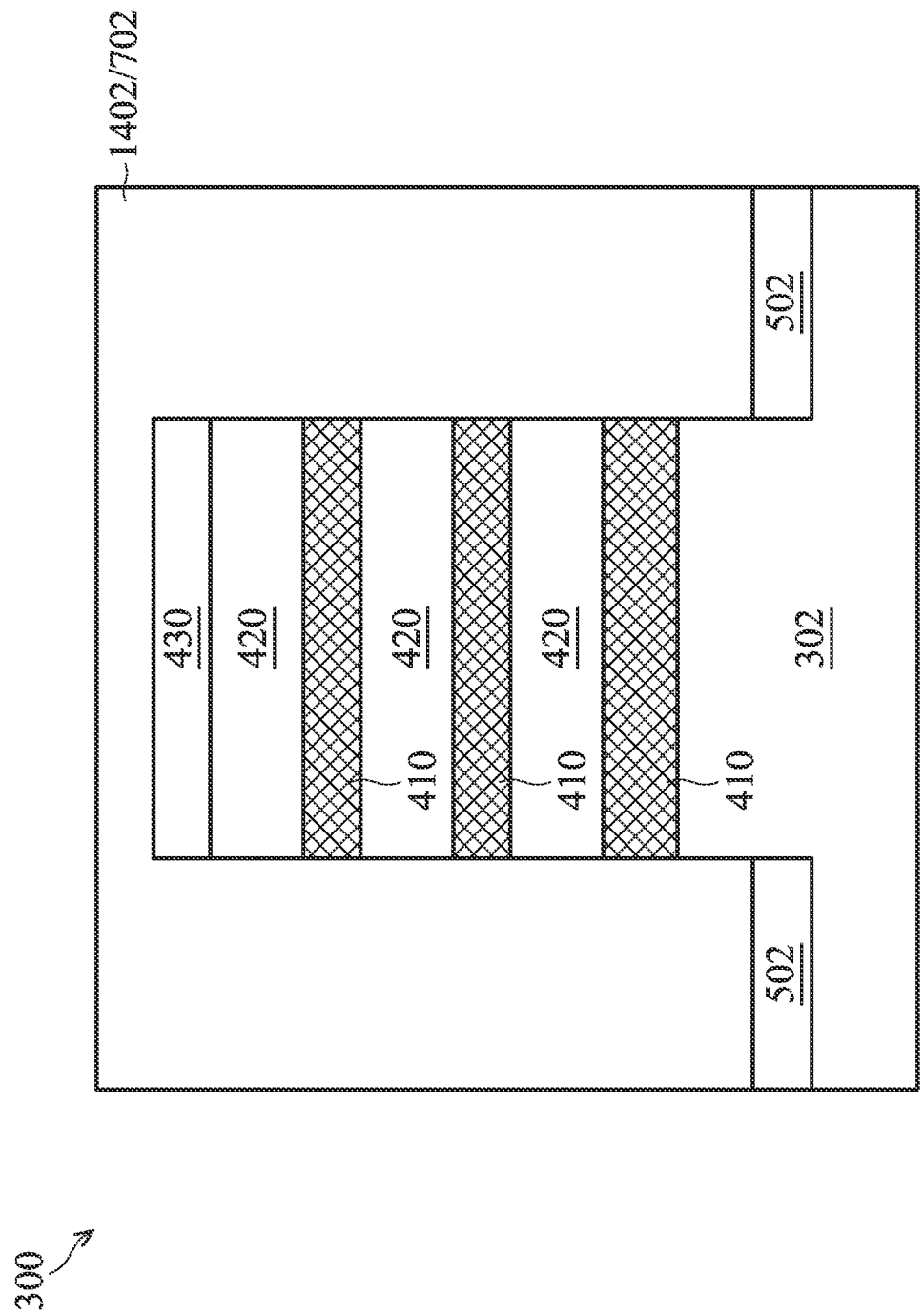
Figure 14B:
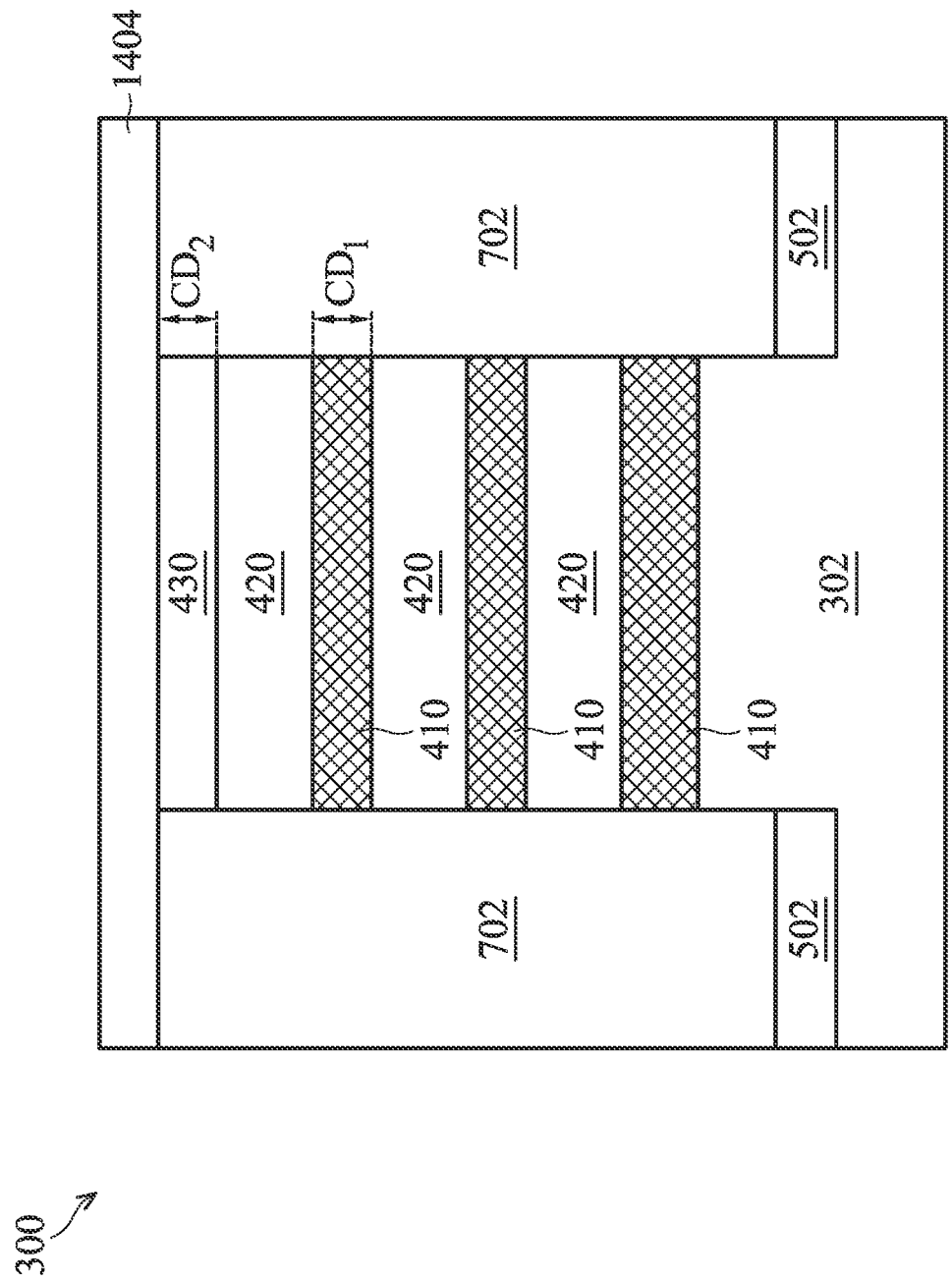

Corresponding to operation 216 that follows operation 210 in FIG. 2, FIG. 14A is a cross-sectional views of the GAA FET device 300 in which the blanket layer 702 (FIG. 7) is patterned to form a dummy gate structure 1402, at one of the various stages of fabrication; and FIG. 14B is a cross-sectional views of the GAA FET device 300 in which a gate spacer 1404 is formed, at a next one of the various stages of fabrication. The cross-sectional view of FIG. 14A is cut in a direction along the lengthwise direction of an active/dummy gate structure of the GAA FET device 300 (e.g., cross-section A-A indicated in FIG. 1); and the cross-sectional view of FIG. 14B is cut in a direction that is parallel to the lengthwise direction of an active/dummy gate structure of the GAA FET device 300 and across a gate/inner spacer (e.g., cross-section B-B indicated in FIG. 1).

As shown in FIGS. 14A-B, sidewalls of the blanket layer 702 (facing the direction in and out of the plane) may be first patterned (e.g., etched) to form the dummy gate structure 1402, and the gate spacer 1404 is formed on opposite sides of the dummy gate structure 1402 where the sidewalls are etched. More specifically in FIG. 14B, respective upper portions of the sidewalls of the blanket layer 702 and underlying (end) portions of the hardmask layer 430 are etched such that the gate spacer 1404 may contact a top surface of the etched hardmask layer 430, but may not extend along sidewalls of the fin structure 401 or contact the top surface of the STI 502. For example, a bottom surface of the gate spacer 1404 may be separated from (e.g., on top of) the top surface of the topmost semiconductor layer 420 with a distance, i.e., a thickness of the etched hardmask layer 430. Such a distance can be characterized by the above-identified critical dimension $CD_2$. The critical dimension $CD_2$ may range between about 20 angstroms (Å) and about 300 Å. In some embodiments, this critical dimension $CD_2$ is controlled to be about the same as a distance separating the neighboring semiconductor layers 420, i.e., a thickness of the semiconductor layer 410, $CD_1$. In some other embodiments, a ratio of $CD_2$ to $CD_1$ may range between about 0.7 and about 1.3. The dimension $CD_2$ may be controlled through an etching process to pattern the blanket layer 702 (FIG. 14A), for example, through etching time of the etching process or otherwise etching amount of the etching process.

Although the gate spacer 1404 is shown as a single layer in the example of FIG. 14B, it should be understood that the gate spacer can be formed to have any number of layers while remaining within the scope of the present disclosure, which will be discussed in further detail below with respect to FIGS. 27A-B and 28A-B. The gate spacer may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer. The shapes and formation methods of the gate spacer 1404 as illustrated in FIG. 14B is merely non-limiting examples, and other shapes and formation methods are possible. These and other variations are fully intended to be included within the scope of the present disclosure.

Figure 15A:
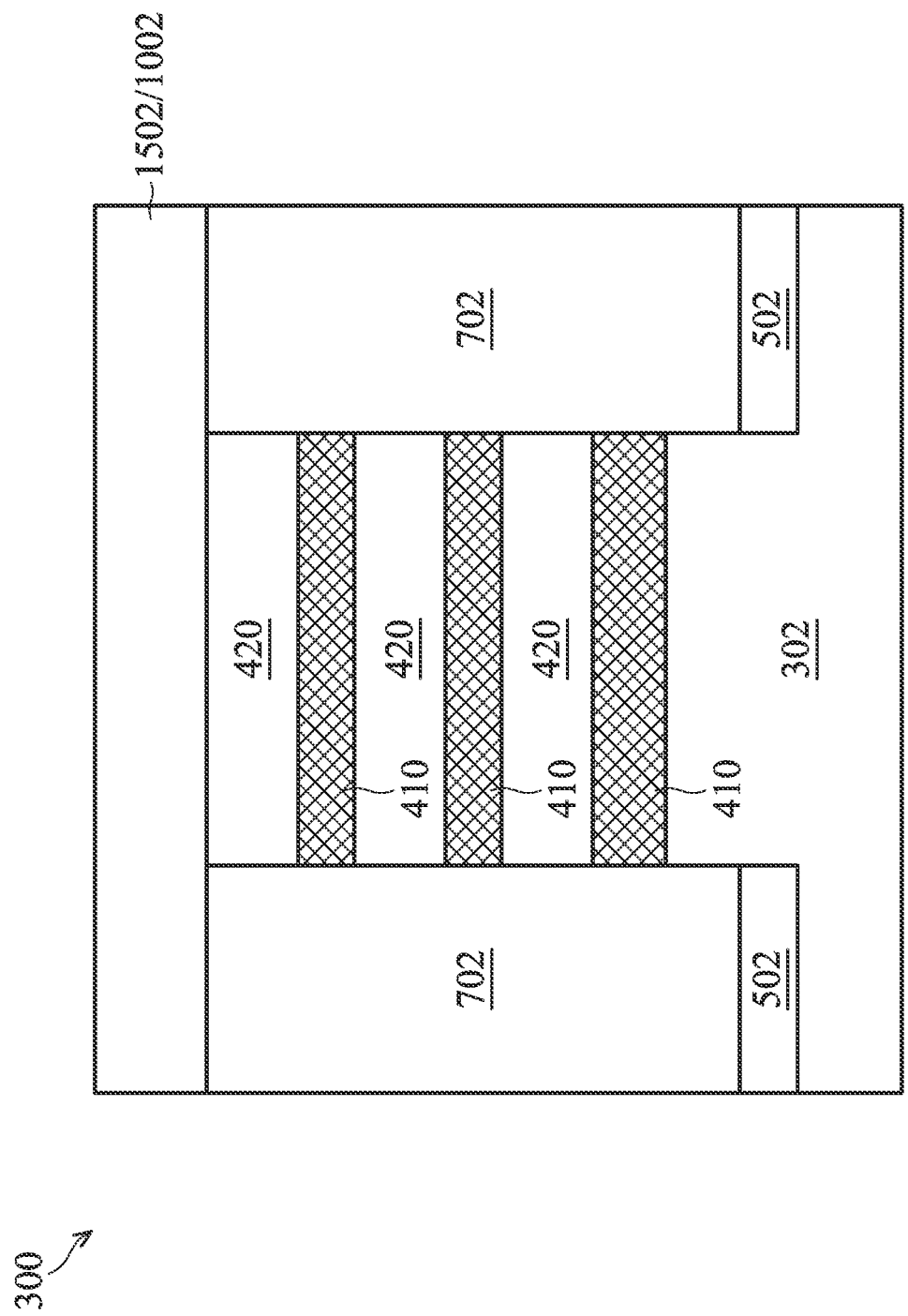
Figure 15B:
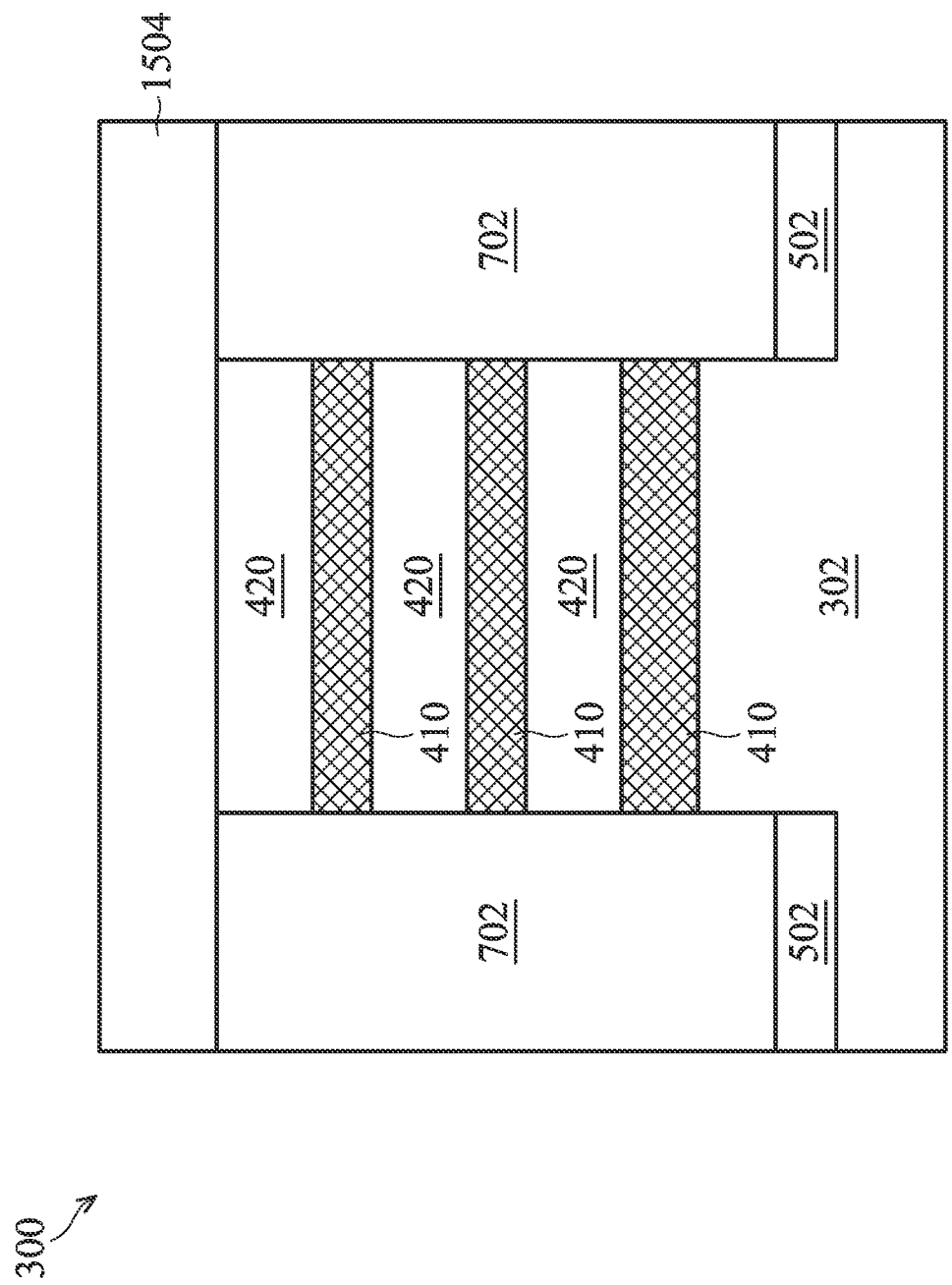

Corresponding to operation 216 that follows operation 214 in FIG. 2, FIG. 15A is a cross-sectional views of the GAA FET device 300 in which the blanket upper layer 1002 (FIG. 10) is patterned to form a dummy gate structure 1502, at one of the various stages of fabrication; and FIG. 15B is a cross-sectional views of the GAA FET device 300 in which a gate spacer 1504 is formed, at a next one of the various stages of fabrication. The cross-sectional view of FIG. 15A is cut in a direction along the lengthwise direction of an active/dummy gate structure of the GAA FET device 300 (e.g., cross-section A-A indicated in FIG. 1); and the cross-sectional view of FIG. 15B is cut in a direction that is parallel to the lengthwise direction of an active/dummy gate structure of the GAA FET device 300 and across a gate/inner spacer (e.g., cross-section B-B indicated in FIG. 1).

As shown in FIGS. 15A-B, sidewalls of the blanket upper layer 1002 (facing the direction in and out of the plane) may be first patterned (e.g., etched) to form the dummy gate structure 1502, and the gate spacer 1504 is formed on opposite sides of the dummy gate structure 1502 where the sidewalls are etched. More specifically in FIG. 15B, the whole sidewalls of the blanket upper layer 1002 are etched such that the gate spacer 1504 may contact the top surface of the topmost semiconductor layer 420, but may not extend along sidewalls of the fin structure 401 or contact the top surface of the STI 502. As such, a bottom surface of the gate spacer 1504 can contact the coplanar surface shared by the top surface of the topmost semiconductor layer 420 and the top surface of the blanket lower layer 702.

Although the gate spacer 1504 is shown as a single layer in the example of FIG. 15B, it should be understood that the gate spacer can be formed to have any number of layers while remaining within the scope of the present disclosure, which will be discussed in further detail below with respect to FIGS. 29A-B and 30A-B. The gate spacer may be a low-k spacer and may be formed of a suitable dielectric material, such as silicon oxide, silicon oxycarbonitride, or the like.

Any suitable deposition method, such as thermal oxidation, chemical vapor deposition (CVD), or the like, may be used to form the gate spacer. The shapes and formation methods of the gate spacer 1504 as illustrated in FIG. 15B is merely non-limiting examples, and other shapes and formation methods are possible. These and other variations are fully intended to be included within the scope of the present disclosure.

Figure 16A:
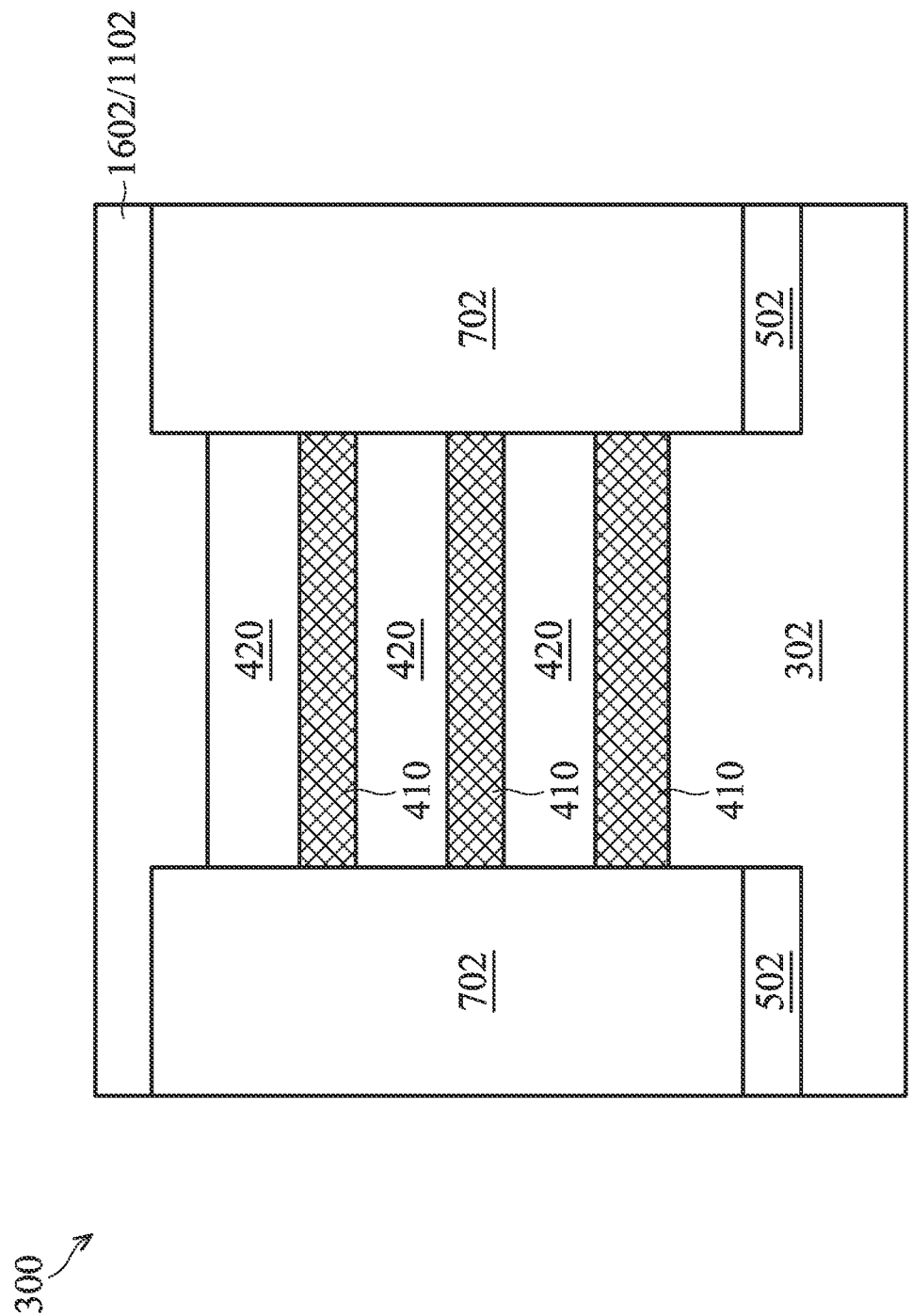
Figure 16B:
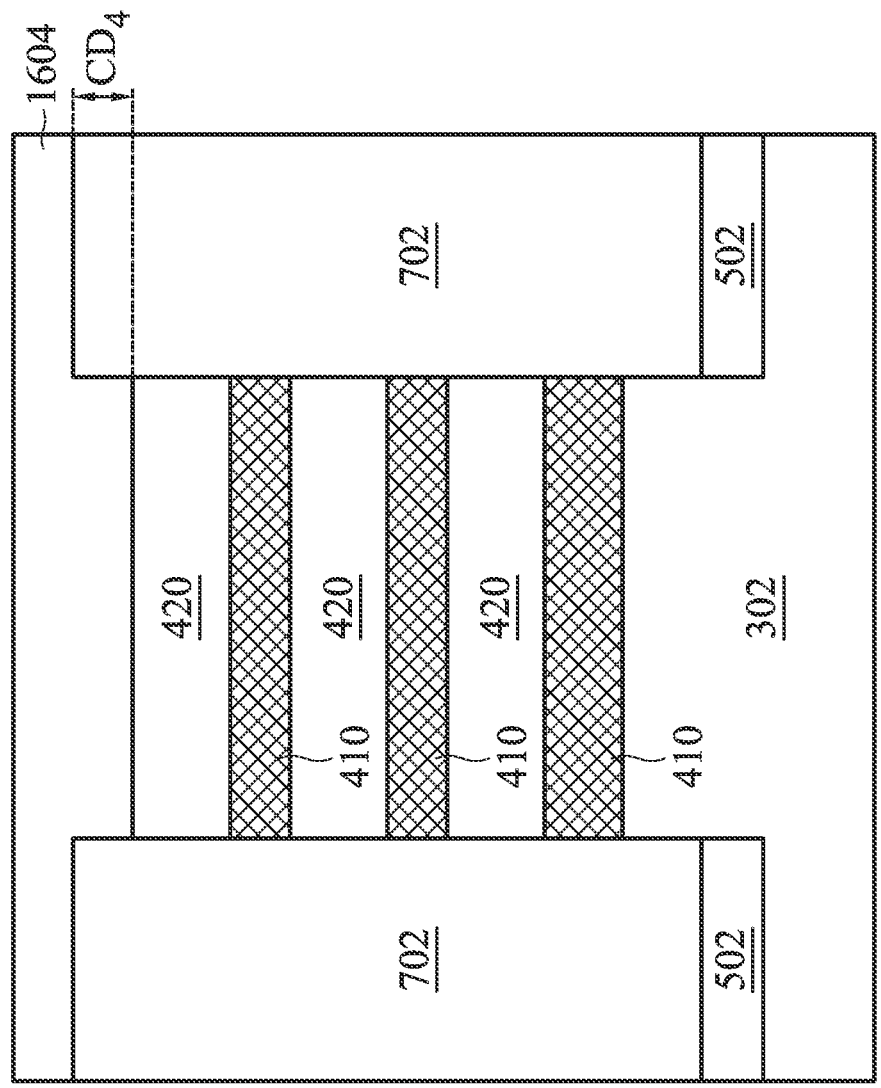

Corresponding to operation 216 that also follows operation 214 in FIG. 2, FIG. 16A is a cross-sectional views of the GAA FET device 300 in which the blanket upper layer 1102 (FIG. 11) is patterned to form a dummy gate structure 1602, at one of the various stages of fabrication; and FIG. 16B is a cross-sectional views of the GAA FET device 300 in which a gate spacer 1604 is formed, at a next one of the various stages of fabrication. The cross-sectional view of FIG. 16A is cut in a direction along the lengthwise direction of an active/dummy gate structure of the GAA FET device 300 (e.g., cross-section A-A indicated in FIG. 1); and the cross-sectional view of FIG. 16B is cut in a direction that is parallel to the lengthwise direction of an active/dummy gate structure of the GAA FET device 300 and across a gate/inner spacer (e.g., cross-section B-B indicated in FIG. 1).

As shown in FIGS. 16A-B, sidewalls of the blanket upper layer 1102 (facing the direction in and out of the plane) may be first patterned (e.g., etched) to form the dummy gate structure 1602, and the gate spacer 1604 is formed on opposite sides of the dummy gate structure 1602 where the sidewalls are etched. More specifically in FIG. 16B, the whole sidewalls of the blanket upper layer 1102 are etched such that the gate spacer 1604 may contact the top surface of the topmost semiconductor layer 420, but may not extend along sidewalls of the fin structure 401 or contact the top surface of the STI 502. As such, a bottom surface of the gate spacer 1604 can have a protruding portion contacting the top surface of the topmost semiconductor layer 420 and a recessed portion contacting the top surface of the blanket lower layer 702. In some embodiments, a difference between the protruding portion and the recessed portion can be characterized by the above-identified critical dimension $CD_4$.

Although the gate spacer 1604 is shown as a single layer in the example of FIG. 16B, it should be understood that the gate spacer can be formed to have any number of layers while remaining within the scope of the present disclosure, which will be discussed in further detail below with respect to FIGS. 31A-B and 32A-B. The gate spacer may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer. The shapes and formation methods of the gate spacer 1604 as illustrated in FIG. 16B is merely non-limiting examples, and other shapes and formation methods are possible. These and other variations are fully intended to be included within the scope of the present disclosure.

After forming the gate spacer 1204/1304/1404/1504/1604, portions of the fin structure 401 that are exposed by the dummy gate structure 1202/1302/1402/1502/1602 and the corresponding gate spacer are removed (e.g., anisotropically etched). In some embodiments in which the non-patterned blanket layer remains (not shown), such a remaining blanket layer may be partially removed (e.g., anisotropically etched), concurrently with or subsequently to the removal of the exposed portion of the fin structure 401. The dummy gate structure can serve as a mask to etch the exposed (non-overlaid) portions of the fin structure 401 and the remaining blanker layer (if any), which results in the fin structure 401 having respective remaining portions of the semiconductor layers 410 and 420. As a result, facing the direction in and out of the plane, newly formed sidewalls of the fin structure 401 are vertically aligned with sidewalls of the gate spacer.

Next, respective end portions of each of the semiconductor layers 410 are removed. Concurrently with the removal of the end portions of the semiconductor layers 410, respective end portions of the remaining blanket layer/hardmask layer (if any) may be removed. For example, such end portions of the remaining blanket layer/hardmask layer include: the end portions of the remaining blanket layer 602 as shown in FIG. 13B; the end portions of the remaining blanket layer 702 and the hardmask layer 430 as shown in FIG. 14B; the end portions of the remaining blanket layer 702 as shown in FIG. 15B; and the end portions of the remaining blanket layer 702 as shown in FIG. 16B. The end portions of the semiconductor layers 410 and the end portions of the remaining blanket layer/hardmask layer (if any) can be removed (e.g., etched) using a "pull-back" process to pull them back by a pull-back distance.

In an example, the semiconductor layers 420 include Si and the semiconductor layers 410 include SiGe; and no blanket layer remains (e.g., FIGS. 12A-B). The pull-back process may include a hydrogen chloride (HCl) gas isotropic etch process, which etches SiGe without attacking Si. As such, the Si layers 420 may remain intact during this process. Consequently, a pair of recesses can be formed on the ends of each of the semiconductor layers 410. In another example, the semiconductor layers 420 include Si, the semiconductor layers 410, the blanket layer 602/702, and the hardmask layer 430 include SiGe; and the blanket layer or hardmask layer remains. The pull-back process may include a hydrogen chloride (HCl) gas isotropic etch process, which etches SiGe without attacking Si. As such, the Si layers 420 may remain intact during this process. Consequently, a pair of recesses can be formed on the ends of each of the semiconductor layers 410, and a pair of recessed can be formed on the ends of each of the blanket layer 602/702 and the hardmask layer 430.

In some embodiments, as the distance between the top surface of the topmost channel layer 420 and the bottom surface of the gate spacer 1204/1304/1404/1504/1604 (e.g., $CD_2$) is controlled to be zero (e.g., FIGS. 12B, 15B and 16B) or about the same (with a ratio ranging between 0.7 and 1.3) as the spacing between the neighboring channel layers 420 (e.g., FIGS. 13B and 14B), those recesses can be isotropically etched with a uniform pull-back distance. Alternatively stated, the recesses may share a uniform lateral etching amount. As such, the above-mentioned issues that frequently occur in existing GAA FET devices can be avoided, which allows the dimensions of an active gate structure to be accurately defined and controlled. Such a recess will be discussed in further detail with respect to the cross-sectional views of FIGS. 17A-B, 18A-B, 19A-B, and 20A-B, respectively.

Referring first to FIGS. 17A-B, which depicts cross-sectional views of the GAA FET device 300 including a number of recesses 1702, at one of the various stages of fabrication. The cross-sectional view of FIG. 17A is cut in a direction along the lengthwise direction of one or more channel layers of the GAA FET device 300 (e.g., cross-section C-C indicated in FIG. 1); and the cross-sectional view of FIG. 17B is cut in a direction that is parallel to the lengthwise direction of the one or more channel layers but is not across the channel layers (e.g., cross-section D-D indicated in FIG. 1). It should be appreciated that the recesses 1702 are formed on one end of the semiconductor layers 410, as the cross-sectional views of FIGS. 17A-B depicts one half of the GAA FET device 300 for purposes of clarity.

In some embodiments, the recesses 1702 are formed based on the workpiece shown in FIGS. 12A-B, in which no blanket layer remains. As such, no recess can be observed in the cross-sectional view of FIG. 17B, in which the gate spacer 1204 extends from the top surface of the STI 502 to the top surface of the dummy gate structure 1202. Referring again to FIG. 17A, each of the recesses 1702 is formed by etching (or pulling) back the end portions of the semiconductor (sacrificial) layers 410, while leaving the gate spacer 1204 and the semiconductor (channel) layers 420 substantially intact. As the gate spacer 1204 contacts the topmost channel layer 420, the recess 1702 can have a uniform pull-back distance. In some embodiments, the pull-back distance of the recess 1702 may be characterized with a critical dimension (along the cross-section C-C in FIG. 1), $CD_5$, as shown in FIG. 17A.

Referring to FIGS. 18A-B, which depicts cross-sectional views of the GAA FET device 300 including a number of recesses 1802, at one of the various stages of fabrication. The cross-sectional view of FIG. 18A is cut in a direction along the lengthwise direction of one or more channel layers of the GAA FET device 300 (e.g., cross-section C-C indicated in FIG. 1); and the cross-sectional view of FIG. 18B is cut in a direction that is parallel to the lengthwise direction of the one or more channel layers but is not across the channel layers (e.g., cross-section D-D indicated in FIG. 1). It should be appreciated that the recesses 1802 are formed on one end of the semiconductor layers 410, as the cross-sectional views of FIGS. 18A-B depict one half of the GAA FET device 300 for purposes of clarity.

In some embodiments, the recesses 1802 are formed based on the workpiece shown in FIGS. 13A-B, in which a portion of the blanket layer 602 remains, or the workpiece shown in FIGS. 14A-B, in which the etched hardmask layer 430 and a portion of the blanket layer 702 remain. As such, while etching (pulling) back the sacrificial layers 410, such a remaining portion of the blanket layer 602/702 and a remaining portion of the hardmask layer 430 may be concurrently removed, as shown in dotted lines of FIGS. 18A-B. The gate spacer 1304/1404 and the semiconductor (channel) layers 420 may remain substantially intact. Further, as the thickness of the remaining portion of the blanket layer 602/hardmask layer 430 ($CD_2$) is controlled to be equal to the spacing between the neighboring channel layers 420, which is the thickness of the sacrificial layer 410 ($CD_1$), the recess 1802 can have a uniform pull-back distance. In some embodiments, the pull-back distance of the recess 1802 may be characterized with the critical dimension (along the cross-section C-C in FIG. 1), $CD_5$, as shown in FIG. 18A, and with the critical dimension (along the cross-section D-D in FIG. 1), $CD_6$, as shown in FIG. 18B. The critical dimensions $CD_5$ and $CD_6$ may each range between 20 angstroms (Å) and 300 Å.

Figure 19A:
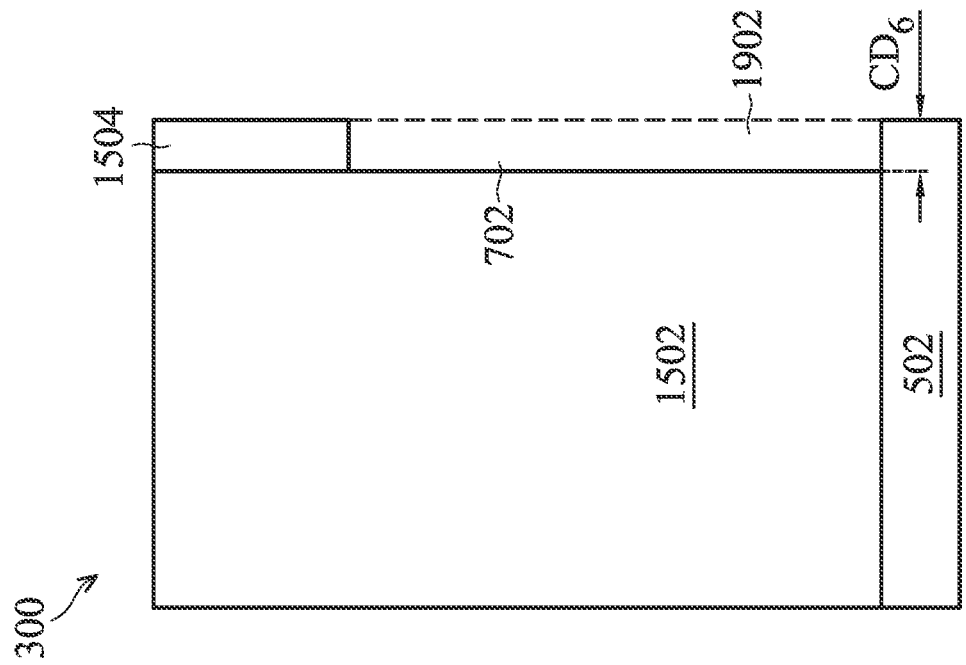
Figure 19B:
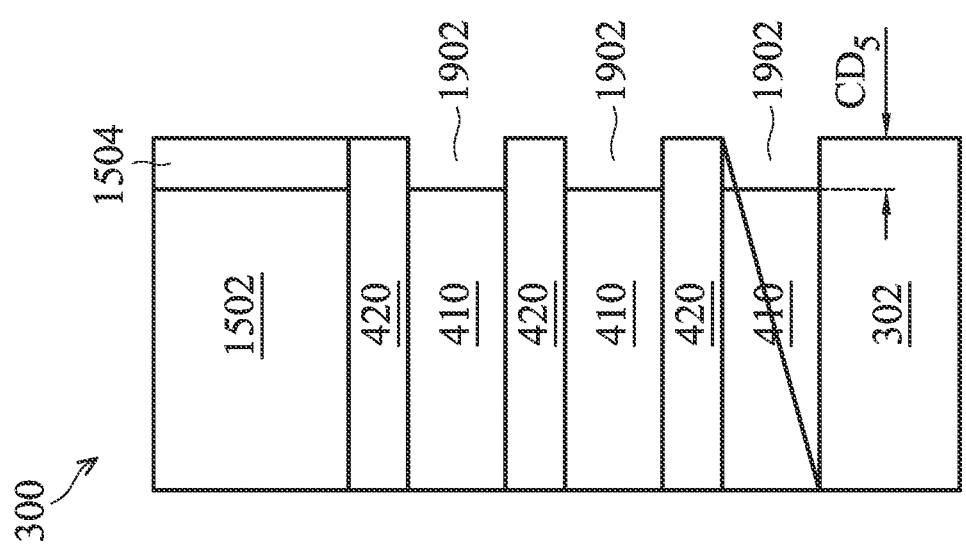

Referring to FIGS. 19A-B, which depicts cross-sectional views of the GAA FET device 300 including a number of recesses 1902, at one of the various stages of fabrication. The cross-sectional view of FIG. 19A is cut in a direction along the lengthwise direction of one or more channel layers of the GAA FET device 300 (e.g., cross-section C-C indicated in FIG. 1); and the cross-sectional view of FIG. 19B is cut in a direction that is parallel to the lengthwise direction of the one or more channel layers but is not across the channel layers (e.g., cross-section D-D indicated in FIG. 1). It should be appreciated that the recesses 1902 are formed on one end of the semiconductor layers 410, as the cross-sectional views of FIGS. 19A-B depict one half of the GAA FET device 300 for purposes of clarity.

In some embodiments, the recesses 1902 are formed based on the workpiece shown in FIGS. 15A-B, in which a portion of the blanket layer 702 remains. As such, while etching (pulling) back the sacrificial layers 410, such a remaining portion of the blanket layer 702 may be concurrently removed, as shown in dotted line of FIG. 19B. Such a remaining portion of the blanket layer 702 may not be observable in the cross-sectional view of FIG. 19A. The gate spacer 1504 and the semiconductor (channel) layers 420 may remain substantially intact. Further, as the gate spacer 1504 contacts the topmost channel layer 420, the recess 1902 can have a uniform pull-back distance. In some embodiments, the pull-back distance of the recess 1902 may be characterized with the critical dimension (along the cross-section C-C in FIG. 1), $CD_5$, as shown in FIG. 19A, and with the critical dimension (along the cross-section D-D in FIG. 1), $CD_6$, as shown in FIG. 19B. The critical dimensions $CD_5$ and $CD_6$ may each range between 20 angstroms (Å) and 300 Å.

Referring to FIGS. 20A-B, which depicts cross-sectional views of the GAA FET device 300 including a number of recesses 2002, at one of the various stages of fabrication. The cross-sectional view of FIG. 20A is cut in a direction along the lengthwise direction of one or more channel layers of the GAA FET device 300 (e.g., cross-section C-C indicated in FIG. 1); and the cross-sectional view of FIG. 20B is cut in a direction that is parallel to the lengthwise direction of the one or more channel layers but is not across the channel layers (e.g., cross-section D-D indicated in FIG. 1). It should be appreciated that the recesses 2002 are formed on one end of the semiconductor layers 410, as the cross-sectional views of FIGS. 20A-B depict one half of the GAA FET device 300 for purposes of clarity.

In some embodiments, the recesses 2002 are formed based on the workpiece shown in FIGS. 16A-B, in which a portion of the blanket layer 702 remains. As such, while etching (pulling) back the sacrificial layers 410, such a remaining portion of the blanket layer 702 may be concurrently removed, as shown in dotted line of FIG. 20B. Such a remaining portion of the blanket layer 702 may not be observable in the cross-sectional view of FIG. 20A. The gate spacer 1604 and the semiconductor (channel) layers 420 may remain substantially intact. Further, as the gate spacer 1604 contacts the topmost channel layer 420, the recess 2002 can have a uniform pull-back distance. In some embodiments, the pull-back distance of the recess 2002 may be characterized with the critical dimension (along the cross-section C-C in FIG. 1), $CD_5$, as shown in FIG. 20A, and with the critical dimension (along the cross-section D-D in FIG. 1), $CD_6$, as shown in FIG. 20B. The critical dimensions $CD_5$ and $CD_6$ may each range between 20 angstroms (Å) and 300 Å. It should be noted that the above-described critical dimension $CD_4$ may remain, as shown in FIG. 20B.

Upon forming the recesses 1702/1802/1902/2002, a number of inner spacers can be respectively formed by filling up the recesses. For example, a number of inner spacers can be formed along the respective etched ends of each of the semiconductor layers 410, along the etched ends of the remaining blanket layer 602/702, and/or along the etched ends of the remaining hardmask layer 430. As such, the inner spacer can inherit the dimensions and profiles of the recesses. Such an inner spacer will be discussed in further detail with respect to some of the following cross-sectional views.

The inner spacer can be formed conformally by chemical vapor deposition (CVD), or by monolayer doping (MLD) of nitride followed by spacer RIE. The inner spacer can be deposited using, e.g., a conformal deposition process and one or more subsequent isotropic and/or anisotropic etching-back processes to remove excess spacer material on the sidewalls of the fin structure 401 and on a surface of the semiconductor substrate 302. The inner spacer can be formed of silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacers of transistors.

Next, source/drain structures are formed on the sides of the fin structure 401 (with the inner spacer disposed therebetween) and an ILD overlaying the source/drain structures is formed. Upon forming the ILD, the dummy gate structure 1202/1302/1402/1502/1602 and the sacrificial layers 410 may be removed. In accordance with various embodiments, these structures/features can be (e.g., concurrently) removed by applying a selective etch (e.g., a hydrochloric acid (HCl)), while leaving the channel layers 420 substantially intact. After the removal of the dummy gate structures and the sacrificial layers, a gate trench may be formed to expose a full circumference of each of the channel layers 410. Next, an active gate structure is formed to wrap around each of the channel layers 420. Such an active gate structure will be discussed in further detail with respect to some of the following cross-sectional views.

Figure 21A:
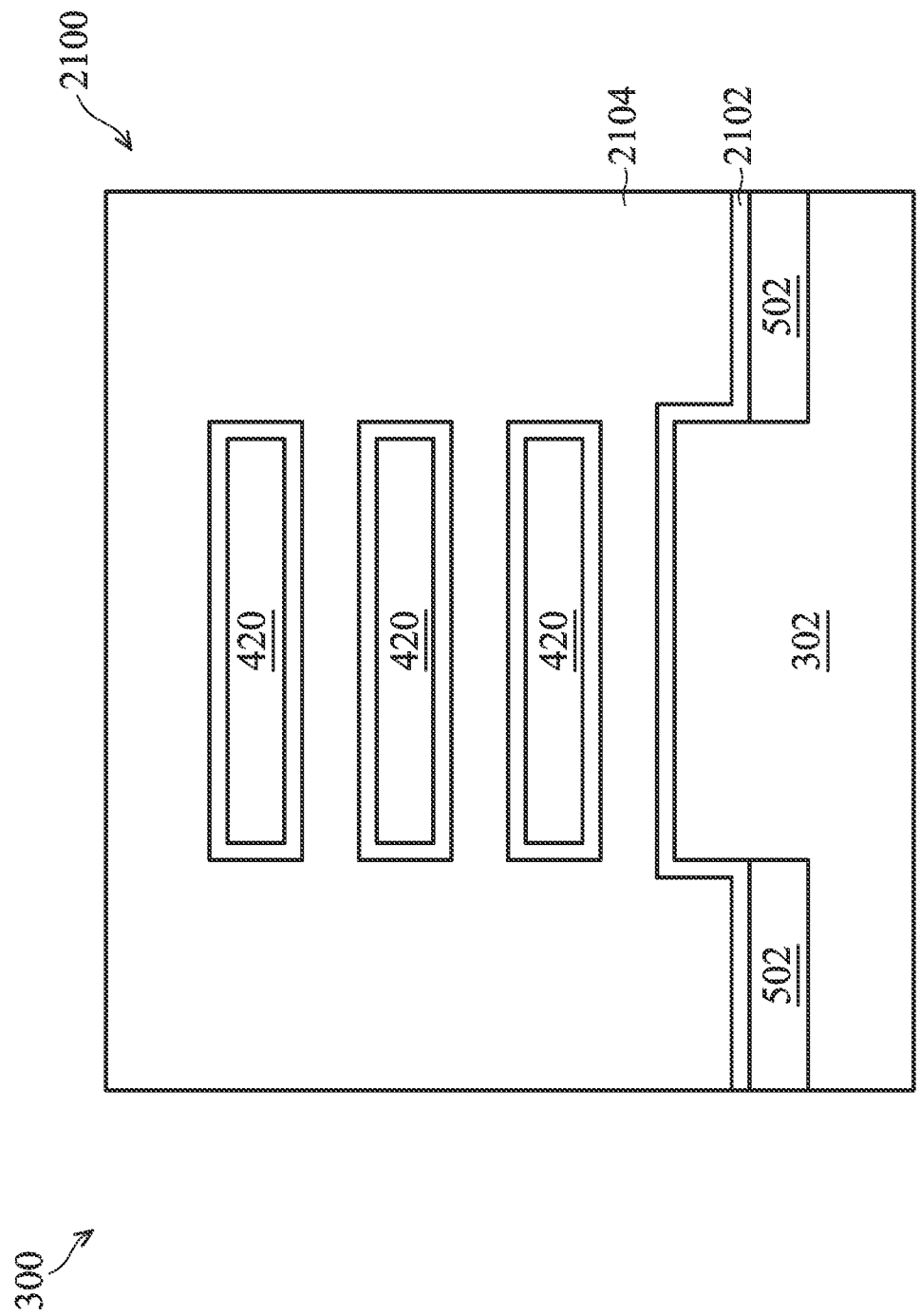
Figure 21B:
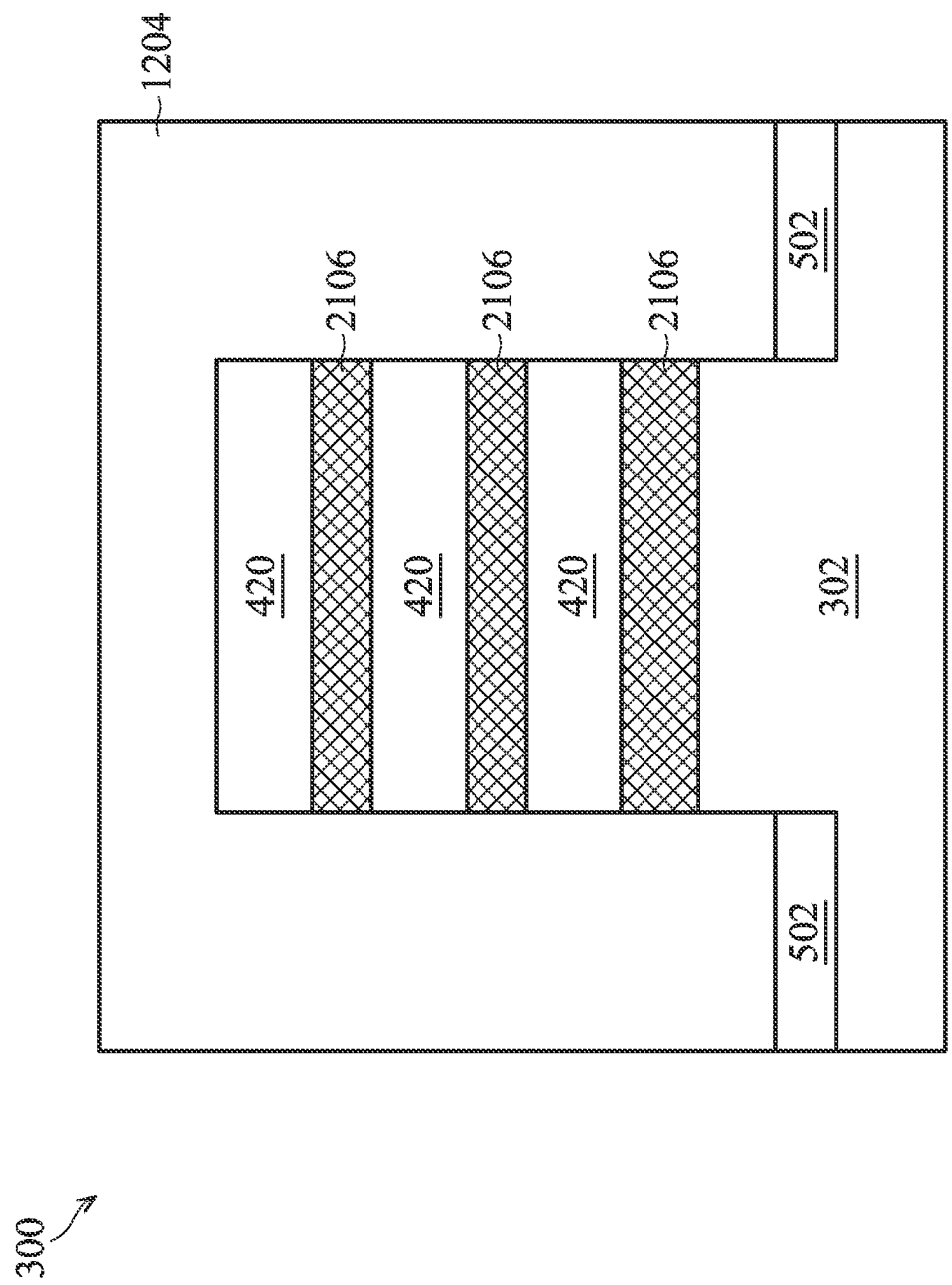

Corresponding to operation 218, FIGS. 21A, 21B, 21C, and 21D are cross-sectional views of the GAA FET device 300 including an active gate structure 2100 and a number of inner spacers 2106, at one or more of the various stages of fabrication. The cross-sectional view of FIG. 21A is cut in a direction along the lengthwise direction of an active/dummy gate structure of the GAA FET device 300 (e.g., cross-section A-A indicated in FIG. 1); the cross-sectional view of FIG. 21B is cut in a direction that is parallel to the lengthwise direction of an active/dummy gate structure of the GAA FET device 300 and across a gate/inner spacer (e.g., cross-section B-B indicated in FIG. 1); the cross-sectional view of FIG. 21C is cut in a direction along the lengthwise direction of one or more channel layers of the GAA FET device 300 (e.g., cross-section C-C indicated in FIG. 1); and the cross-sectional view of FIG. 21D is cut in a direction that is parallel to the lengthwise direction of one or more channel layers of the GAA FET device 300 but is not across the channel layers (e.g., cross-section D-D indicated in FIG. 1).

The active gate structure 2100 and the inner spacer 2106 may be formed based on the workpiece shown in FIGS. 12A-B and the following FIGS. 17A-B. The active gate structure 2100 includes a gate dielectric 2102 and a gate metal 2104, in some embodiments. The gate dielectric 2102 can wrap around each of the channel layers 420. The gate metal 2104 can wrap around each of the channel layers 420, with the gate dielectric 2104 disposed therebetween. As further illustrated in FIGS. 21C-D, a portion of the bottom surface of the gate spacer 1204 is in contact with the top surface of the topmost channel layer 420, while another portion of the bottom surface is in contact with the top surface of the STI 502. In some embodiments, the inner spacer 2106 may inherit the critical dimensions $CD_1$ and $CD_5$, as shown in FIG. 21C. As further illustrated in FIG. 21C, on one end of the channel layers 420, the GAA FET device 300 includes a source/drain structure 2110, and an ILD 2120 formed above the source/drain structure 2110.

Figure 22A:
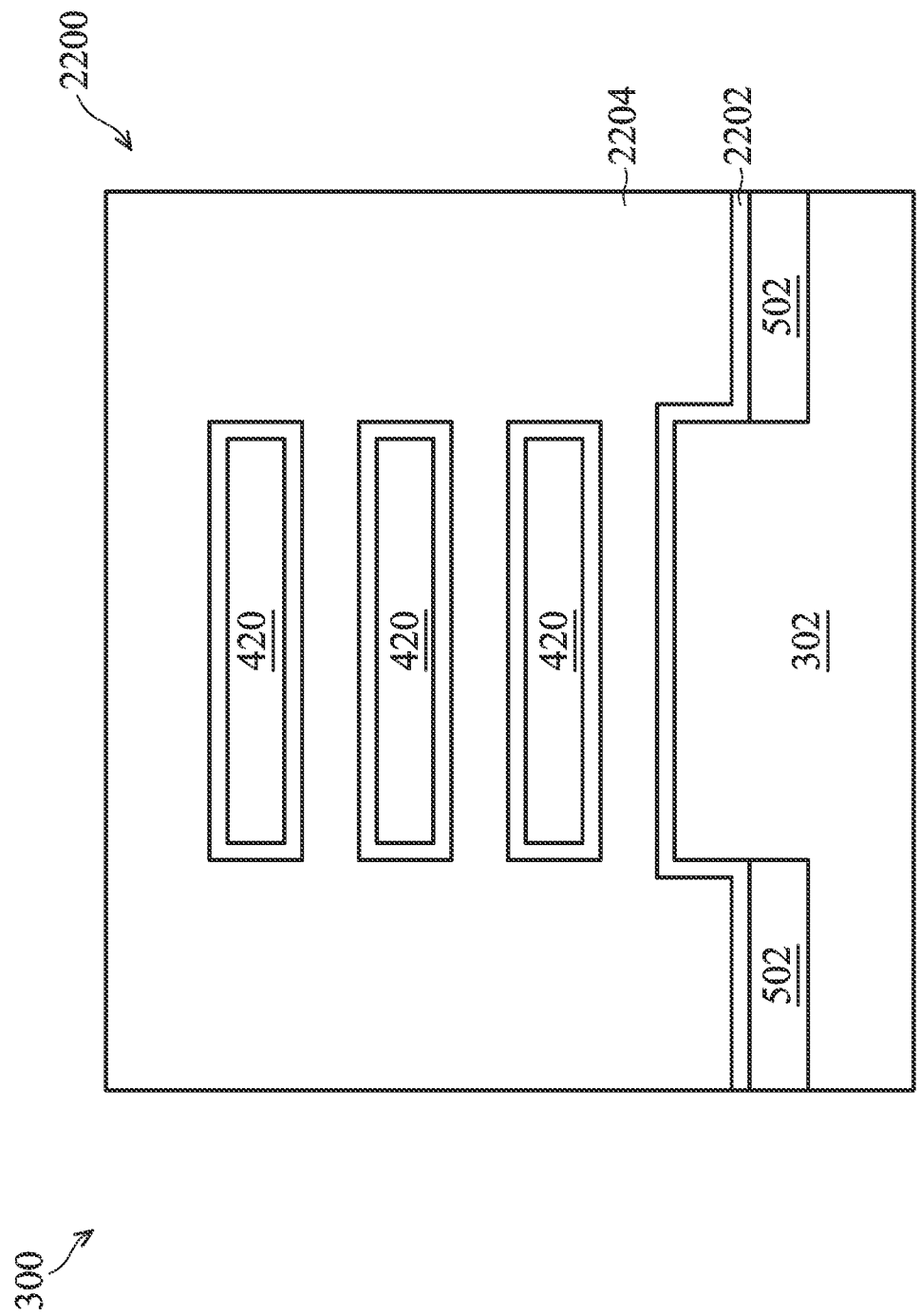
Figure 22B:
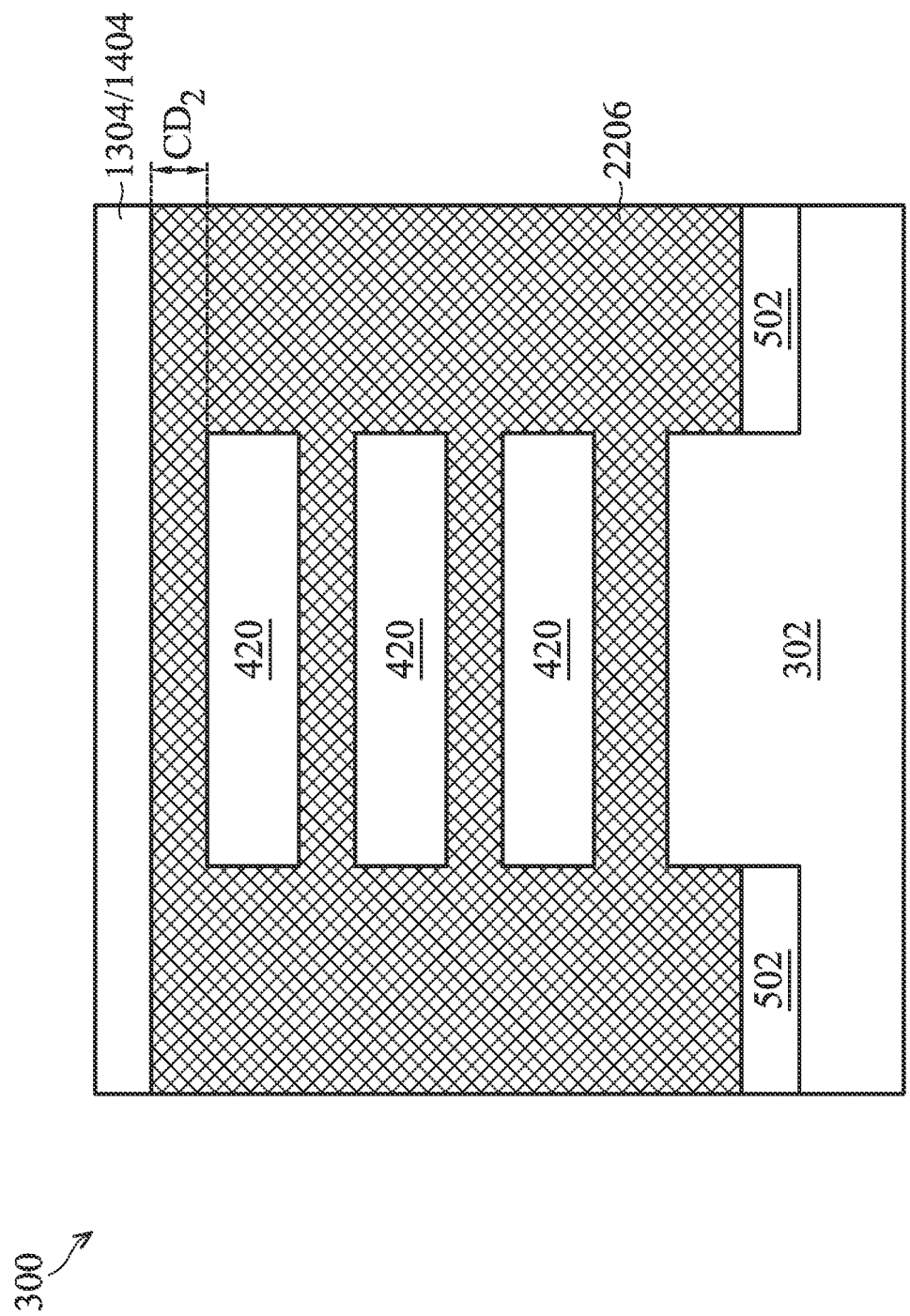
Figures 22C, 22D:
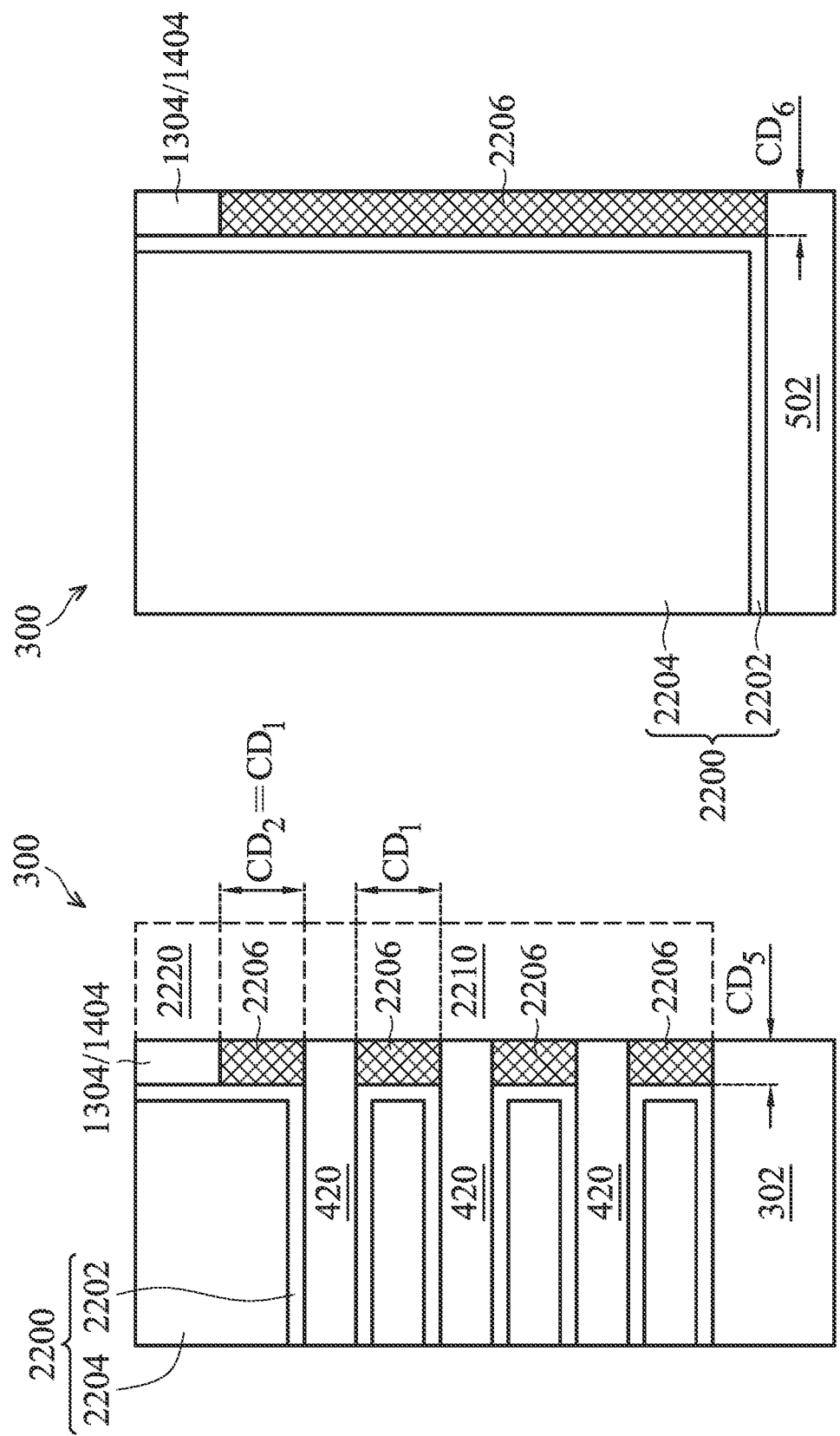

Also corresponding to operation 218, FIGS. 22A, 22B, 22C, and 22D are cross-sectional views of the GAA FET device 300 including an active gate structure 2200 and an inner spacer 2206, at one or more of the various stages of fabrication. The cross-sectional view of FIG. 22A is cut in a direction along the lengthwise direction of an active/dummy gate structure of the GAA FET device 300 (e.g., cross-section A-A indicated in FIG. 1); the cross-sectional view of FIG. 22B is cut in a direction that is parallel to the lengthwise direction of an active/dummy gate structure of the GAA FET device 300 and across a gate/inner spacer (e.g., cross-section B-B indicated in FIG. 1); the cross-sectional view of FIG. 22C is cut in a direction along the lengthwise direction of one or more channel layers of the GAA FET device 300 (e.g., cross-section C-C indicated in FIG. 1); and the cross-sectional view of FIG. 22D is cut in a direction that is parallel to the lengthwise direction of one or more channel layers of the GAA FET device 300 but is not across the channel layers (e.g., cross-section D-D indicated in FIG. 1).

The active gate structure 2200 and the inner spacer 2206 may be formed based on the workpiece shown in FIGS. 13A-B/14A-B and the following FIGS. 18A-B. Similarly, the active gate structure 2200 includes a gate dielectric 2202 and a gate metal 2204, in some embodiments. The gate dielectric 2202 can wrap around each of the channel layers 420. The gate metal 2204 can wrap around each of the channel layers 420, with the gate dielectric 2204 disposed therebetween. In some embodiments, the inner spacer 2206 may inherit the critical dimensions $CD_1$, $CD_2$, $CD_5$, and $CD_6$, as shown in FIGS. 22B-D, respectively. As further illustrated in FIG. 22C, on one end of the channel layers 420, the GAA FET device 300 includes a source/drain structure 2210, and an ILD 2220 formed above the source/drain structure 2210.

Figure 23A:
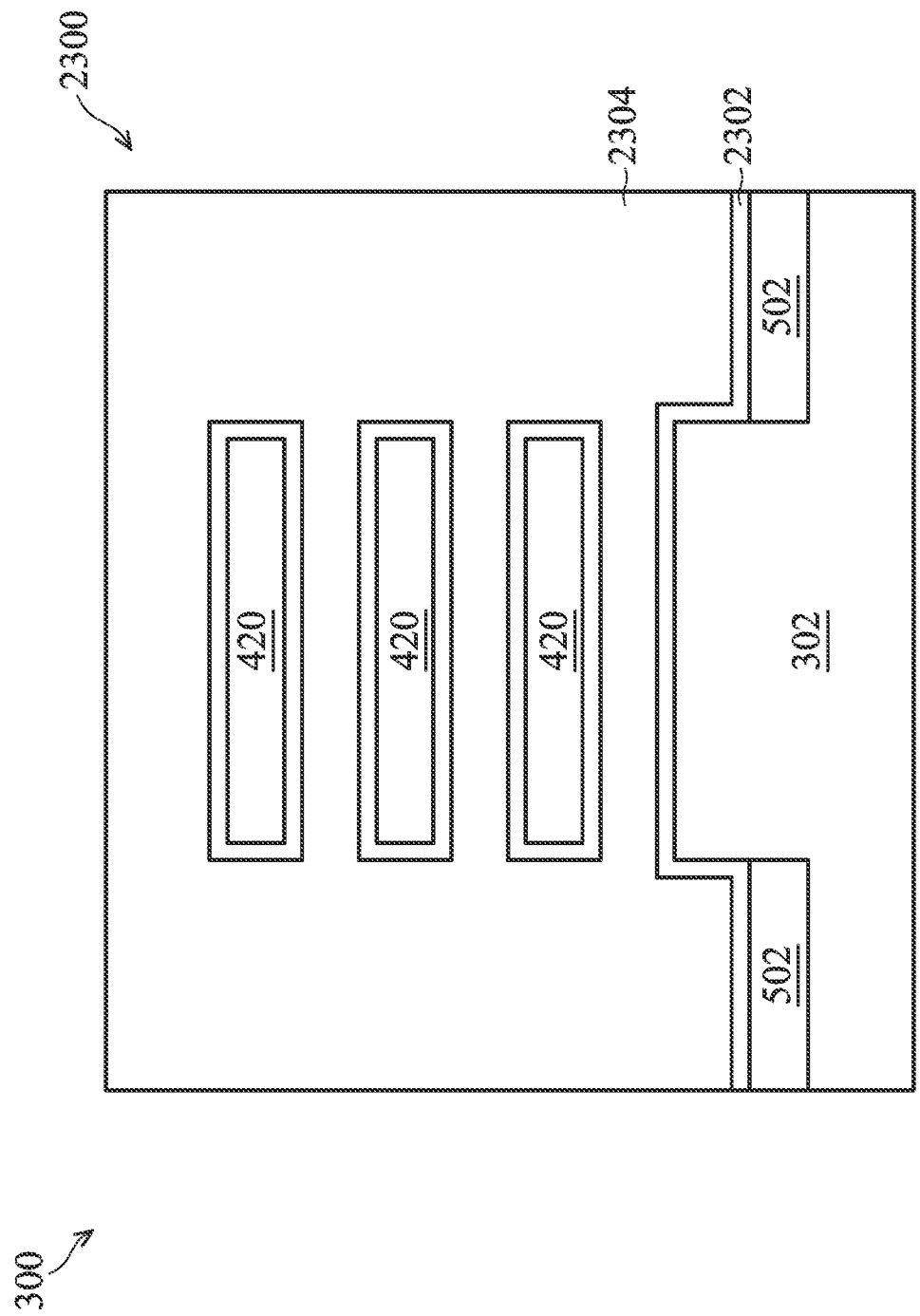
Figure 23B:
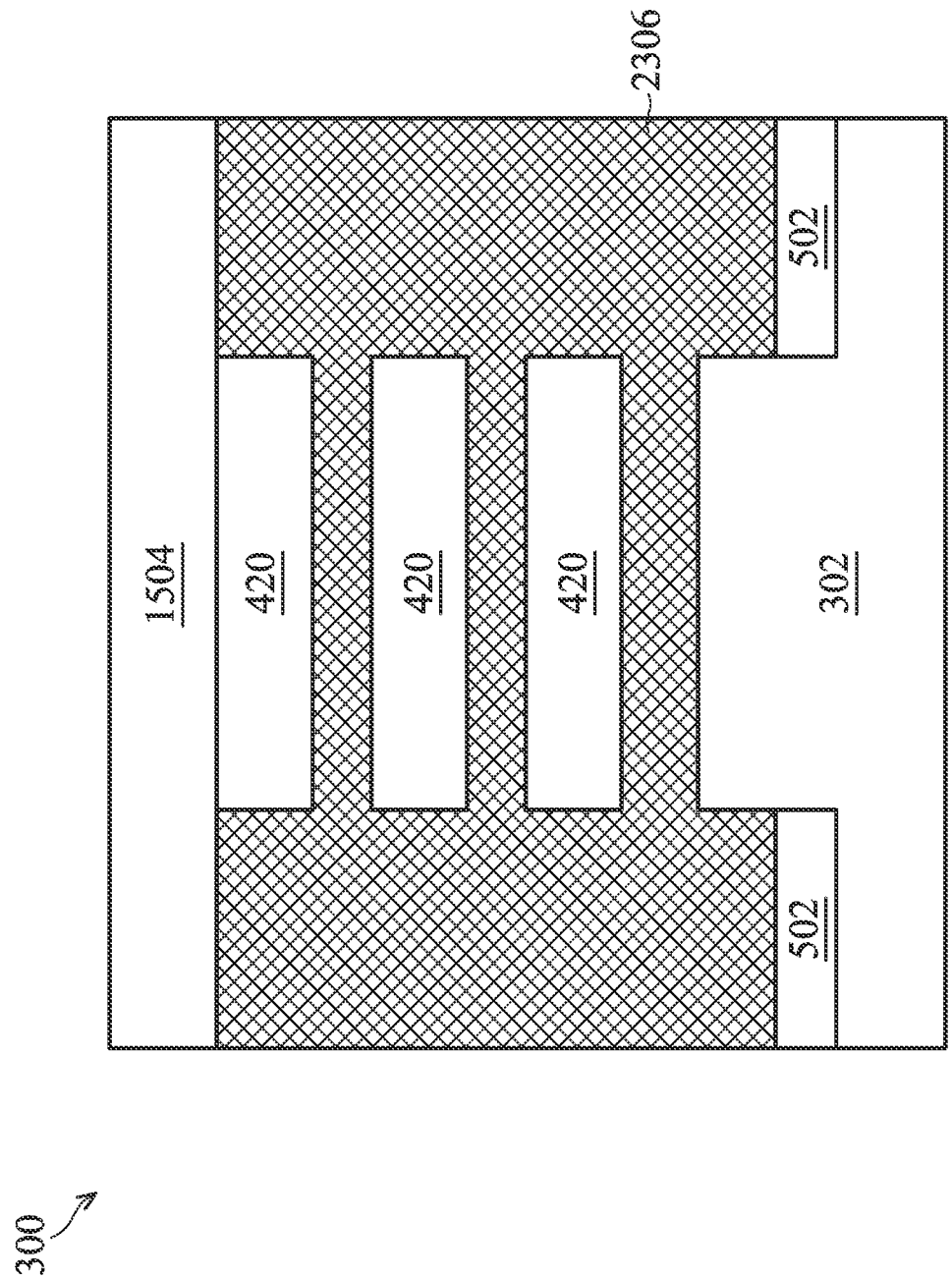

Also corresponding to operation 218, FIGS. 23A, 23B, 23C, and 23D are cross-sectional views of the GAA FET device 300 including an active gate structure 2300 and an inner spacer 2306, at one or more of the various stages of fabrication. The cross-sectional view of FIG. 23A is cut in a direction along the lengthwise direction of an active/dummy gate structure of the GAA FET device 300 (e.g., cross-section A-A indicated in FIG. 1); the cross-sectional view of FIG. 23B is cut in a direction that is parallel to the lengthwise direction of an active/dummy gate structure of the GAA FET device 300 and across a gate/inner spacer (e.g., cross-section B-B indicated in FIG. 1); the cross-sectional view of FIG. 23C is cut in a direction along the lengthwise direction of one or more channel layers of the GAA FET device 300 (e.g., cross-section C-C indicated in FIG. 1); and the cross-sectional view of FIG. 23D is cut in a direction that is parallel to the lengthwise direction of one or more channel layers of the GAA FET device 300 but is not across the channel layers (e.g., cross-section D-D indicated in FIG. 1).

The active gate structure 2300 and the inner spacer 2306 may be formed based on the workpiece shown in FIGS. 15A-B and the following FIGS. 19A-B. Similarly, the active gate structure 2300 includes a gate dielectric 2302 and a gate metal 2304, in some embodiments. The gate dielectric 2302 can wrap around each of the channel layers 420. The gate metal 2304 can wrap around each of the channel layers 420, with the gate dielectric 2304 disposed therebetween. In some embodiments, the inner spacer 2306 may inherit the critical dimensions $CD_1$, $CD_5$ and $CD_6$, as shown in FIGS. 23C-D, respectively. As further illustrated in FIG. 23C, on one end of the channel layers 420, the GAA FET device 300 includes a source/drain structure 2310, and an ILD 2320 formed above the source/drain structure 2310.

Figure 24A:
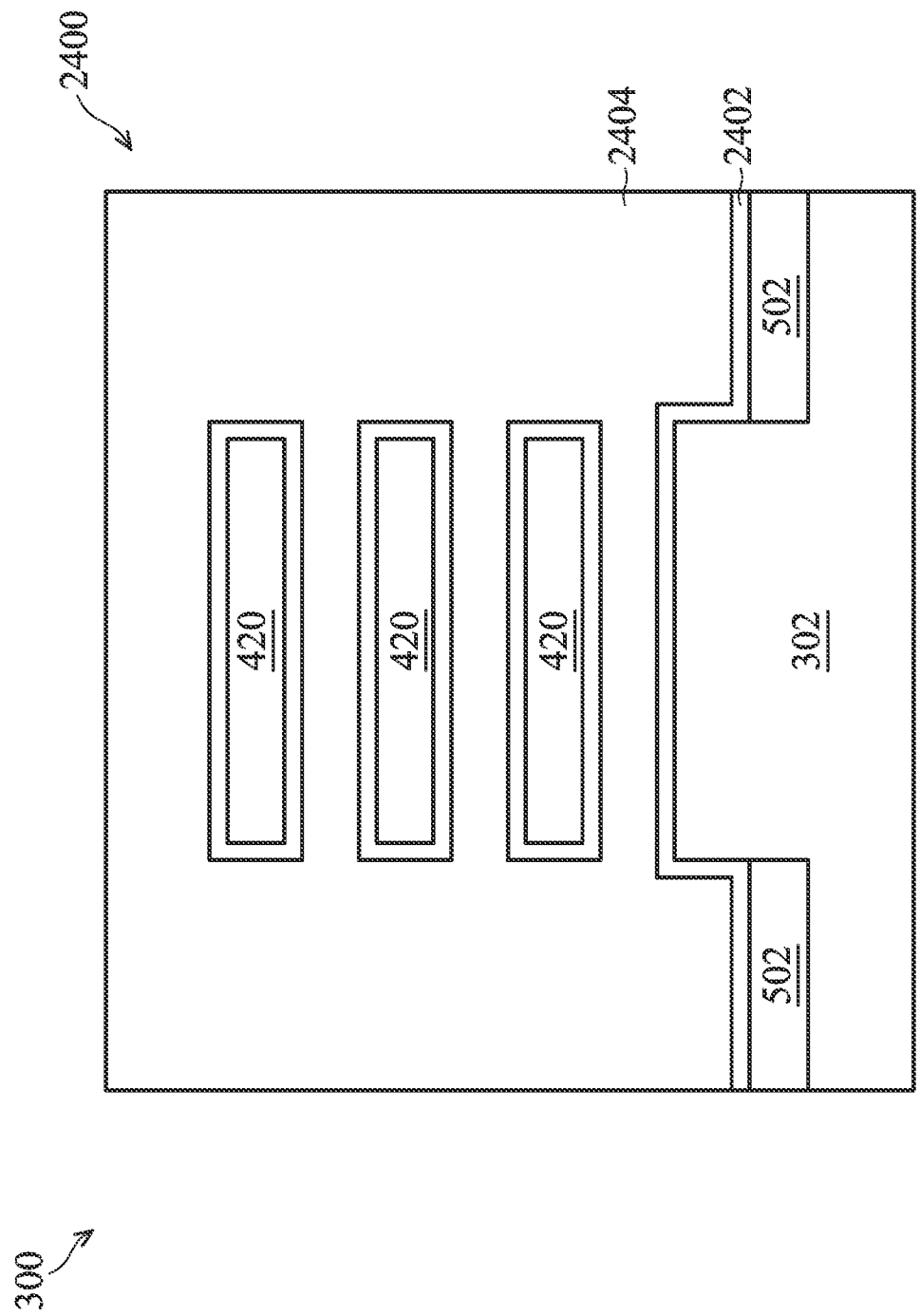
Figure 24B:
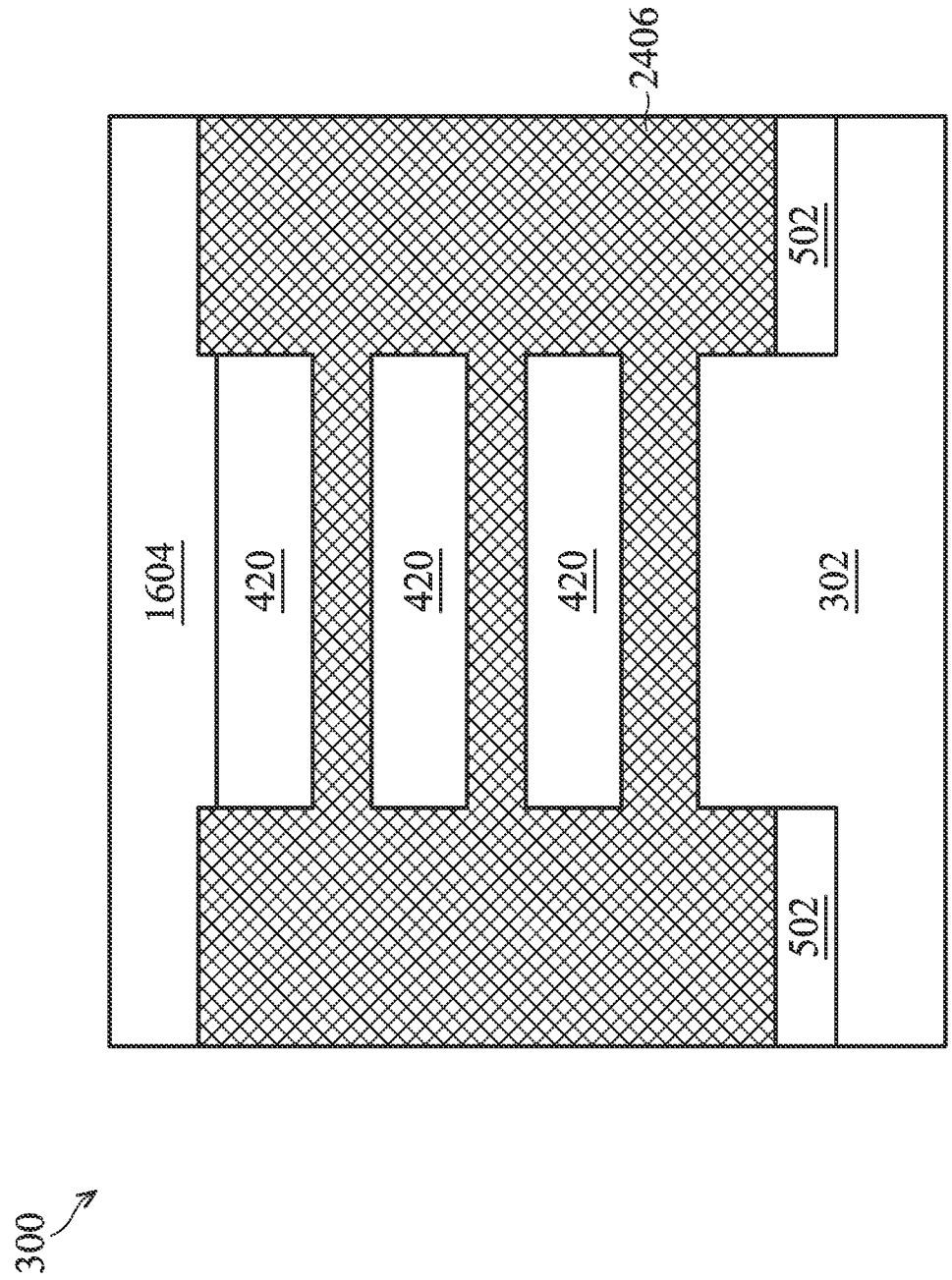

Also corresponding to operation 218, FIGS. 24A, 24B, 24C, and 24D are cross-sectional views of the GAA FET device 300 including an active gate structure 2400 and an inner spacer 2406, at one or more of the various stages of fabrication. The cross-sectional view of FIG. 24A is cut in a direction along the lengthwise direction of an active/dummy gate structure of the GAA FET device 300 (e.g., cross-section A-A indicated in FIG. 1); the cross-sectional view of FIG. 24B is cut in a direction that is parallel to the lengthwise direction of an active/dummy gate structure of the GAA FET device 300 and across a gate/inner spacer (e.g., cross-section B-B indicated in FIG. 1); the cross-sectional view of FIG. 24C is cut in a direction along the lengthwise direction of one or more channel layers of the GAA FET device 300 (e.g., cross-section C-C indicated in FIG. 1); and the cross-sectional view of FIG. 24D is cut in a direction that is parallel to the lengthwise direction of one or more channel layers of the GAA FET device 300 but is not across the channel layers (e.g., cross-section D-D indicated in FIG. 1).

The active gate structure 2400 and the inner spacer 2406 may be formed based on the workpiece shown in FIGS. 16A-B and the following FIGS. 20A-B. Similarly, the active gate structure 2400 includes a gate dielectric 2402 and a gate metal 2404, in some embodiments. The gate dielectric 2402 can wrap around each of the channel layers 420. The gate metal 2404 can wrap around each of the channel layers 420, with the gate dielectric 2404 disposed therebetween. In some embodiments, the inner spacer 2406 may inherit the critical dimensions $CD_1$, $CD_5$ and $CD_6$, as shown in FIGS. 24C-D, respectively. As further illustrated in FIG. 24C, on one end of the channel layers 420, the GAA FET device 300 includes a source/drain structure 2410, and an ILD 2420 formed above the source/drain structure 2410.

The gate dielectric layer 2102/2202/2302/2402 includes silicon oxide, silicon nitride, or multilayers thereof. In example embodiments, the gate dielectric layer includes a high-k dielectric material, and in these embodiments, the gate dielectric layer may have a k value greater than about 7.0, and may include a metal oxide or a silicate of Hf, Al, Zr, La, Mg, Ba, Ti, Pb, or combinations thereof. The formation methods of gate dielectric layer may include molecular beam deposition (MBD), atomic layer deposition (ALD), PECVD, and the like. A thickness of the gate dielectric layer may be between about 8 Å and about 20 Å, as an example.

The metal gate layer 2104/2204/2304/2404 is formed over the corresponding gate dielectric layer 2102/2202/2302/2402. The metal gate layer may be a P-type work function layer, an N-type work function layer, multi-layers thereof, or combinations thereof, in some embodiments. Accordingly, the metal gate layer is sometimes referred to as a work function layer. For example, the metal gate layer may be an N-type work function layer. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof.

Figures 25A, 25B:
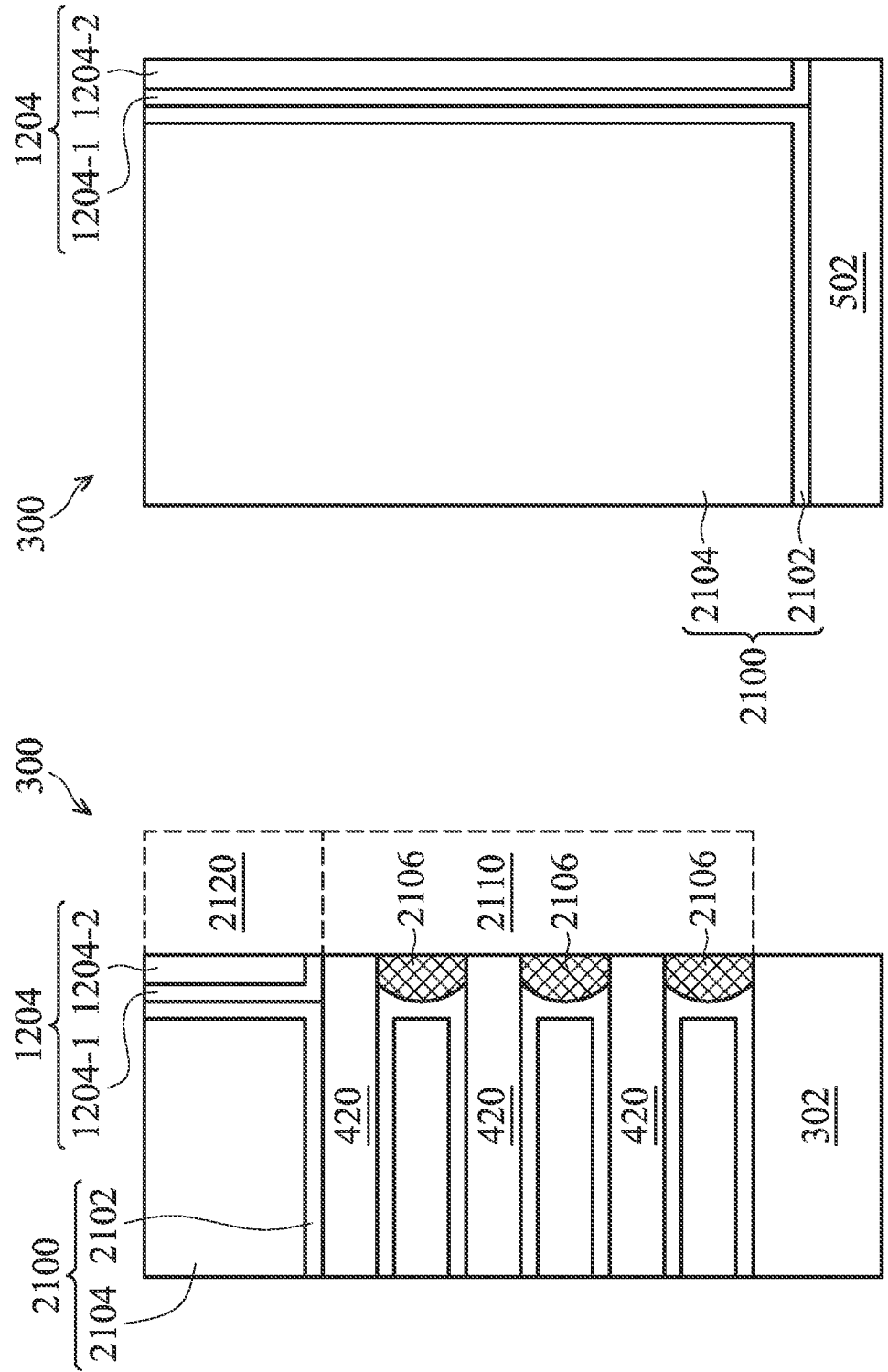

FIGS. 25A-B and 26A-B illustrate cross-sectional views of the GAA FET device 300 that include alternative embodiments of the inner spacer 2106 and the gate spacer 1204, respectively. The cross-sectional views of FIGS. 25A and 26A are each cut in a direction along the lengthwise direction of one or more channel layers of the GAA FET device 300 (e.g., cross-section C-C indicated in FIG. 1); and the cross-sectional views of FIGS. 25B and 26B are each cut in a direction that is parallel to the lengthwise direction of one or more channel layers of the GAA FET device 300 but is not across the channel layers (e.g., cross-section D-D indicated in FIG. 1).

As illustrated in FIGS. 25A-B and 26A-B, the gate spacer 1204 includes a stack of multiple layers, e.g., 1204-1 and 1204-2, each of which can include one of the above-described materials of the gate spacer 1204. Although two layers are shown, it should be understood that the stack of gate spacer 1204 can include any number of layers while remaining within the scope of the present disclosure. In some embodiments, at least one of the multiple layers (e.g., the bottommost one) can present an L-shaped profile, as illustrated in FIGS. 25A-B and 26A-B.

Specifically in FIG. 25A, the inner spacer 2106 may present a curvature-based sidewall facing toward the active gate structure 2100 and a nearly vertical sidewall facing away from the active gate structure 2100. Such sidewalls can be defined, when forming the recesses 1702. For example, during the formation of the recesses 1702 (FIGS. 17A-B), the curvature-based sidewall can be formed through an isotropic etching process. And, the vertical sidewall can be formed through an anisotropic (e.g., vertical) etching process performed on excess material extending the sidewall of the then fin structure 401 that still included the semiconductor layers 410 and 420. For example, the inner spacer 2106 may have a concave sidewall protruding toward the active gate structure 2100. As such, an angle between the concave sidewall and a top/bottom surface of the channel layer 420 may range between about 20° and about 88°.

Referring then to FIG. 26A, the inner spacer 2106 may present a first curvature-based sidewall facing toward the active gate structure 2100 and a second curvature-based sidewall facing away from the active gate structure 2100. Such sidewalls can be defined, when forming the recesses 1702 (FIGS. 17A-B). For example, during the formation of the recesses 1702, the first curvature-based sidewall can be formed through an isotropic etching process. And, the second curvature-based sidewall can be formed through an isotropic etching process performed on excess material extending the sidewall of the then fin structure 401 that still included the semiconductor layers 410 and 420. For example, the inner spacer 2106 may have a pair of concave sidewalls protruding toward the active gate structure 2100. As such, an angle between each of the concave sidewalls and a top/bottom surface of the channel layer 420 may range between about 20° and about 88°.

FIGS. 27A-B and 28A-B illustrate cross-sectional views of the GAA FET device 300 that include alternative embodiments of the inner spacer 2206 and the gate spacer 1304/1404, respectively. The cross-sectional views of FIGS. 27A and 28A are each cut in a direction along the lengthwise direction of one or more channel layers of the GAA FET device 300 (e.g., cross-section C-C indicated in FIG. 1); and the cross-sectional views of FIGS. 27B and 28B are each cut in a direction that is parallel to the lengthwise direction of one or more channel layers of the GAA FET device 300 but is not across the channel layers (e.g., cross-section D-D indicated in FIG. 1).

As illustrated in FIGS. 27A-B and 28A-B, the gate spacer 1304/1404 includes a stack of multiple layers, e.g., 1304-1 and 1304-2, 1404-1 and 1404-2, each of which can include one of the above-described materials of the gate spacer 1304/1404. Although two layers are shown, it should be understood that the stack of gate spacer 1304/1404 can include any number of layers while remaining within the scope of the present disclosure. In some embodiments, at least one of the multiple layers (e.g., the bottommost one) can present an L-shaped profile, as illustrated in FIGS. 27A-B and 28A-B.

Specifically in FIG. 27A, the inner spacer 2206 may present a curvature-based sidewall facing toward the active gate structure 2200 and a nearly vertical sidewall facing away from the active gate structure 2200. Such sidewalls can be defined, when forming the recesses 1802. For example, during the formation of the recesses 1802 (FIGS. 18A-B), the curvature-based sidewall can be formed through an isotropic etching process. And, the vertical sidewall can be formed through an anisotropic (e.g., vertical) etching process performed on excess material extending the sidewall of the then fin structure 401 that still included the semiconductor layers 410 and 420. For example, the inner spacer 2206 may have a concave sidewall protruding toward the active gate structure 2200. As such, an angle between the concave sidewall and a top/bottom surface of the channel layer 420 may range between about 20° and about 88°.

Referring then to FIG. 28A, the inner spacer 2206 may present a first curvature-based sidewall facing toward the active gate structure 2200 and a second curvature-based sidewall facing away from the active gate structure 2200. Such sidewalls can be defined, when forming the recesses 1802 (FIGS. 18A-B). For example, during the formation of the recesses 1802, the first curvature-based sidewall can be formed through an isotropic etching process. And, the second curvature-based sidewall can be formed through an isotropic etching process performed on excess material extending the sidewall of the then fin structure 401 that still included the semiconductor layers 410 and 420. For example, the inner spacer 2206 may have a pair of concave sidewalls protruding toward the active gate structure 2200. As such, an angle between each of the concave sidewalls and a top/bottom surface of the channel layer 420 may range between about 20° and about 88°.

Figures 29A, 29B:
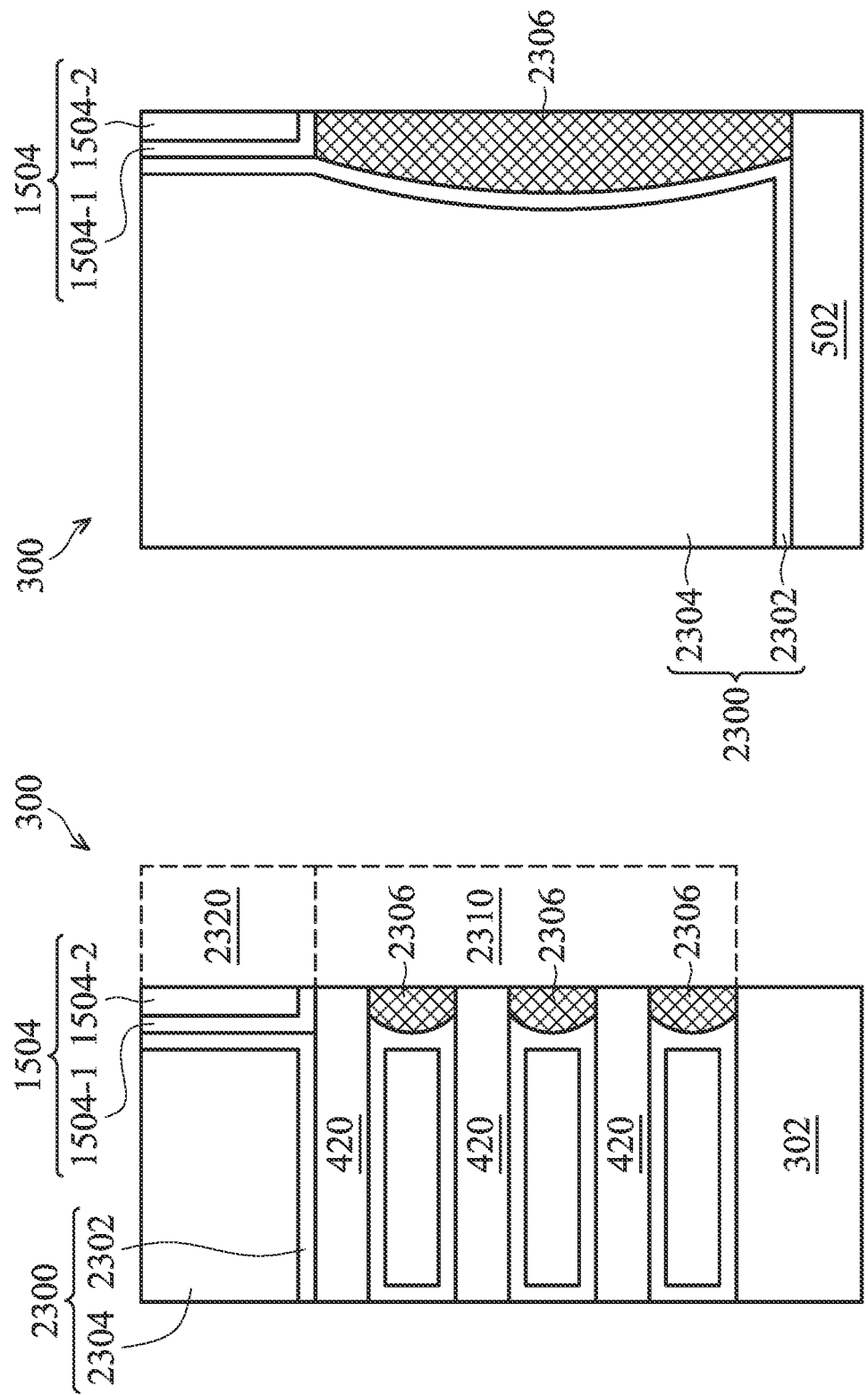
Figures 30A, 30B:
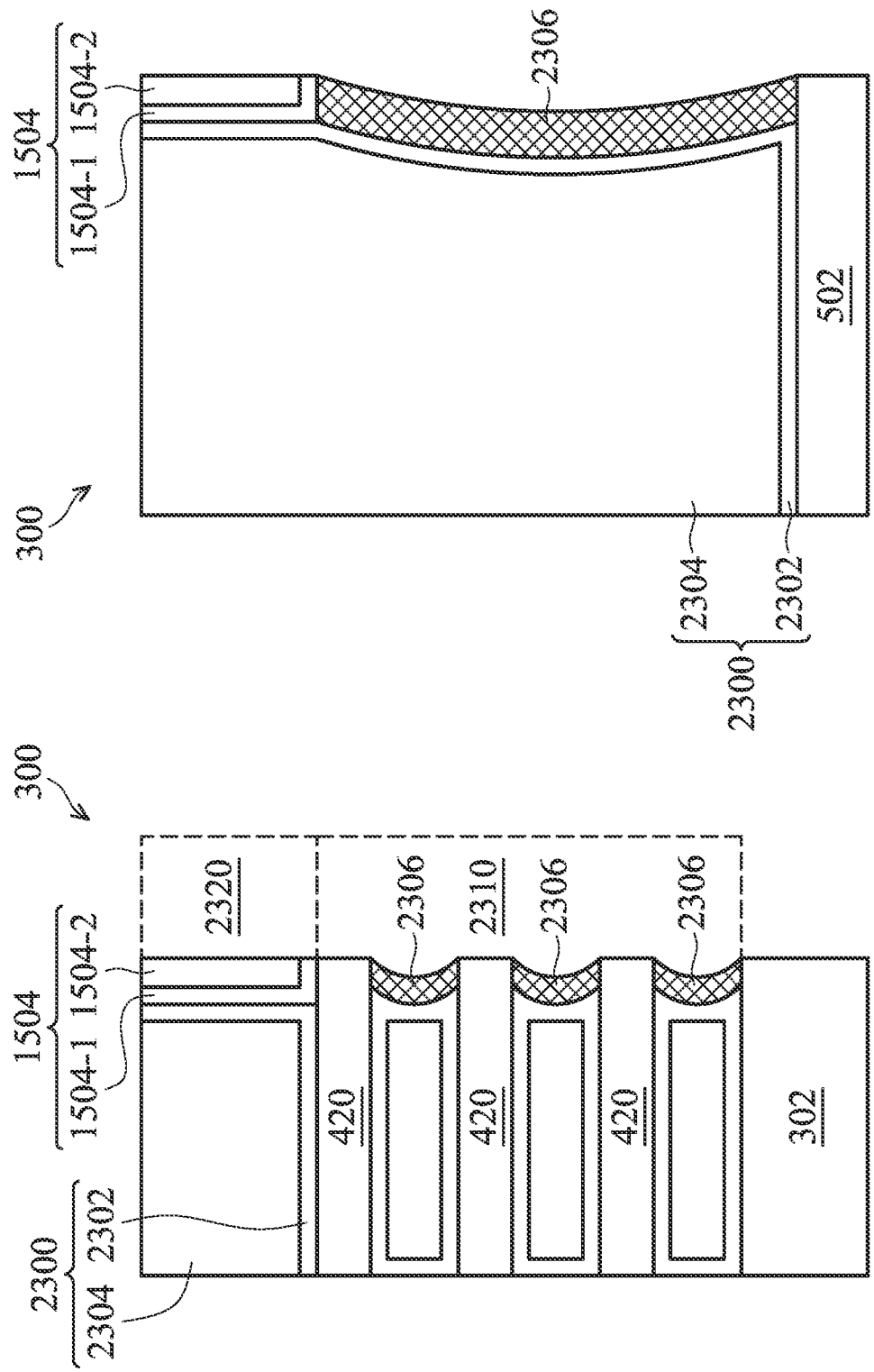

FIGS. 29A-B and 30A-B illustrate cross-sectional views of the GAA FET device 300 that include alternative embodiments of the inner spacer 2306 and the gate spacer 1504, respectively. The cross-sectional views of FIGS. 29A and 30A are each cut in a direction along the lengthwise direction of one or more channel layers of the GAA FET device 300 (e.g., cross-section C-C indicated in FIG. 1); and the cross-sectional views of FIGS. 29B and 30B are each cut in a direction that is parallel to the lengthwise direction of one or more channel layers of the GAA FET device 300 but is not across the channel layers (e.g., cross-section D-D indicated in FIG. 1).

As illustrated in FIGS. 29A-B and 30A-B, the gate spacer 1504 includes a stack of multiple layers, e.g., 1504-1 and 1504-2, each of which can include one of the above-described materials of the gate spacer 1504. Although two layers are shown, it should be understood that the stack of gate spacer 1504 can include any number of layers while remaining within the scope of the present disclosure. In some embodiments, at least one of the multiple layers (e.g., the bottommost one) can present an L-shaped profile, as illustrated in FIGS. 29A-B and 30A-B.

Specifically in FIG. 29A, the inner spacer 2306 may present a curvature-based sidewall facing toward the active gate structure 2300 and a nearly vertical sidewall facing away from the active gate structure 2300. Such sidewalls can be defined, when forming the recesses 1902. For example, during the formation of the recesses 1902 (FIGS. 19A-B), the curvature-based sidewall can be formed through an isotropic etching process. And, the vertical sidewall can be formed through an anisotropic (e.g., vertical) etching process performed on excess material extending the sidewall of the then fin structure 401 that still included the semiconductor layers 410 and 420. For example, the inner spacer 2306 may have a concave sidewall protruding toward the active gate structure 2300. As such, an angle between the concave sidewall and a top/bottom surface of the channel layer 420 may range between about 20° and about 88°.

Referring then to FIG. 30A, the inner spacer 2306 may present a first curvature-based sidewall facing toward the active gate structure 2300 and a second curvature-based sidewall facing away from the active gate structure 2300. Such sidewalls can be defined, when forming the recesses 1902 (FIGS. 19A-B). For example, during the formation of the recesses 1902, the first curvature-based sidewall can be formed through an isotropic etching process. And, the second curvature-based sidewall can be formed through an isotropic etching process performed on excess material extending the sidewall of the then fin structure 401 that still included the semiconductor layers 410 and 420. For example, the inner spacer 2306 may have a pair of concave sidewalls protruding toward the active gate structure 2300. As such, an angle between each of the concave sidewalls and a top/bottom surface of the channel layer 420 may range between about 20° and about 88°.

Figures 32A, 32B:
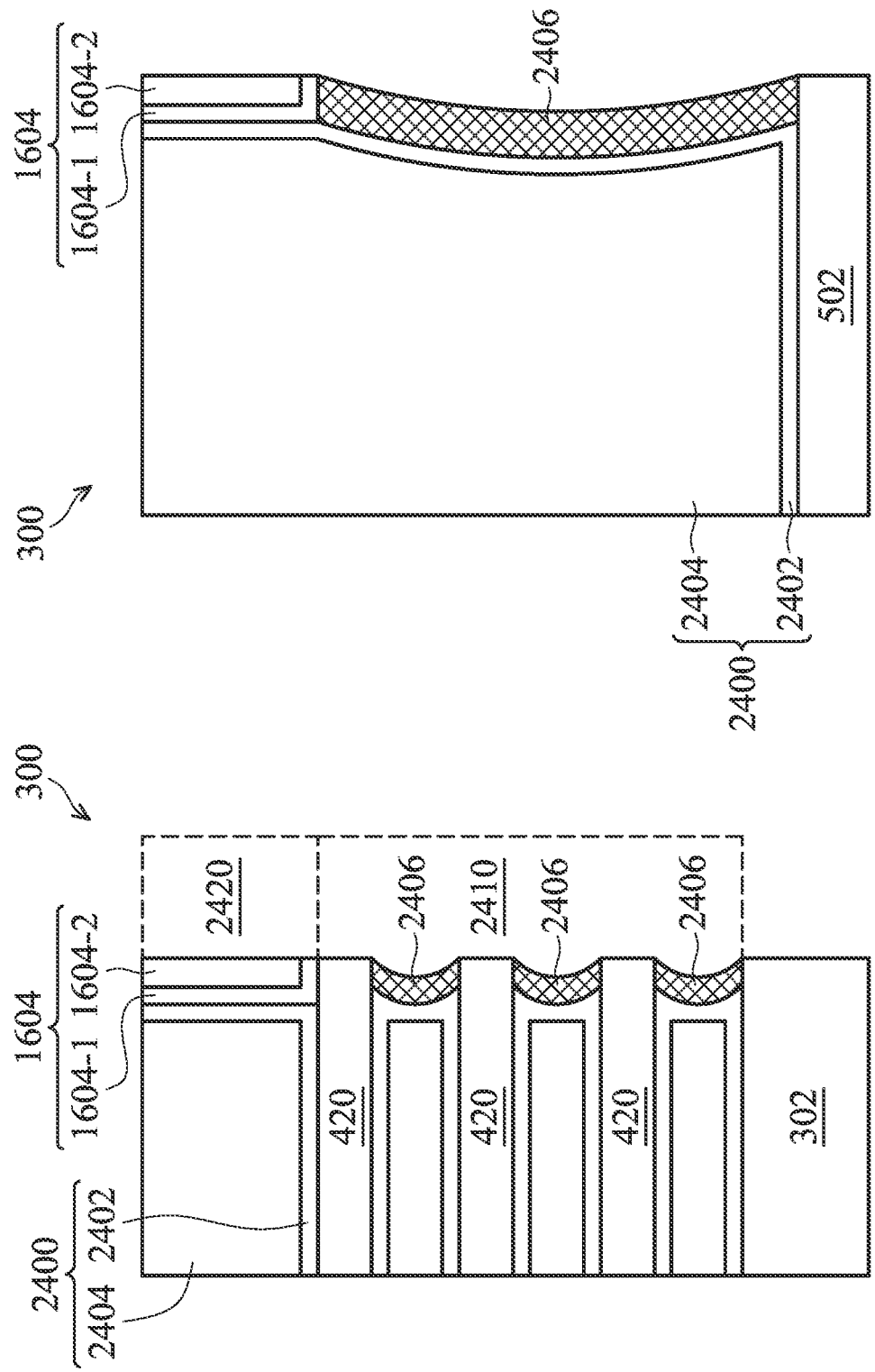

FIGS. 31A-B and 32A-B illustrate cross-sectional views of the GAA FET device 300 that include alternative embodiments of the inner spacer 2406 and the gate spacer 1604, respectively. The cross-sectional views of FIGS. 31A and 32A are each cut in a direction along the lengthwise direction of one or more channel layers of the GAA FET device 300 (e.g., cross-section C-C indicated in FIG. 1); and the cross-sectional views of FIGS. 31B and 32B are each cut in a direction that is parallel to the lengthwise direction of one or more channel layers of the GAA FET device 300 but is not across the channel layers (e.g., cross-section D-D indicated in FIG. 1).

As illustrated in FIGS. 31A-B and 32A-B, the gate spacer 1604 includes a stack of multiple layers, e.g., 1604-1 and 1604-2, each of which can include one of the above-described materials of the gate spacer 1604. Although two layers are shown, it should be understood that the stack of gate spacer 1604 can include any number of layers while remaining within the scope of the present disclosure. In some embodiments, at least one of the multiple layers (e.g., the bottommost one) can present an L-shaped profile, as illustrated in FIGS. 31A-B and 32A-B.

Specifically in FIG. 31A, the inner spacer 2406 may present a curvature-based sidewall facing toward the active gate structure 2400 and a nearly vertical sidewall facing away from the active gate structure 2400. Such sidewalls can be defined, when forming the recesses 2002. For example, during the formation of the recesses 2002 (FIGS. 20A-B), the curvature-based sidewall can be formed through an isotropic etching process. And, the vertical sidewall can be formed through an anisotropic (e.g., vertical) etching process performed on excess material extending the sidewall of the then fin structure 401 that still included the semiconductor layers 410 and 420. For example, the inner spacer 2406 may have a concave sidewall protruding toward the active gate structure 2400. As such, an angle between the concave sidewall and a top/bottom surface of the channel layer 420 may range between about 20° and about 88°.

Referring then to FIG. 32A, the inner spacer 2406 may present a first curvature-based sidewall facing toward the active gate structure 2400 and a second curvature-based sidewall facing away from the active gate structure 2400. Such sidewalls can be defined, when forming the recesses 2002 (FIGS. 20A-B). For example, during the formation of the recesses 2002, the first curvature-based sidewall can be formed through an isotropic etching process. And, the second curvature-based sidewall can be formed through an isotropic etching process performed on excess material extending the sidewall of the then fin structure 401 that still included the semiconductor layers 410 and 420. For example, the inner spacer 2406 may have a pair of concave sidewalls protruding toward the active gate structure 2400. As such, an angle between each of the concave sidewalls and a top/bottom surface of the channel layer 420 may range between about 20° and about 88°.

In one aspect of the present disclosure, a method for making a semiconductor device is disclosed. The method includes forming a fin structure that extends along a first direction and comprises a plurality of sacrificial layers and a plurality of channel layers alternately stacked on top of one another. The method includes forming a dummy gate structure, over the fin structure, that extends along a second direction perpendicular to the first direction. The method includes forming a gate spacer extending along respective upper sidewall portions of the dummy gate structure, thereby defining a first distance between a bottom surface of the gate spacer and a top surface of a topmost one of the plurality of channel layers. The first distance is either zero or similar to a second distance that separates neighboring ones of the plurality of channel layers.

In another aspect of the present disclosure, a method for making a semiconductor device is disclosed. The method includes forming a fin structure that extends along a first direction and comprises a plurality of sacrificial layers and a plurality of channel layers alternately stacked on top of one another. The method includes forming a gate spacer that extends along sidewalls of a patterned upper layer of a dummy gate structure. The upper layer structure extends along a second direction perpendicular to the first direction. The gate spacer is either in contact with or separated from a topmost one of the plurality of channel layers.

In yet another aspect of the present disclosure, a semiconductor device is disclosed. The semiconductor device includes a plurality of channel layers over a substrate. The plurality of channel layers laterally extend along a first direction and are vertically separated from each other. The semiconductor device includes a gate structure that extends along a second direction perpendicular to the first direction and wraps around each of the plurality of channel layers. The semiconductor device includes a gate spacer that extends along upper sidewalls of the gate structure. The semiconductor device includes an inner spacer that is disposed below the gate spacer and between neighboring ones of the plurality of channel layers. The gate spacer is either in contact with a topmost one of the plurality of channel layers or separated from the topmost channel layer with a portion of the inner spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a semiconductor device, comprising:
   forming a fin structure that extends along a first direction and comprises a plurality of sacrificial layers and a plurality of channel layers alternately stacked on top of one another;
   forming a dummy gate structure, over the fin structure, that extends along a second direction perpendicular to the first direction; and
   forming a gate spacer extending in the second direction along respective upper sidewall portions of the dummy gate structure and separated by a portion of the dummy gate structure from a topmost one of the plurality of channel layers, thereby defining a first distance between a bottom surface of the gate spacer and a top surface of the topmost one of the plurality of channel layers by the portion of the dummy gate structure;
   wherein the first distance is similar to a second distance that separates neighboring ones of the plurality of channel layers.

2. The method of claim 1, wherein the second distance is equal to a thickness of each of the plurality of sacrificial layers.

3. The method of claim 1, further comprising:
   recessing portions of the fin structure that are disposed on opposite sides of the gate spacer;
   removing a lower portion of the dummy gate structure;
   forming source/drain structures in the recessed portions of the fin structure; and
   replacing the plurality of sacrificial layers and the dummy gate structure with an active gate structure.

4. The method of claim 3, prior to the step of forming source/drain structures, further comprising:
   replacing respective end portions of each of the plurality of sacrificial layers with an inner spacer.

5. The method of claim 1, wherein the step of forming a fin structure further comprises overlaying the fin structure with a hardmask layer, and wherein the hardmask layer and the dummy gate structure include a similar material.

6. The method of claim 5, further comprising:
   retaining the hardmask layer while forming the dummy gate structure; and
   subsequently to forming the dummy gate structure, recessing portions of the hardmask layer that are not overlaid by the dummy gate structure such that the first distance is defined by a thickness of a remaining portion of the hardmask layer.

7. The method of claim 5, further comprising removing the hardmask layer prior to forming the dummy gate structure such that the first distance is defined by a thickness of a lower portion of the dummy gate structure.

8. The method of claim 5, further comprising:
   retaining the hardmask layer while forming the dummy gate structure;
   forming a first layer of the dummy gate structure;

recessing the hardmask layer and the first layer of the dummy gate structure at a similar etching rate, thereby forming a coplanar surface shared by the top surface of the topmost channel layer and a top surface of the first layer of the dummy gate structure;

forming a second layer of the dummy gate structure; and replacing respective sidewall portions of the second layer of the dummy gate structure with the gate spacer.

9. The method of claim 5, further comprising:

retaining the hardmask layer while forming the dummy gate structure; forming a first layer of the dummy gate structure;

recessing the hardmask layer and the first layer of the dummy gate structure at different etching rates, thereby causing a top surface of the topmost channel layer to be below a top surface of the first layer of the dummy gate structure;

forming a second layer of the dummy gate structure; and replacing respective sidewall portions of the second layer of the dummy gate structure with the gate spacer.

10. A method for making a semiconductor device, comprising:

forming a fin structure that extends along a first direction and comprises a plurality of sacrificial layers and a plurality of channel layers alternately stacked on top of one another; and forming a gate spacer that extends along sidewalls of a patterned upper layer of a dummy gate structure, wherein the upper layer extends along a second direction perpendicular to the first direction, wherein the dummy gate structure is formed over a hardmask layer that is disposed over the fin structure, and wherein a thickness of a remaining portion of the hardmask layer is about equal to a distance separating neighboring ones of the plurality of channel layers;

wherein the gate spacer is either in contact with or separated from a topmost one of the plurality of channel layers.

11. The method of claim 10, wherein the step of forming a gate spacer further comprises:

forming the dummy gate structure that comprises a blanket upper layer and a blanket lower layer over the hardmask layer;

etching the blanket upper layer to form the patterned upper layer;

recessing portions of the hardmask layer that are not overlaid by the patterned upper layer; and forming the gate spacer such that the gate spacer is separated from the topmost channel layer with a remaining portion of the hardmask layer.

12. The method of claim 10, wherein the step of forming a gate spacer further comprises:

removing the hardmask layer;

forming the dummy gate structure that comprises a blanket upper layer and a blanket lower layer over the fin structure;

etching the blanket upper layer to form the patterned upper layer; and forming the gate spacer such that the gate spacer is separated from the topmost channel layer with a remaining portion of the blanket lower layer and/or a remaining portion of the patterned upper layer.

13. The method of claim 12, wherein a thickness of the remaining portion of the blanket lower layer or the remaining portion of the patterned upper layer is about equal to a distance separating neighboring ones of the plurality of channel layers.

14. The method of claim 10, wherein the step of forming a gate spacer further comprises:

forming a blanket lower layer of the dummy gate structure while retaining the hardmask layer;

recessing the hardmask layer and the blanket lower layer at a similar etching rate, thereby causing a top surface of the topmost channel layer to be below a top surface of the blanket lower layer;

forming a blanket upper layer of the dummy gate structure;

etching the blanket upper layer to form the patterned upper layer; and forming the gate spacer such that the gate spacer is in contact with the topmost channel layer.

15. The method of claim 10, wherein the step of forming a gate spacer further comprises:

forming a blanket lower layer of the dummy gate structure while retaining the hardmask layer;

recessing the hardmask layer and the blanket lower layer at different etching rates, thereby causing a top surface of the topmost channel layer to be below a top surface of the blanket lower layer;

forming a blanket upper layer of the dummy gate structure;

etching the blanket upper layer to form the patterned upper layer; and forming the gate spacer such that the gate spacer is in contact with the topmost channel layer.

16. The method of claim 10, wherein the hardmask layer and the dummy gate structure include a similar material.

17. The method of claim 10, further comprising:

recessing portions of the fin structure that are disposed on opposite sides of the gate spacer;

patterning a blanket lower layer of the dummy gate structure based on the patterned upper layer;

forming source/drain structures in the recessed portions of the fin structure; and replacing the plurality of sacrificial layers and the dummy gate structure with an active gate structure.

18. A semiconductor device, comprising:

a plurality of channel layers over a substrate, wherein the plurality of channel layers laterally extend along a first direction and are vertically separated from each other;

a dummy gate structure that extends along a second direction perpendicular to the first direction and wraps around each of the plurality of channel layers;

a gate spacer that extends along upper sidewalls of the dummy gate structure along the second direction; and an inner spacer that is disposed below the gate spacer and between neighboring ones of the plurality of channel layers;

wherein the gate spacer is separated from a topmost channel layer of the plurality of channel layers by a portion of the dummy gate structure.

19. The semiconductor device of claim 18, wherein a distance between a bottom surface of the gate spacer and a top surface of the topmost channel layer is about equal to a distance separating the neighboring ones of the plurality of channel layers.

20. The semiconductor device of claim 18, wherein the distance separating the neighboring ones of the plurality of channel layers is equal to a thickness of each portion the inner spacer that is between neighboring ones of the plurality of channel layers.

* * * * *